United States Patent [19]
Ishii et al.

[11] Patent Number: 5,571,366
[45] Date of Patent: Nov. 5, 1996

[54] PLASMA PROCESSING APPARATUS

[75] Inventors: Nobuo Ishii; Jiro Hata; Chishio Koshimizu, all of Yamanashi-ken; Yoshifumi Tahara; Hiroshi Nishikawa, both of Tokyo; Isei Imahashi, Yamanashi-ken, all of Japan

[73] Assignee: Tokyo Electron Limited, Tokyo, Japan

[21] Appl. No.: 327,798

[22] Filed: Oct. 20, 1994

[30] Foreign Application Priority Data

| Oct. 20, 1993 | [JP] | Japan | 5-284206 |
|---|---|---|---|
| Oct. 20, 1993 | [JP] | Japan | 5-284208 |
| Oct. 20, 1993 | [JP] | Japan | 5-284209 |
| Oct. 20, 1993 | [JP] | Japan | 5-284210 |
| Dec. 2, 1993 | [JP] | Japan | 5-338764 |
| Feb. 22, 1994 | [JP] | Japan | 6-023992 |
| Feb. 22, 1994 | [JP] | Japan | 6-023993 |
| Feb. 22, 1994 | [JP] | Japan | 6-023994 |
| Mar. 25, 1994 | [JP] | Japan | 6-056237 |

[51] Int. Cl.$^6$ .................................................. H05H 1/00
[52] U.S. Cl. ............... 156/345; 118/723 I; 156/626.1; 156/627.1; 216/59; 216/60; 216/61; 216/68
[58] Field of Search ............................. 156/345, 626.1, 156/627.1; 118/723 I; 204/298.03, 298.07, 298.06, 298.32, 298.34; 216/59–61, 68

[56] References Cited

U.S. PATENT DOCUMENTS

| 4,289,188 | 9/1981 | Mizutani et al. | 215/60 |
|---|---|---|---|
| 4,430,151 | 2/1984 | Tsukada | 156/626.1 |
| 4,491,499 | 1/1985 | Jerde et al. | 204/298.32 X |
| 4,950,956 | 8/1990 | Asamaki et al. | 118/723 E X |
| 5,014,217 | 5/1991 | Savage | 216/60 X |
| 5,068,002 | 11/1991 | Monroe | 156/345 |
| 5,234,529 | 8/1993 | Johnson | 156/345 |
| 5,261,962 | 11/1993 | Hamamoto et al. | 118/723 I |
| 5,273,609 | 12/1993 | Moslehi | 156/345 |
| 5,277,751 | 1/1994 | Ogle | 156/345 |
| 5,280,154 | 1/1994 | Cuomo et al. | 156/345 X |
| 5,304,279 | 4/1994 | Coultas et al. | 156/345 |
| 5,308,414 | 5/1994 | O'Neill et al. | 156/345 X |
| 5,318,806 | 6/1994 | Montgomery et al. | 427/491 |
| 5,346,578 | 9/1994 | Benzing et al. | 118/723 I X |
| 5,401,350 | 3/1995 | Patrick et al. | 156/345 |

FOREIGN PATENT DOCUMENTS

| 59726 | 5/1980 | Japan | 204/298.32 |
|---|---|---|---|

*Primary Examiner*—Thi Dang
*Attorney, Agent, or Firm*—Oblon, Spivak, McClelland, Maier & Neustadt, P.C.

[57] ABSTRACT

A plasma processing apparatus includes a chamber having a gas inlet port and a gas discharge port, a rest table, arranged in the chamber, for supporting a wafer which has a surface to be processed, a radio frequency antenna for supplying a radio frequency energy into the chamber, and generating an induced plasma in the chamber, and a radio frequency voltage source for applying a radio frequency voltage to the radio frequency antenna. A pressure and/or light variation in the chamber is measured during generation of the plasma, by a measurement system, and the radio frequency voltage source is controlled based on a signal from the measurement system, so that voltage to be applied to the antenna is controlled according to the pressure and/or light in the chamber.

21 Claims, 36 Drawing Sheets

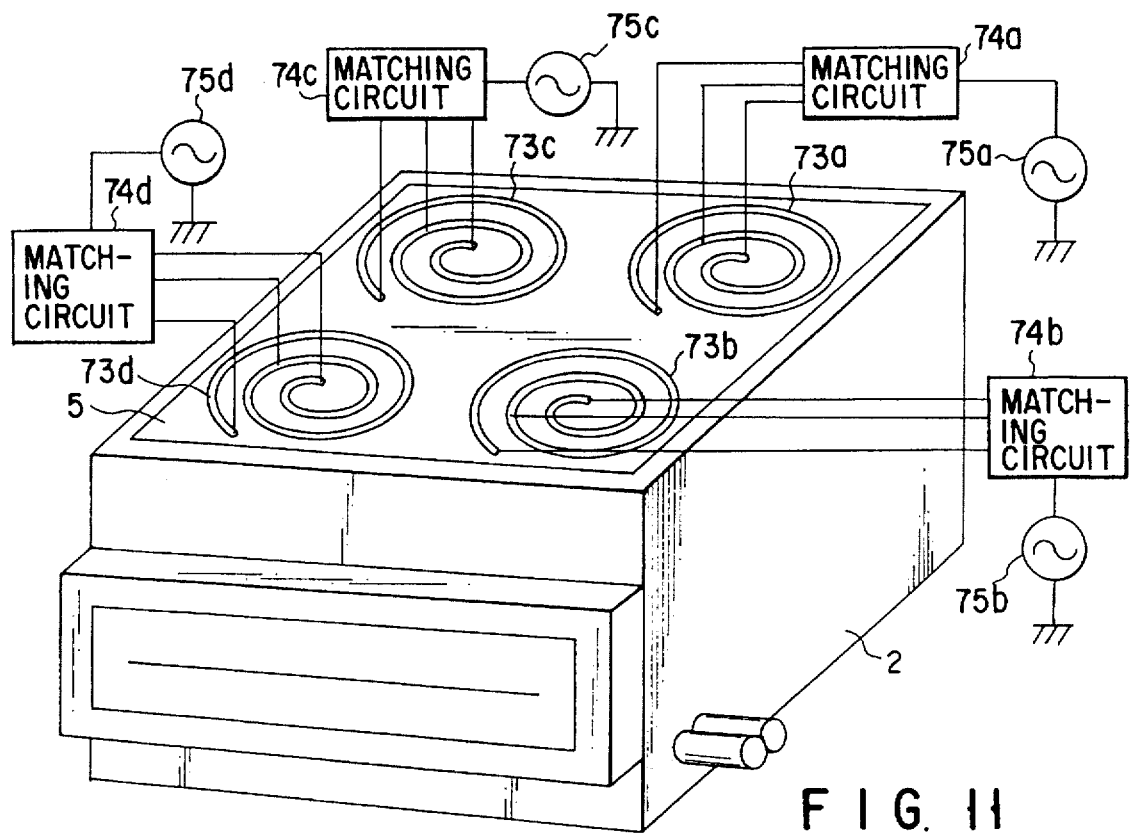
F I G. 11
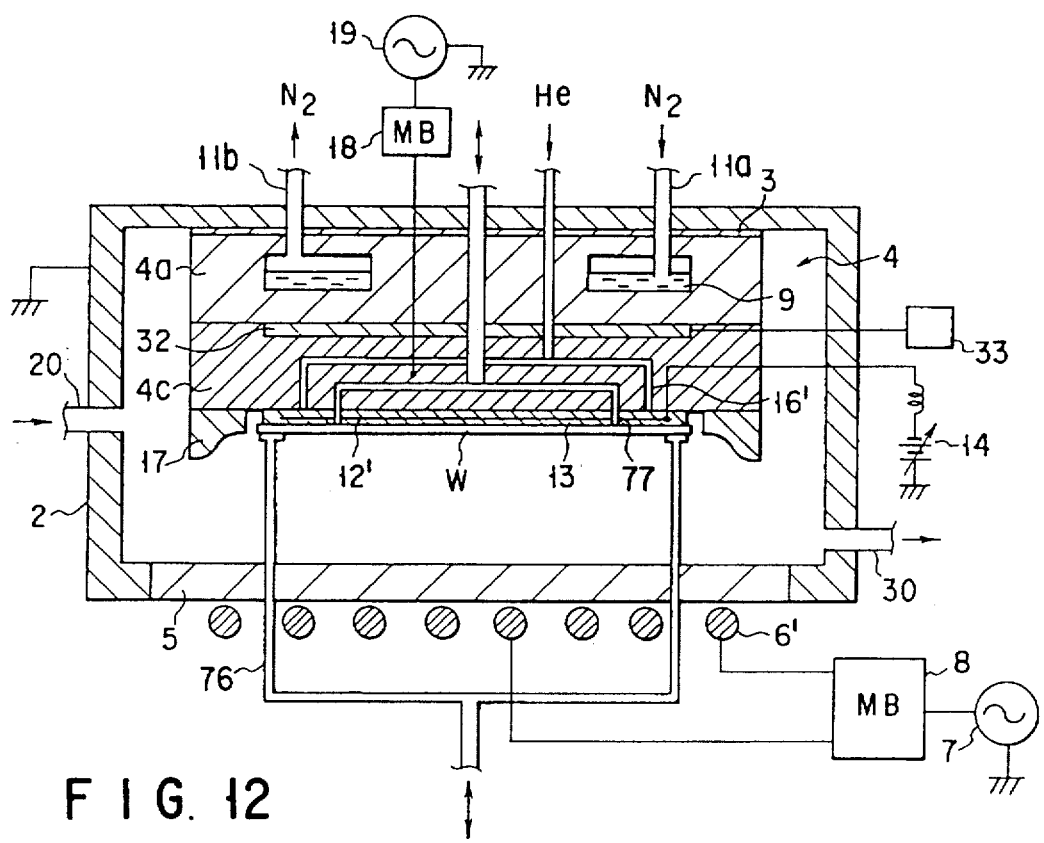
F I G. 12

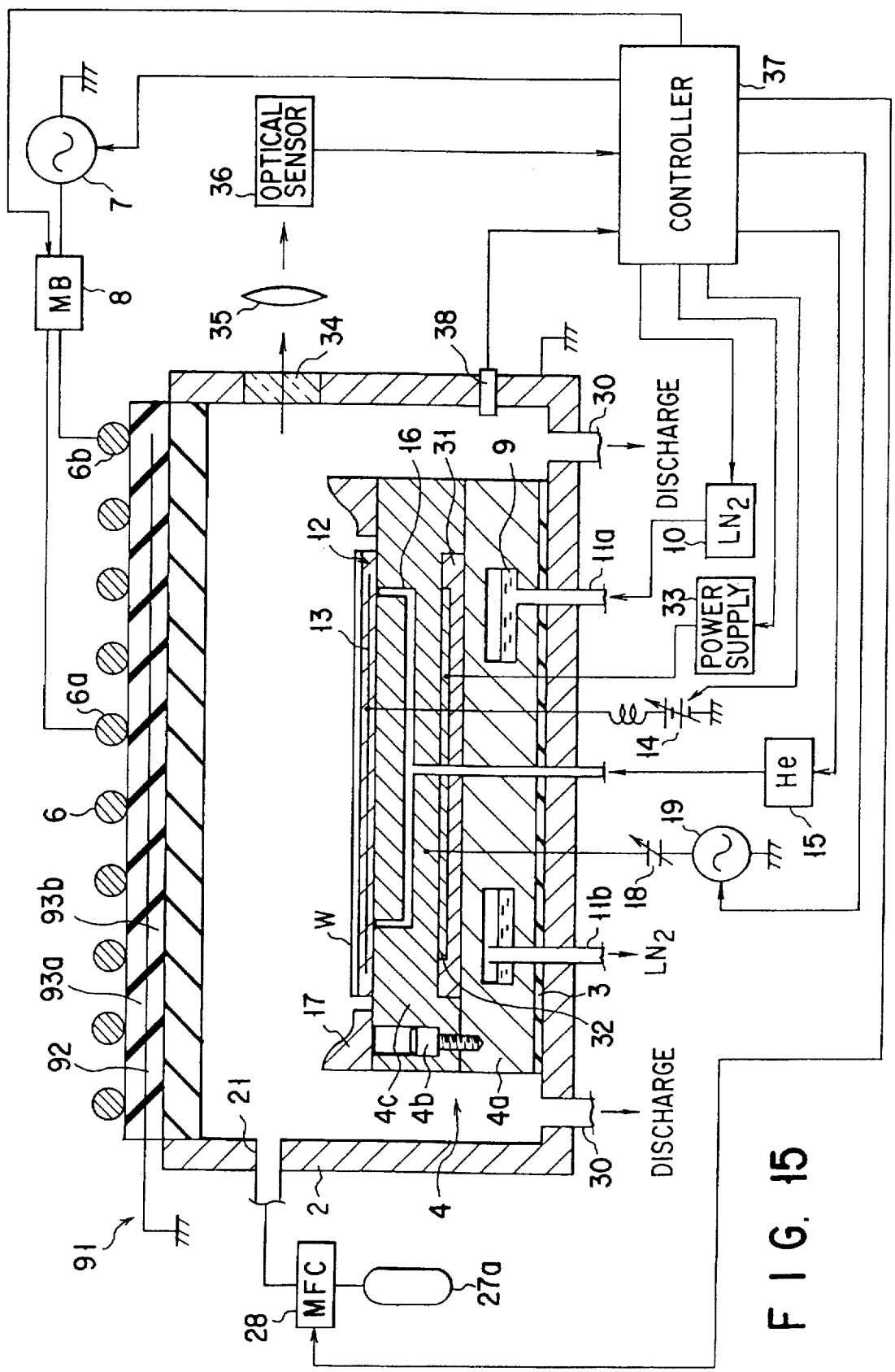
F I G. 15

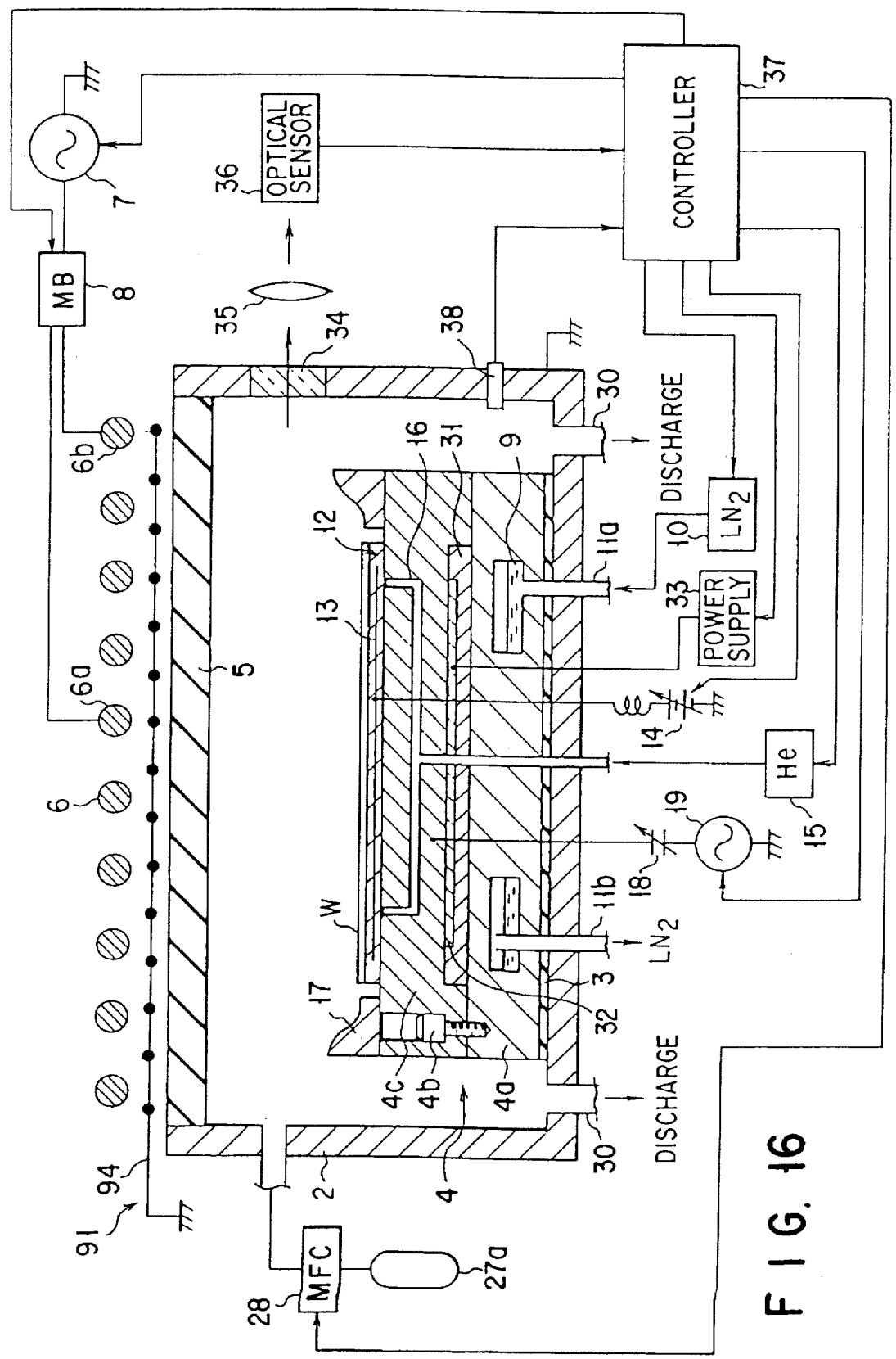
F I G. 16

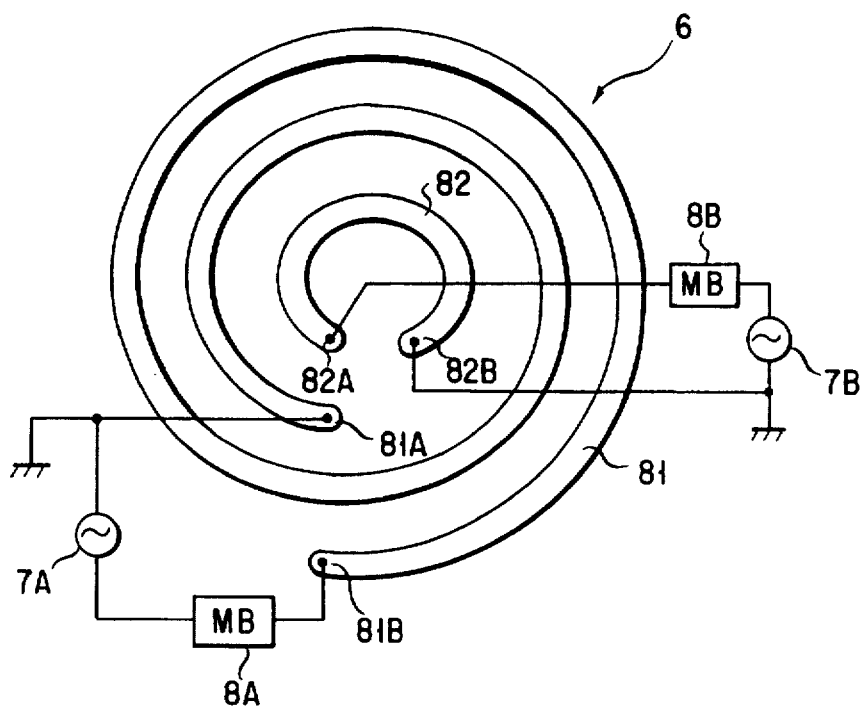
F I G. 18
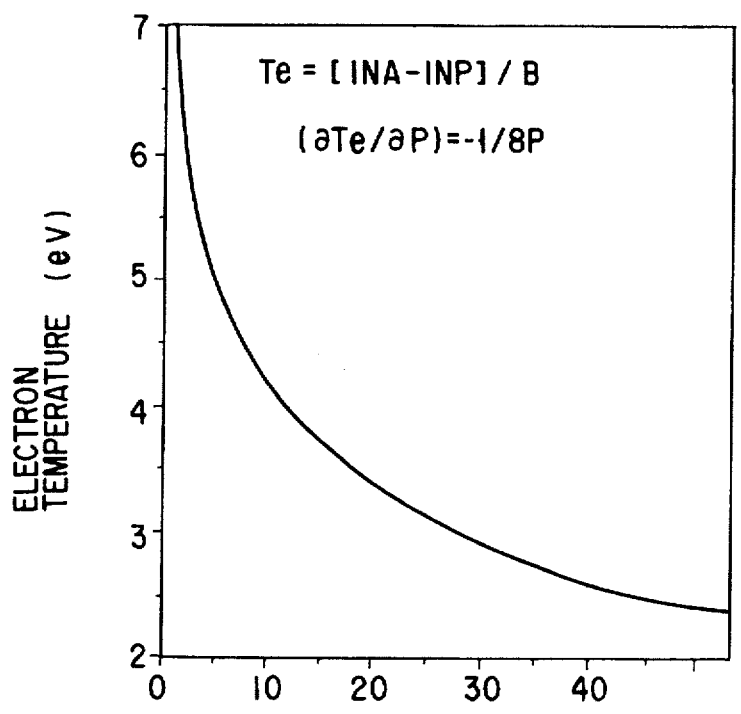
F I G. 19

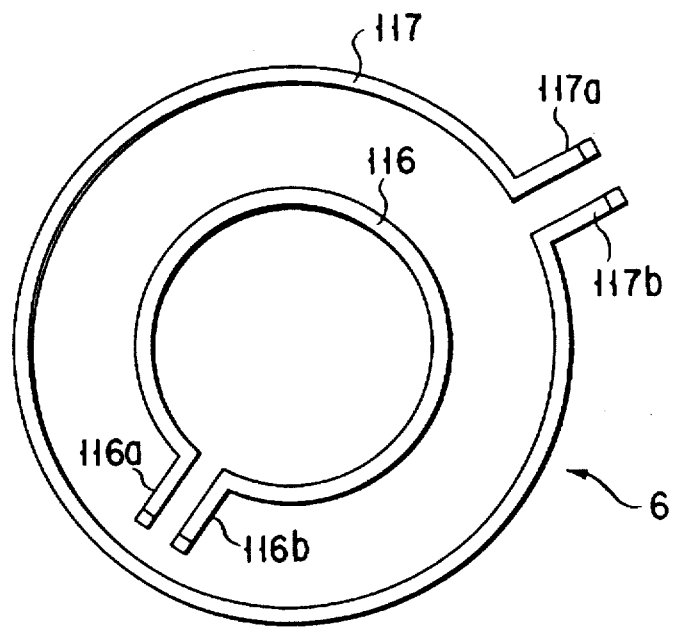
F I G. 24
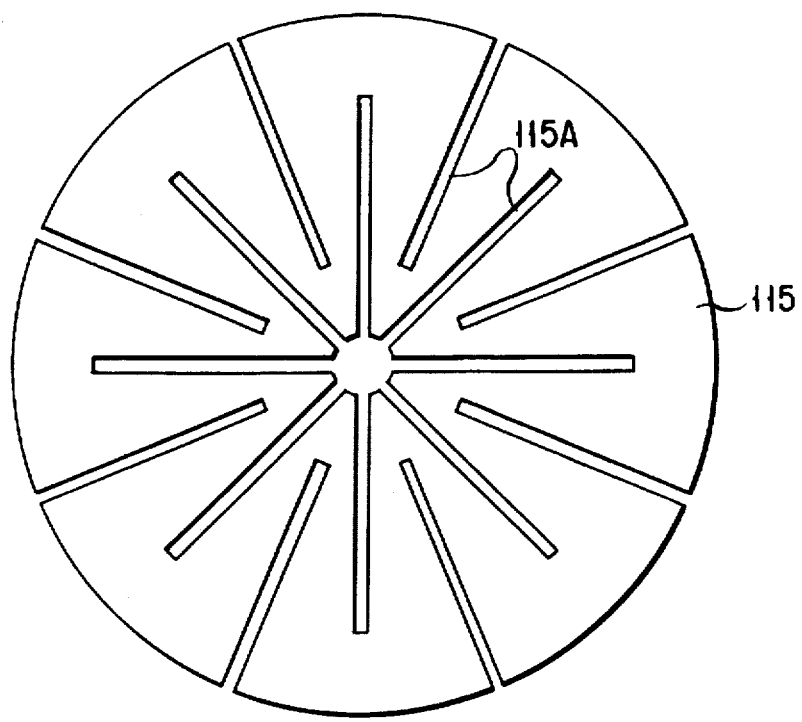
F I G. 25

RADIAL DISTRIBUTION OF ION SATURATION CURRENT

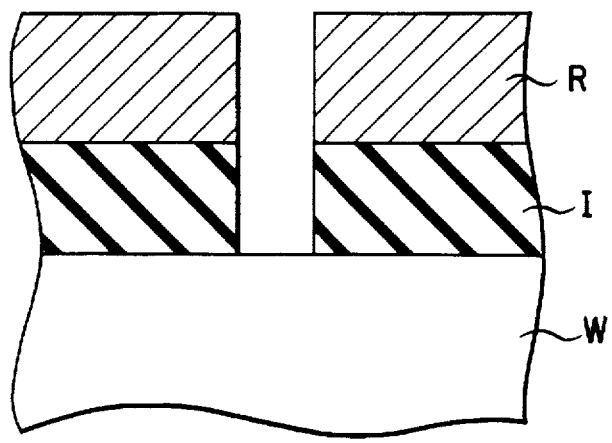
F I G. 36
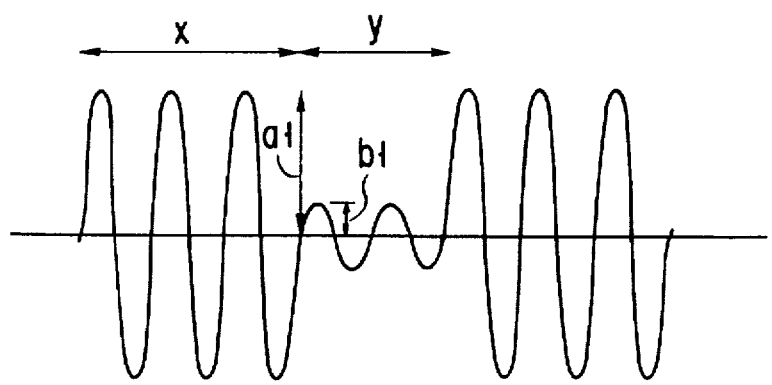
F I G. 38A
F I G. 38B

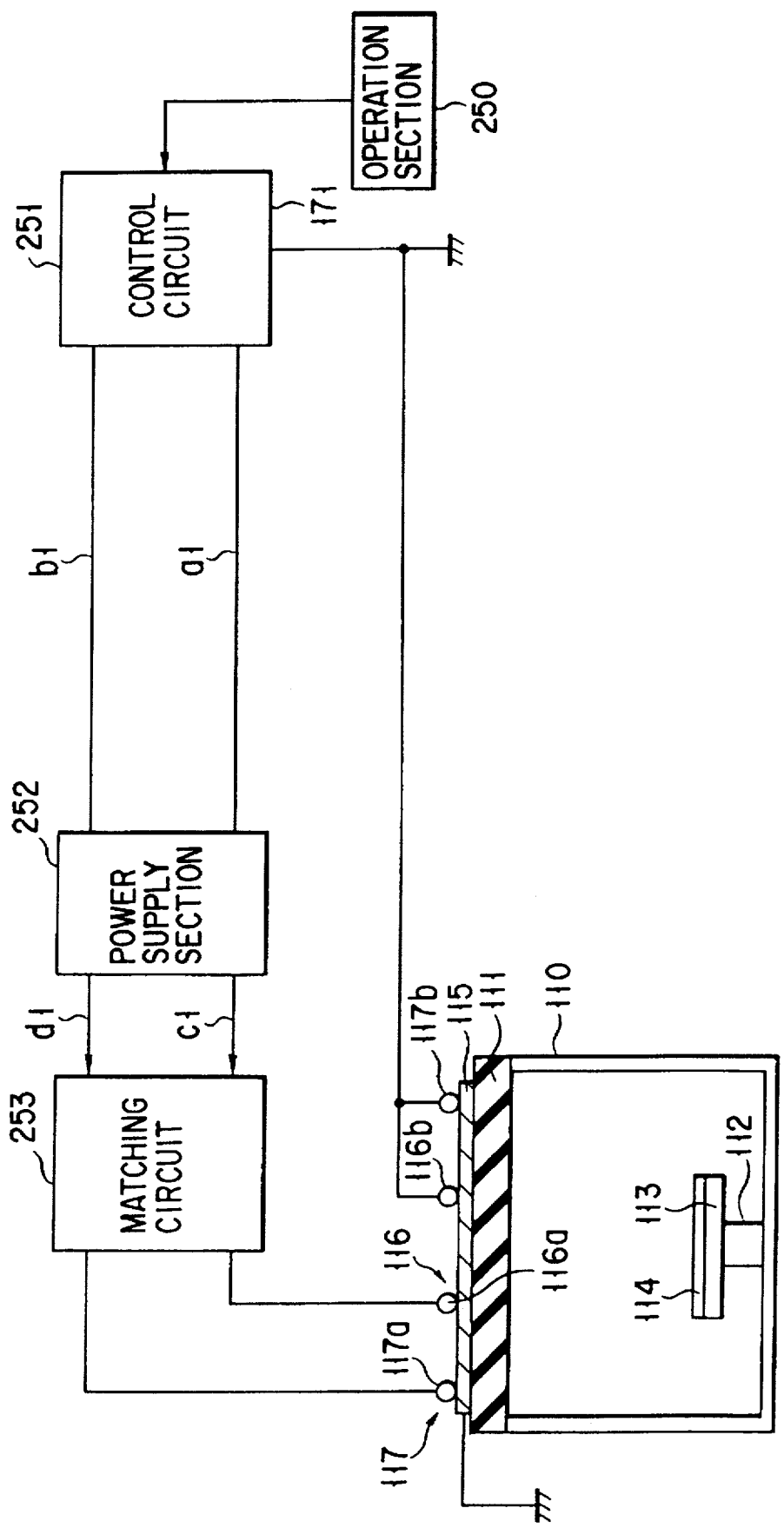
F I G. 37

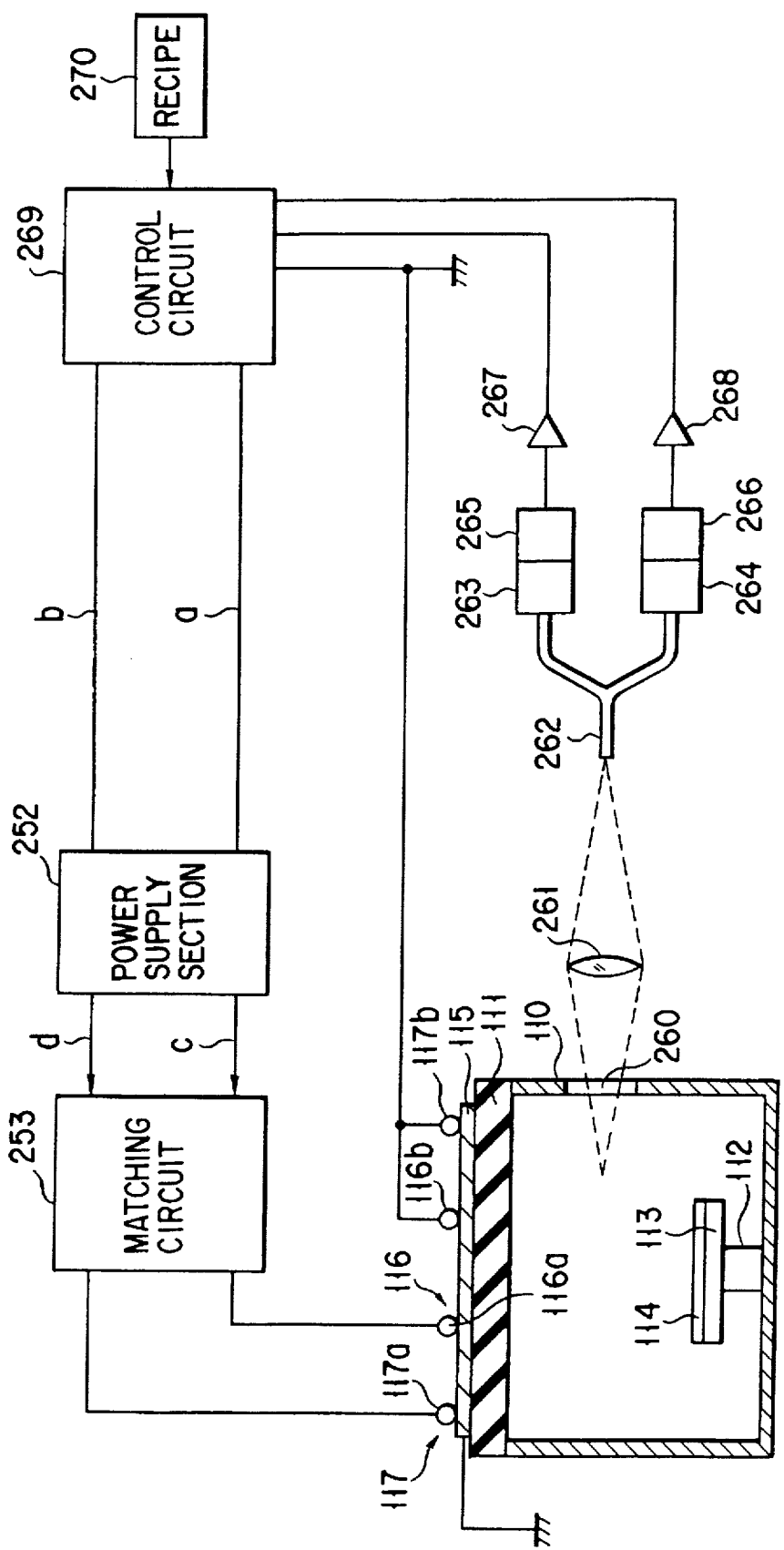
F I G. 39

1

PLASMA PROCESSING APPARATUS

BACKGROUND OF THE INVENTION

1. Field of the Invention

The present invention relates to a plasma processing apparatus employing the radio frequency induction method.

2. Description of the Related Art

Conventionally, as an apparatus in which, e.g., a semiconductor wafer is placed in a processing chamber to perform a plasma process, a parallel plate type plasma processing apparatus using a radio frequency (radio frequency) is widely employed. A reactive ion etching apparatus (RIE) in which two parallel plate electrodes are arranged in a processing chamber is exemplified as this kind of apparatus. A radio frequency wave is applied to one or both of the electrodes to generate a plasma between the two electrodes. The flow of the plasma is incident on the target surface of an object to be processed by a self-bias potential difference between the plasma and the object to be processed, thereby performing an etching process.

In the conventional plasma processing apparatus such as the above parallel plate type plasma processing apparatus, however, micropatterning in units of submicrons and further in units of sub-half microns which are required with high integration of a semiconductor wafer is difficult to perform. In order to perform this process using a plasma processing apparatus, it is important to control a high-density plasma with a high precision in a low-pressure atmosphere. In addition, a highly uniform plasma is required so as to correspond to a wafer having a large diameter. In a plasma processing apparatus using an electrode, the electrode itself becomes a source of heavy-metal contamination in generation of a plasma. In particular, this becomes typical when micropatterning is required.

In order to establish a new plasma source in accordance with such a technical requirement, many approaches have been made from various viewpoints. For example, a radio frequency-induced plasma generating apparatus using a radio frequency antenna is disclosed in European Pat. Appln KOKAI Publication No. 379,828. In this radio frequency induced plasma generating apparatus, one surface of a processing chamber opposing a wafer rest table consists of an insulator, e.g., quartz glass, and a radio frequency antenna constituted by, e.g., a spiral coil is mounted on the outer wall surface of the processing chamber. A radio frequency power is applied to the radio frequency antenna to form a radio frequency electromagnetic field in the processing chamber. The electrons flowing in the electromagnetic field space are caused to collide against neutral particles in the process gas, and to ionize the gas, thereby generating a plasma.

When the plasma process is performed using the above plasma processing apparatus using the radio frequency induction method, the density of a plasma induced in the chamber tends to be non-uniform particularly in the radial direction. Further, when the plasma process with a very high precision is to be performed in units of sub-half microns which are popular today, a uniform, high-density plasma having good reproducibility is required to be generated in a chamber. Therefore, a technique for controlling the density of a plasma in the chamber with a high precision must be urgently established.

SUMMARY OF THE INVENTION

It is an object of the present invention to provide a plasma processing apparatus comprising a processing chamber for plasma processing, having an external wall, the chamber containing within the wall an object having a surface to be processed in a plasma; induction means for providing a radio frequency induction field within the chamber for generating a plasma within the chamber; voltage applying means for applying a radio frequency voltage to the induction means; measuring means for measuring a pressure variation and/or a light intensity variation from the plasma in the chamber during generation of the plasma, and outputting a signal corresponding to the variation; and control means for controlling the radio frequency voltage applying means based on the signal from the measuring means, and controlling the voltage for confirming the plasma within the chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a perspective view schematically showing a plasma processing apparatus suitable for a plasma process of a large-sized object to be processed;

FIG. 12 is a sectional view showing a plasma processing apparatus in which a plasma process space is formed below an object to be processed;

FIGS. 15 and 16 are sectional views showing plasma processing apparatuses respectively comprising electrostatic shield means having different shapes;

FIG. 18 is a plan view showing a radio frequency antenna used in the apparatus shown in FIG. 17;

FIG. 19 is a graph showing measurement results of the gas dependency of the electron temperature;

FIG. 24 is a plan view showing the shape of a coil division type radio frequency antenna used in the apparatus shown in FIG. 23;

FIG. 25 is a plan view showing an example of electrostatic shield;

FIG. 36 is a view for explaining an etched state of an $SiO_2$ film according to the embodiment shown in FIG. 31;

FIG. 37 is a control block diagram showing a plasma generating apparatus according to still another embodiment;

FIGS. 38A and 38B are diagrams respectively for explaining a radio frequency voltage applied to a radio frequency antenna, and a radio frequency voltage applied to a lower electrode;

FIG. 39 is a control block diagram showing a plasma generating apparatus according to still another embodiment;

DETAILED DESCRIPTION OF THE PREFERRED EMBODIMENTS

The preferred embodiments of plasma processing apparatuses constituted on the basis of the present invention will be described below in detail with reference to the accompanying drawings.

Figure 1:
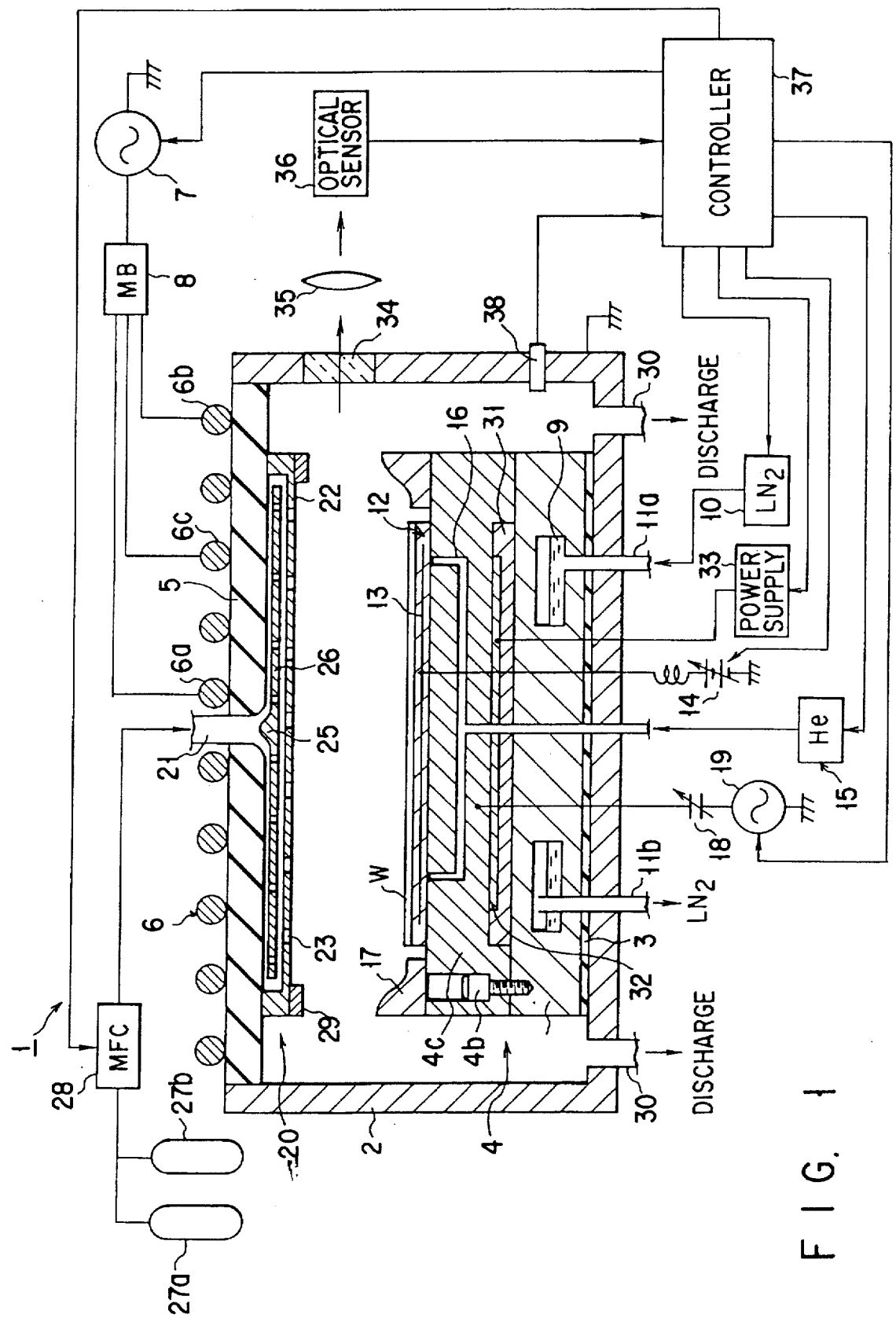
FIG. 1 is a sectional view showing the overall arrangement of a plasma processing apparatus according to the first embodiment of the present invention.

A plasma etching apparatus 1 shown in FIG. 1 comprises a cylindrical or rectangular chamber or housing 2 consisting of a conductive material, e.g., aluminum. A substantially columnar rest table 4 for placing an object to be processed, e.g., a semiconductor wafer W is housed at the bottom portion of the chamber 2 through an insulating plate 3, e.g., ceramic. The top portion or plate of the chamber almost opposing the placing surface of the rest table 4 consists of an insulating member 5, e.g., quartz glass or ceramic. A radio frequency antenna 6 constituted by a spiral coil, which consists of copper, aluminum, stainless steel, or the like is arranged on the outer top surface of the insulating member 5 as a induction means.

Figure 2A:
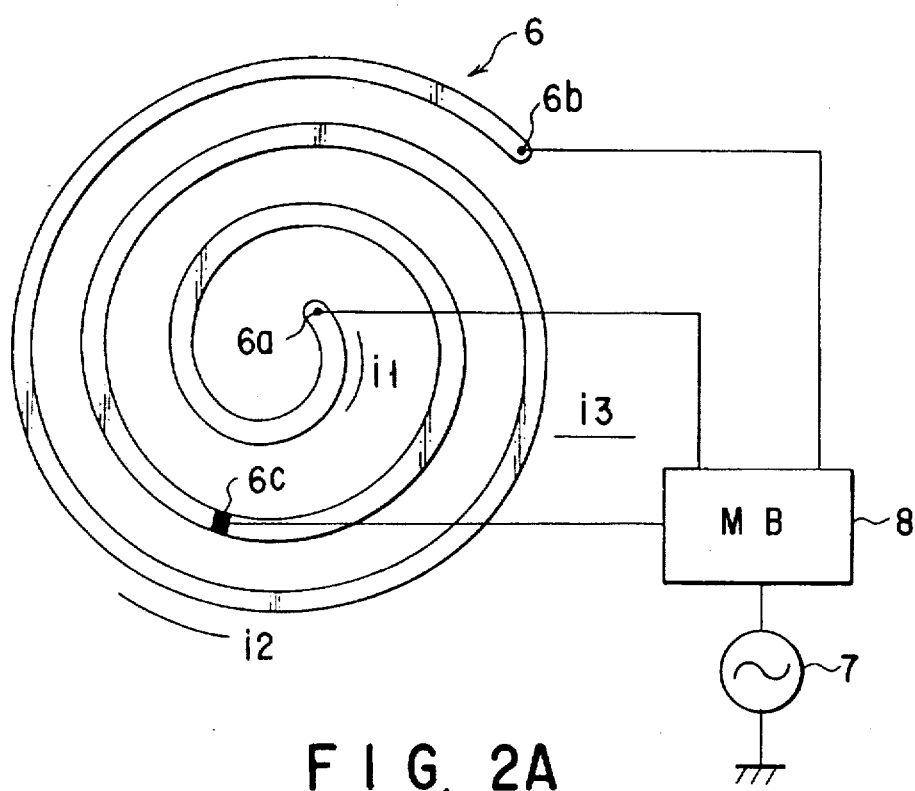
FIGS. 2A and 2B are schematic views showing different connection relationships between radio frequency antennas and power supply mechanisms.

An intermediate terminal 6c is provided between two terminals (an inner terminal 6a and an outer terminal 6b) of the radio frequency antenna 6 as shown in FIG. 2A. The respective terminals 6a, 6b, and 6c are connected to a plasma-generating radio frequency power supply 7 through a matching circuit 8. With this arrangement, a relationship represented by the following equation (1) is produced between a current $i_1$ flowing from the inner terminal 6a to the intermediate terminal 6c, a current $i_2$ flowing from the intermediate terminal 6c to the outer terminal 6b, and a current $i_3$ flowing from the intermediate terminal 6c to the matching circuit 8:

$$i_1 = i_2 + i_3 \tag{1}$$

Therefore, the amount of the current flowing between the intermediate terminal 6c and the inner terminal 6a and that of the current flowing between the intermediate terminal 6c and the outer terminal 6b are controlled by adjusting the value of the current $i_3$ using the matching circuit 8, so that an alternating electric field having an amount corresponding to the amount of the current flowing between two antenna portions, i.e., the density of a plasma can be obtained. More specifically, as shown in FIG. 2A, a spiral coil antenna which develops from the inner side to the outer side is used, and the intermediate terminal 6c is provided midway. With this arrangement, since the density of the plasma can be variably controlled at the inner and outer sides in the radial direction, a uniform, high-density plasma having good reproducibility can be generated in the chamber.

Figure 2B:
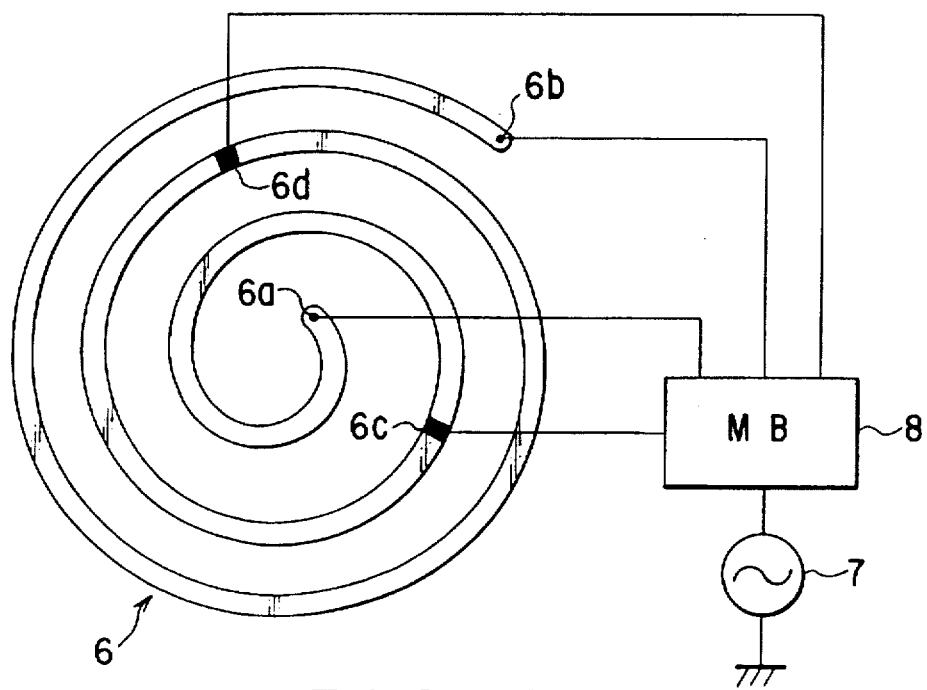

The number of intermediate terminals which are set according to the present invention is not limited to one. For example, as shown in FIG. 2B, the number of the intermediate terminals can be increased to two, and in addition an arbitrary number of intermediate terminals can be used. With this arrangement, since a desired value of a current, i.e., a desired density of a plasma can be obtained between desired intervals, the density of a plasma can be controlled with a higher precision.

Further, according to the present invention, the potential of a radio frequency circuit is floated from a ground potential using an insulated transformer and adjusted. In addition, the potential of the radio frequency antenna 6 is variably controlled by adjusting its load using a load circuit element connected in series with the antenna 6, thereby controlling the electron temperature of the plasma generated in the chamber 2. For this reason, a high selectivity can be obtained particular in an etching process.

As shown in FIG. 1, the rest table 4 for placing the object W to be processed such as a semiconductor wafer is mainly constituted by a susceptor support table 4a formed to be a columnar shape using, e.g., aluminum, and a susceptor 4c provided to be freely mounted/dismounted on/from the susceptor support table 4a by a bolt 4b and consisting of, e.g., aluminum. Since the susceptor 4c is constituted to be freely mounted/dismounted in this manner, maintenance and the like can be easily performed.

A cooling means, e.g., a cooling jacket 9 is provided to the susceptor support table 4a, and a coolant, e.g., liquid nitrogen is introduced from a coolant source 10 to the jacket 9 formed in the support table through a coolant inlet pipe 11a. The liquid nitrogen which is circulated in the jacket and gasified by a heat exchange operation is discharged from a coolant discharge pipe 11b to the outside of the chamber. With this arrangement, a heat for cooling the liquid nitrogen having a temperature of, e.g., −196° C. is conducted from the cooling jacket 9 to the semiconductor wafer W through the susceptor 4c, and the target surface of the semiconductor wafer W can be cooled to a desired temperature.

An electrostatic chuck 12 formed to have almost the same area as that of the wafer is provided to the wafer-placing portion on the upper surface of the susceptor 4c formed to have a substantially columnar shape. The electrostatic chuck 12 is formed by interposing a conductive film 13 such as a copper foil between, e.g., two polymer polyimide films in an insulating state. The conductive film 13 is connected to a variable DC high-voltage power supply 14 through a lead wire. Therefore, when a high voltage is applied to the conductive film 13, the semiconductor wafer W can be chucked and held on the upper surface of the electrostatic chuck 12 by a Coulomb force.

A gas passage 16 for supplying a heat transfer gas (back-cooling gas) such as He gas from a gas source 15 to the lower surface of the semiconductor wafer W and joint portions of the respective members constituting the susceptor 4c through the susceptor support table 4a and the susceptor 4c is formed in the susceptor support table 4a and the susceptor 4c. An annular focus ring 17 is arranged at the peripheral edge portion of the upper end of the susceptor 4c so as to surround the semiconductor wafer W. The focus ring 17 consists of a resistor having a high resistance, e.g., ceramic or quartz glass, which does not attract reactive ions, and operates to let the reactive ions effectively be incident only on the semiconductor wafer W at the inner side.

A radio frequency power supply 19 is connected to the susceptor 4c through a matching capacitor 18. In the process, a radio frequency power of, e.g., 2 MHz is applied to the susceptor 4c to generate a bias potential between a plasma and the susceptor, thereby effectively emitting the flow of the plasma onto the target surface of the object to be processed. A gas supplying means 20 consisting of, e.g., quartz glass or ceramic is arranged above the susceptor 4c. The gas supplying means 20 has a hollow disk-like shape with almost the same area as that of the placing surface of the susceptor 4c. A gas supplying pipe 21 which communicates the hollow portion of the gas supplying means 20 through almost the center of the insulating member 5 is centrally mounted on the upper portion of the gas supplying means 20. A large number of small holes 23 are formed in a lower wall 22 of the gas supplying means 20, and constituted to uniformly blow an etching gas to a lower processing space. A buffer disk 26 on which a projection portion 25 is centrally formed to project toward the gas supplying pipe 21 is arranged in the hollow portion of the gas supplying means 20. The buffer disk 26 is constituted to promote mixing of etching gases supplied from process gas sources 27a and 27b through a mass flow controller 28 and to blow a gas into the processing chamber at a uniform flow rate. An annular projection 29 which operates to concentrate a gas to the target surface of the object to be processed projects downward around the lower wall 22 of the gas supplying means 20.

A plurality of discharge pipes 30 are fixed at predetermined intervals through the bottom wall of the chamber 2, and are constituted to discharge an atmosphere from the chamber 2 by a vacuum pump (not shown). A gate valve (omitted in FIG. 1, but represented by reference numeral 39 in FIG. 4) is provided to the side wall of the central portion of the processing chamber, and is constituted to load/unload the semiconductor wafer W to/from the chamber through this gate valve.

A temperature-adjusting heater 32 housed in a heater fixing table 31 is provided to the lower portion of the susceptor between the electrostatic chuck 12 and the cooling jacket 9. A power supplied from a power supply 33 to the temperature-adjusting heater 32 is adjusted to control conduction of heat for cooling from the cooling jacket 9, thereby temperature-adjusting the surface to be processed of the semiconductor wafer W.

The control system of the processing apparatus having the above arrangement will be described. A transmitting window 34 consisting of a transparent material, e.g., quartz glass, is mounted on one side wall of the chamber 2. An optical system 35 and an optical sensor 36 are arranged on the same optical axis outside this window. As a result, light from a plasma generated in the processing chamber can be received by the optical sensor 36 through the optical system 35. The output side of the optical sensor 36 is connected to a controller 37, and sends thereto a signal concerning the emission spectrum generated in the processing chamber. A sensor or pressure sensor 38 for detecting changes in physical conditions such as the pressure in the processing chamber is mounted on the chamber 2. The output side of the sensor 38 is connected to the controller 37, and a signal concerning the pressure in the processing chamber which constantly changes during a plasma process is input to the controller 37. The controller 37 sends control signals to the plasma-generating radio frequency power supply 7, the radio frequency bias power supply 19, the coolant source 10, the temperature-adjusting power supply 33, the back-cooling gas source 15, and the process gas mass flow controller 28 on the basis of feedback signals from the sensors 36 and 38 or a preset set signal. Then, according to the present invention, the potential of the radio frequency antenna or the value of a current flowing through the antenna portion before/after the intermediate terminal is variably controlled, thereby adjusting the operation environment of the plasma processing apparatus to an optimum one.

An example of a method of obtaining the control signals will be described below.

First Method

The emission spectrum of each wavelength from a plasma detected from the processing chamber through the transmitting window 34 upon generation of the plasma is spectroscopically analyzed by the optical system 35 including a spectroscope, and made to be incident on the optical sensor 36. The optical sensor 36 responds to light having a predetermined emission spectrum, and outputs first and second signals (to be described later) to the controller 37. The first signal is a signal indicating the emission spectrum of a first gas component whose amount present in the processing chamber relatively and greatly changes during an etching process in accordance with the variation in plasma, e.g., a signal indicating the emission spectrum of an active species of a process gas, e.g., a CF-based process gas such as CF or $CF_2$, which reacts with an object to be etched, e.g., an oxide film, and is consumed in the processing chamber during etching so that its detected emission intensity remains at a low level, but is not consumed at the end of etching so that its amount increases and its detected emission intensity also increases. The second signal is a signal indicating the emission spectra of a reaction product such as CO gas and a second gas component such as an inert gas (e.g., argon or nitrogen) mixed for plasma stabilization. The reaction product reacts with an etching target such as an oxide film to be greatly produced during etching so that the detected emission intensity is greatly increased, but the reaction product is not produced at the end of etching, so that the detected emission intensity is reduced. The amount of the second gas component in the processing chamber does not relatively change even during the etching process. The controller 37 calculates the ratio of the emission intensities concerning the emission spectra of the two kinds of the gas components on the basis of the two signals, and outputs control signals in accordance with a progression state of the plasma on the basis of the ratio of the intensities.

Each emission spectrum can be obtained such that a peak wavelength of a gas component to be observed is detected through an appropriate interference filter and a calculation process is performed. Instead, if the ratio S/N of emission spectra is low, the average of the sum of emission spectra within a certain wavelength range, and a calculation process is performed on the basis of the average of the sum to decrease the influence of noise, thereby obtaining a measurement value with a high precision.

The ratio of the emission intensities obtained from emission spectra measured in this manner reflects a plasma state in the processing chamber in real time. For this reason, a radio frequency voltage/current applied to the radio frequency antenna is subjected to feedback control to maintain the plasma in the processing chamber to an optimum state, thereby accurately controlling the end of etching.

Second Method

Figure 3:
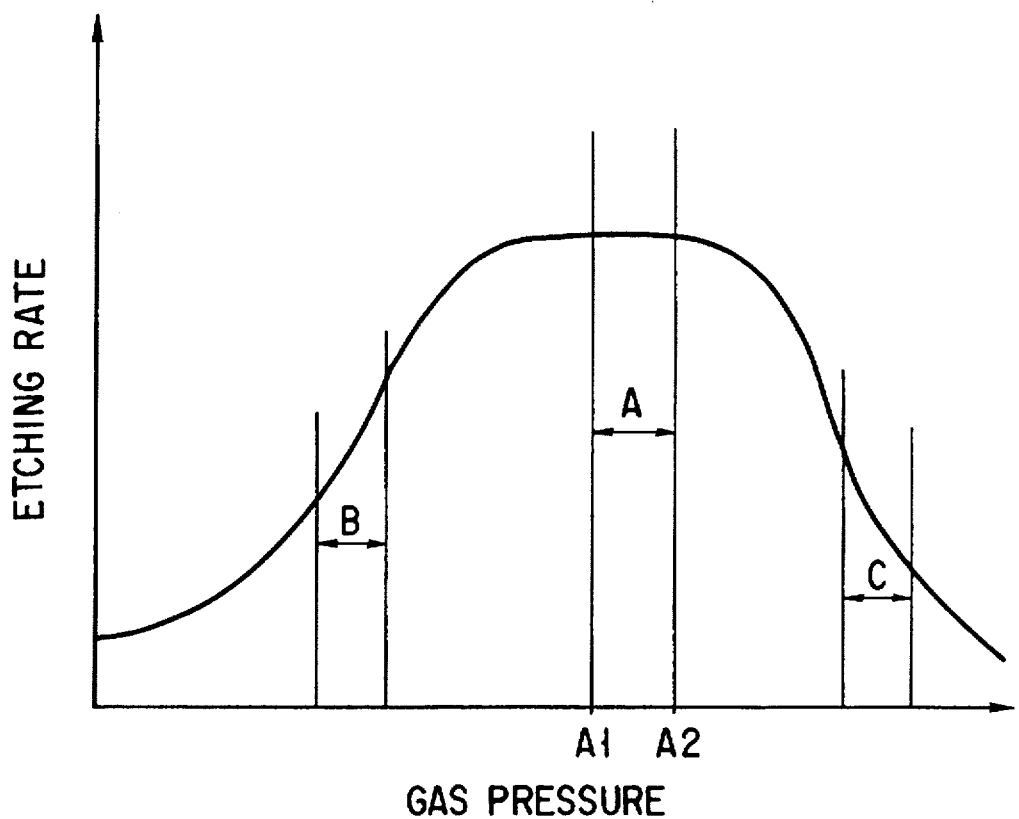
FIG. 3 is a graph showing a relationship between an etching rate and a gas pressure.

As a result of measuring a correlation between a gas pressure in the processing chamber and an etching rate, the etching rate is stabilized at a large value when a gas pressure falls within a predetermined range as shown in FIG. 3. For this reason, the range (between A1 and A2) of the pressure in the case wherein the etching rate falls within a predetermined range (e.g., not a range B or a range C but a range A) is obtained in advance by an etching process using a dummy wafer. In an actual process, the pressure sensor 38 monitors variations in pressure in the processing chamber. The controller 37 outputs control signals to the respective units such that the pressure signal sent from the pressure sensor 38 to the controller 37 is always between the pressure A1 and the pressure A2, and an etching process is performed stably at a high etching rate.

Figure 4:
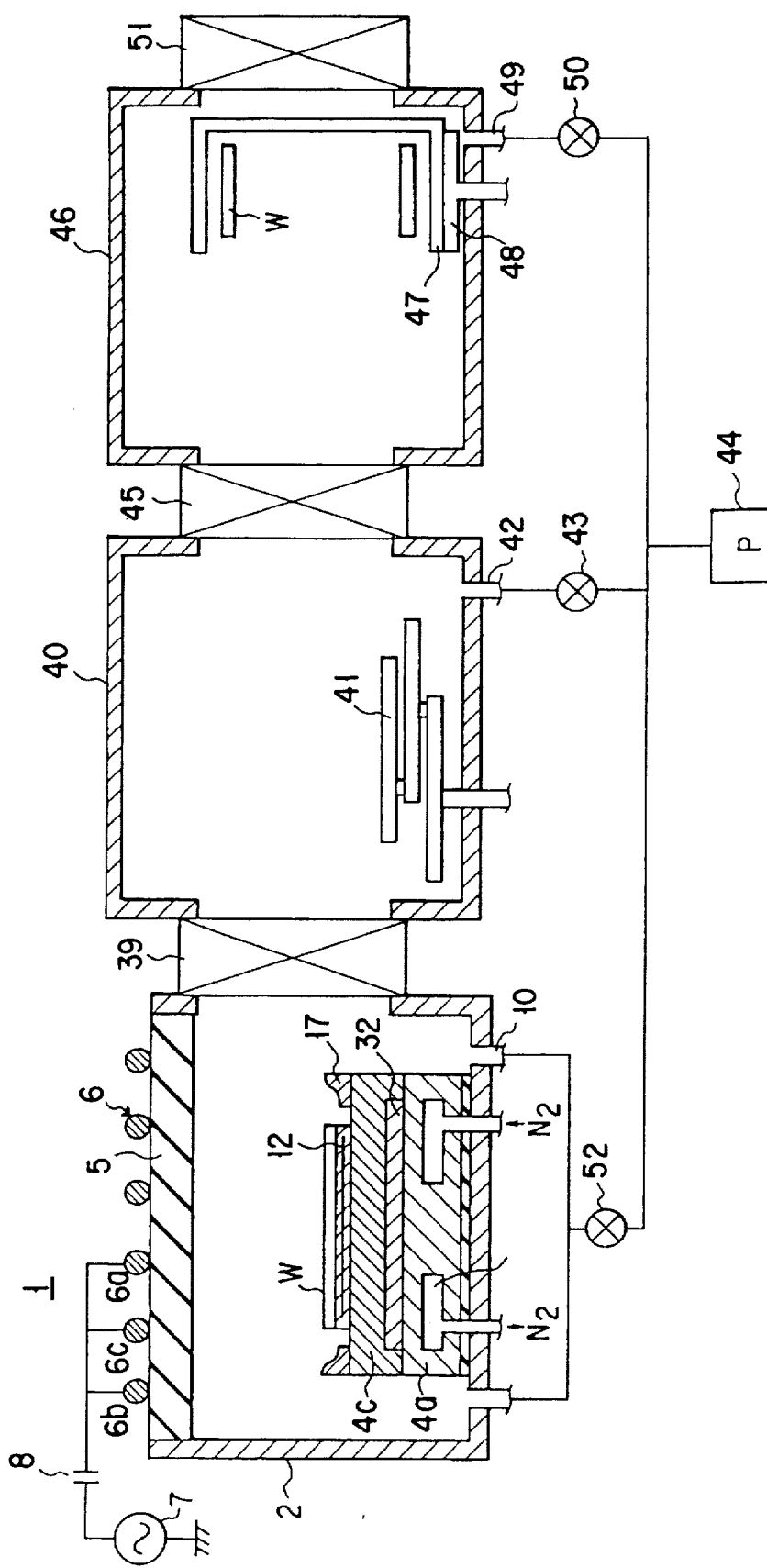
FIG. 4 is a diagram schematically showing a system for supplying wafers to the plasma processing apparatus according to the first embodiment.

The arrangement of the system and process steps using the plasma processing apparatus will be described with reference to FIG. 4. The arrangement which is substantially the same as that in the plasma processing apparatus described above will be denoted by the same reference numerals, and a detailed description thereof will be omitted.

A load-lock chamber 40 is connected to one side wall of the chamber 2 of the radio frequency induced plasma processing apparatus 1, to which the present invention can be applied, through the gate valve 39 which can open/close freely. The load-lock chamber 40 is provided with a convey unit 41, e.g., a convey arm obtained by coating an aluminum arm with conductive Teflon for electrostatic shielding. A discharge pipe 42 is connected to the load-lock chamber 40 through a discharge port formed in the bottom surface of the load-lock chamber 40, and the interior of the load-lock chamber 40 can be evacuated to a vacuum state by a vacuum pump 44 through a vacuum discharge valve 43.

A cassette chamber 46 is connected to a side wall of the load-lock chamber 40 through a gate valve 45 which can open/close freely. A rest table 48 for placing a cassette 47 thereon is provided in the cassette chamber 46. The cassette 47 can accommodate, e.g., 25 wafers W as an object to be processed as one lot. A discharge pipe 49 is connected to the cassette chamber 46 through a discharge port formed in the bottom surface. The interior of the cassette chamber 46 can be 10 evacuated to a vacuum state by the vacuum pump 44 through a vacuum discharge valve 50. The other side wall of the cassette chamber 46 can communicate with the atmosphere through a gate valve 51 which can open/close freely.

The operation of the plasma processing apparatus 1 having the above arrangement will be described in short. First, the gate valve 51 provided between the cassette chamber 46 and the atmosphere is opened, the cassette 47 housing the objects W to be processed is placed on the rest table 48 in the cassette chamber 46 by a convey robot (not shown), and the gate valve 51 is closed. Subsequently, the vacuum discharge valve 50 connected to the cassette chamber 46 is opened, so that interior of the cassette chamber 46 is evacuated by the vacuum pump 44 to, e.g., $10^{-1}$ Torr.

The gate valve 45 between the load-lock chamber 40 and the cassette chamber 46 is opened, and the object W to be processed is taken out from the cassette 47 placed in the cassette chamber 46 by the convey arm 41, and held and conveyed to the load-lock chamber 40. Then, the gate valve 45 is closed. The vacuum discharge valve 43 connected to the load-lock chamber 40 is opened, so that the interior of the load-lock chamber 40 is evacuated by the vacuum pump 44 to, e.g., $10^{-3}$ Torr.

The gate valve 39 between the load-lock chamber 40 and the chamber 2 is opened, and the convey arm 41 conveys the object W to be processed to the chamber 2, in order to transfer it to pusher pins (not shown). Thereafter, the convey arm 41 is returned into the load-lock chamber 40, and the gate valve 39 is closed. Subsequently, a DC high voltage is applied to the electrostatic chuck 12. The pusher pins are moved downward to place the object W to be processed on the electrostatic chuck 12, and the semiconductor wafer W is placed and fixed on the susceptor 4c. During this operation, the vacuum discharge valve 52 is opened, so that the interior of the chamber 2 is evacuated through the vacuum pump 44 to, e.g., $10^{-5}$ Torr.

While a back-cooling gas for heat transfer is supplied to the lower surface of the semiconductor wafer W and the respective joint portions of the rest table 4, a heat for cooling is supplied from the cooling jacket 9, and the target surface of the semiconductor wafer W is cooled to a desired temperature. Thereafter, a process gas such as $CHF_3$ is introduced into the chamber 2 through the gas supplying means 20. After the pressure sensor 38 detects that an optimum pressure atmosphere for obtaining an optimum etching rate, obtained in advance by using a dummy wafer according to the present invention, is reached, a radio frequency power of, e.g., 13.56 MHz is applied from the radio frequency power supply 7 to the radio frequency antenna 6 through the matching circuit 8 to excite a plasma in the chamber 2. Further, a bias potential is applied to the rest table 4 to perform a plasma process, e.g., etching or the like, with respect to the object W to be processed. At this time, the inner wall of the chamber is heated to 50° C. to 200° C., and more preferably 80° C. to 150° C., to prevent a reaction product from attaching to the inner wall of the chamber.

In the plasma process, according to the plasma processing apparatus of the present invention, a control signal is sent from the controller to the radio frequency power supply 7 or the matching circuit 8 on the basis of a preset value or feedback signals from the sensors 36 and 38 which monitor the environment in the chamber. Then, the potential of the radio frequency antenna 6 or the value of a current before/after the intermediate terminal of the radio frequency antenna 6 is variably controlled, and the plasma in the chamber 2 is held at a high density in a uniform state, thereby holding optimum process conditions. In this manner, the controller 37 determines that predetermined etching is finished, application of a radio frequency energy and supply of the process gas are stopped, and the operation of the plasma process is finished.

In order to replace the process gas and the reaction product in the chamber 2, an inert gas, e.g., nitrogen, is supplied into the chamber 2, and the interior of the chamber 2 is evacuated by the vacuum pump 44. After the residual process gas and the reaction product in the chamber 2 are sufficiently discharged, the gate valve 39 provided to the side surface of the chamber 2 is opened. The convey arm 41 is moved from the load-lock chamber 40 to the position of the object W to be processed in the chamber 2 to receive the object W to be processed lifted from the rest table 4 by the pusher pins and to convey it into the load-lock chamber 40. Thereafter, the gate valve 39 is closed. The object W to be processed is heated by a heater in the load-lock chamber 40 to room temperature, e.g., 18° C. Thereafter, the object W to be processed is conveyed from the load-lock chamber 40 to the atmosphere through the cassette chamber 46 to finish a series of operations.

Embodiments concerning various device arrangements for controlling a plasma excited in a chamber 2 through a radio frequency antenna 6 to an optimum state will be described below with reference to FIGS. 5 to 14. Constituent elements whose functions are substantially the same as those in the respective drawings accompanying to this specification will be denoted by the same reference numerals, and a detailed description thereof will be omitted.

Figure 5:
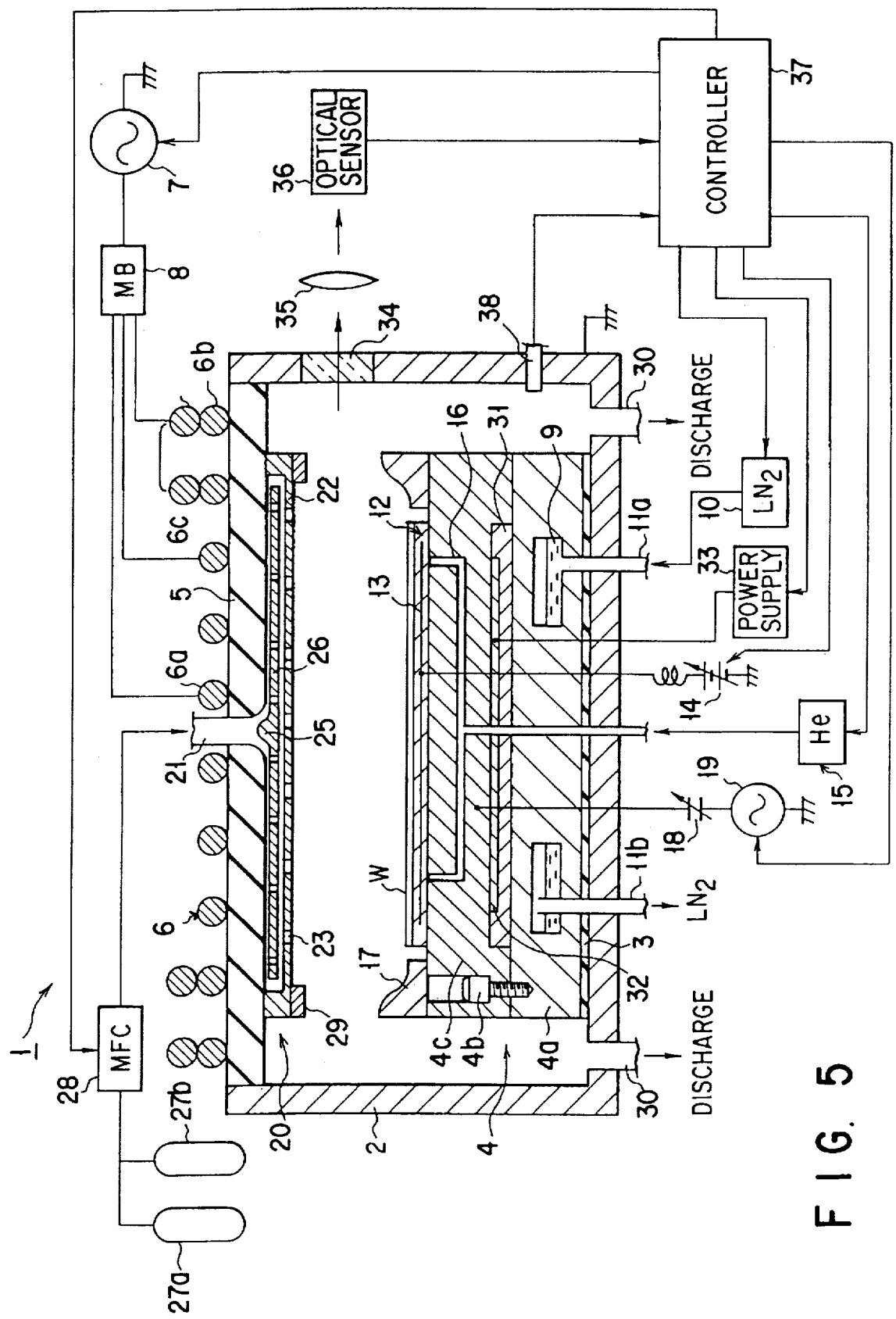
FIG. 5 is a view showing a modification of the apparatus shown in FIG. 1 which has a different radio frequency coil.

Another embodiment of a radio frequency antenna 6 mounted on the outer wall surface of an insulating member 5 is shown in FIG. 5. In this embodiment, a part of the radio frequency antenna 6 constituted by a spiral coil is wound in two layers (portion D), and a strong electromagnetic field can be generated by an overlapping portion D. When the number of turns of the spiral coil is partially changed in this manner in addition to an intermediate portion 6c, the distribution of the density of the plasma excited in a chamber 2 can be adjusted with a higher precision. In the embodiment shown in FIG. 5, the overlapping portion of the radio frequency antenna 6 is set at its outer peripheral portion. However, the overlapping portion can be set at an arbitrary portion of the radio frequency antenna 6 in accordance with a necessary plasma density distribution. In the embodiment shown in FIG. 5, the overlapping portion of the radio frequency antenna 6 is constituted by only two layers. However, the overlapping portion can have an arbitrary number of layers in accordance with a necessary plasma density distribution.

Figure 6:
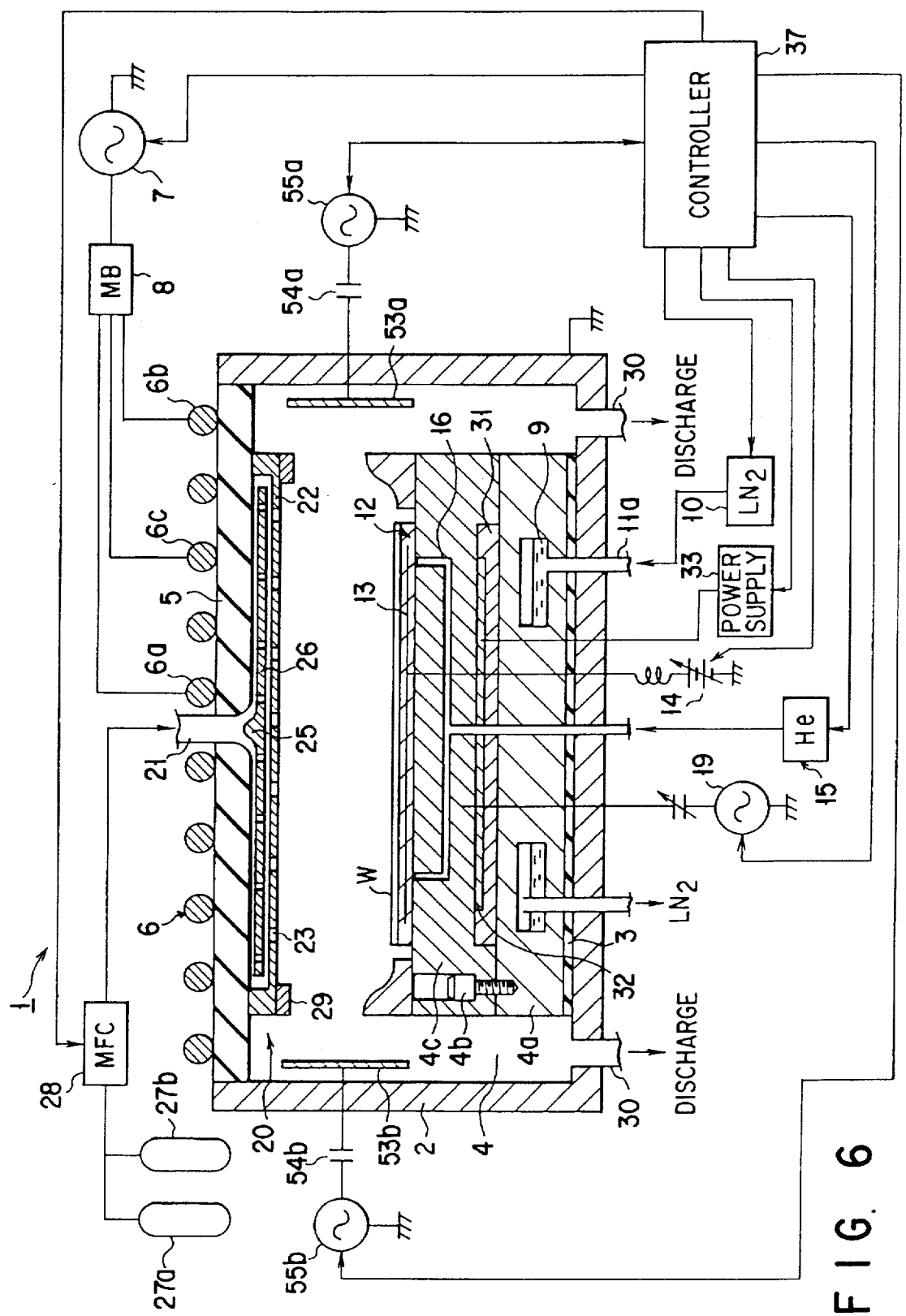
FIG. 6 is a view showing a modification of the apparatus shown in FIG. 1 to which a bias electrode is added.

In a plasma processing apparatus of an embodiment shown in FIG. 6, second electrodes 53a and 53b consisting of, e.g., aluminum are radially arranged in a chamber 2 to surround a rest table 4 at equal angular intervals. The electrodes 53a and 53b are respectively connected to radio frequency power supplies 55a and 55b through matching circuits 54a and 54b. With this arrangement, in addition to a radio frequency bias energy applied to the rest table 4, a radio frequency bias energy can also be applied to the second electrodes 53a and 53b that radially surround the surface to be processed of an object W to be processed from the outer circumference in the radial direction at equal angular intervals. Therefore, the plasma excited in the chamber 2 can be controlled to an optimum state by adjusting the intensity, amplitude, phase, frequency, and the like of the respective radio frequency energies.

Figure 7:
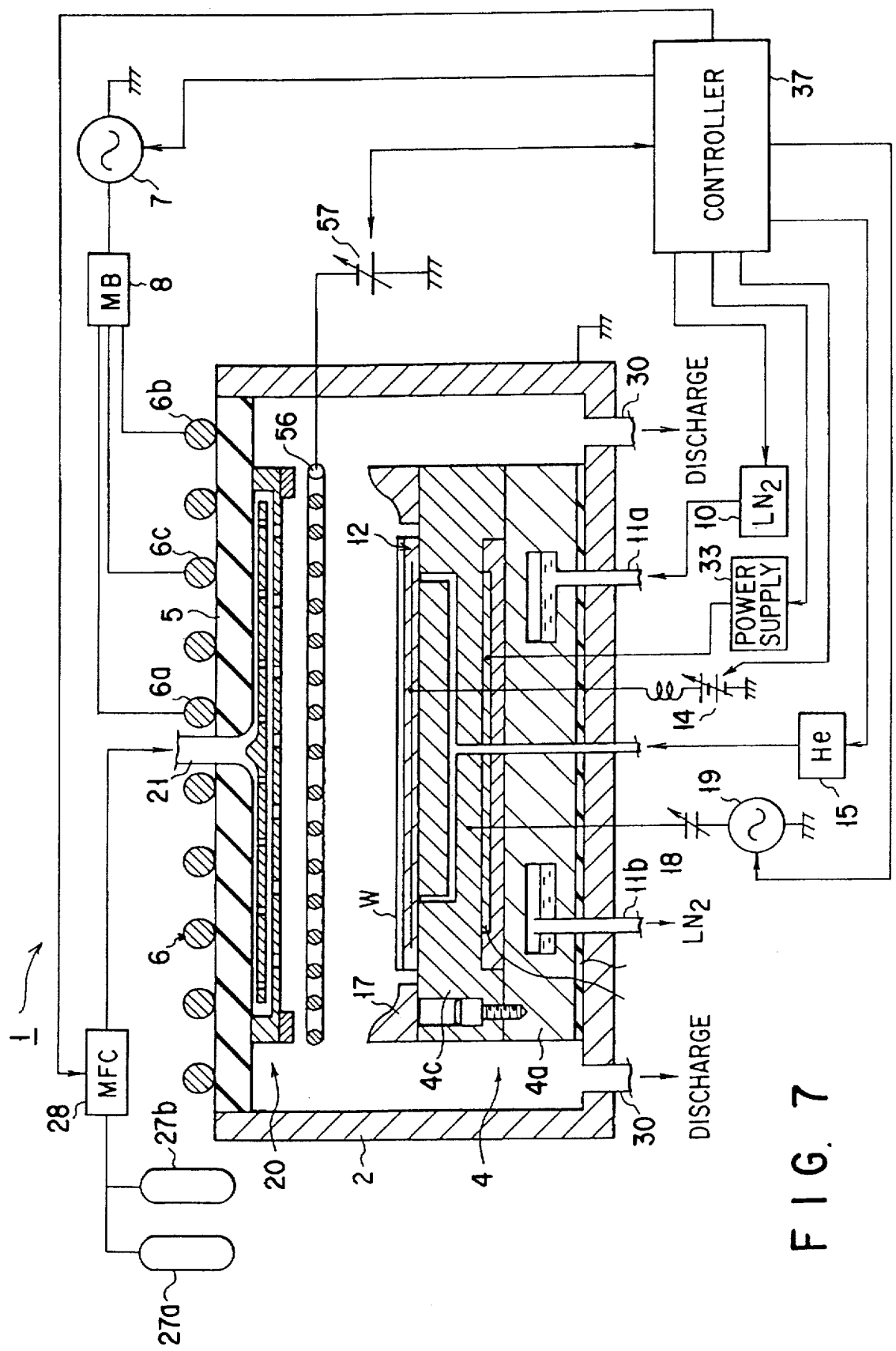
FIG. 7 is a view showing a modification of the apparatus shown in FIG. 1 to which a control electrode is added.

In an embodiment shown in FIG. 7, a mesh-type electrode 56 consisting of, e.g., silicon or aluminum is arranged below the gas blow surface of a gas supplying means 20 and above a rest table 4 in a chamber 2. The electrode 56 is connected to a variable power supply 57. When an appropriate current is supplied to the electrode 56, the distribution of an electric field generated in the chamber 2 by the operation of a radio frequency antenna 6 can be controlled, thereby exciting a plasma having a desired density distribution in the chamber 2.

Figure 8:
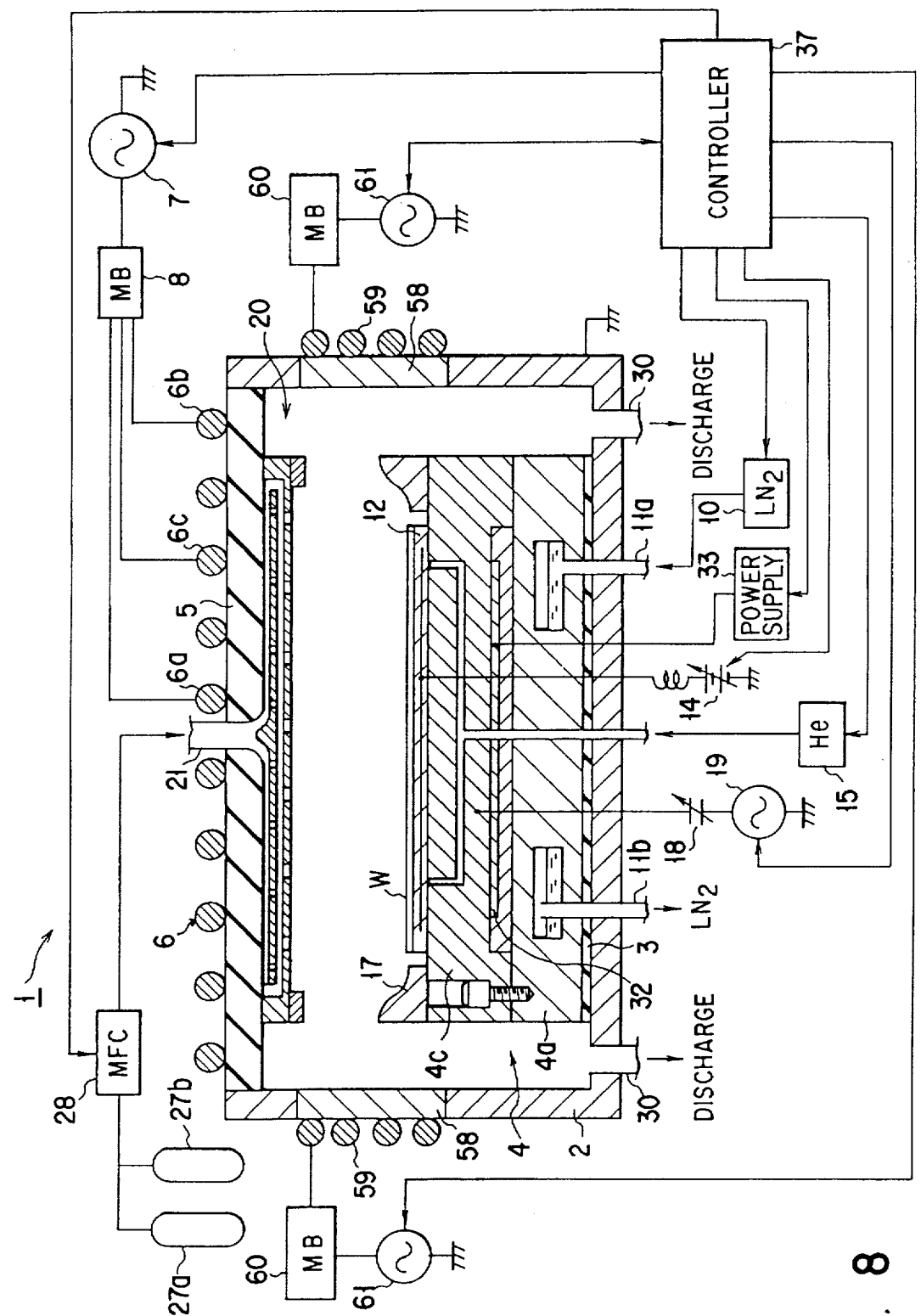
FIG. 8 is a view showing a modification of the apparatus shown in FIG. 1 to which another radio frequency antenna is added to the outer surface of a processing chamber.

In the embodiment shown in FIG. 1, the radio frequency antenna 6 is arranged on the upper surface of the chamber 2 through the insulating member 5, e.g., quartz glass. However, the present invention is not limited to the embodiment. For example, as shown in FIG. 8, a part of the side wall of a chamber 2 consists of an insulating member or members 58 made of, e.g., quartz glass or ceramic, and each of second radio frequency antennas 59 are mounted on the outer wall surface of the insulating member 58. The radio frequency antennas 59 are preferably radially arranged at equal angular intervals with each other, and radio frequency energies can be applied to the second radio frequency antennas 59 from radio frequency power supplies 61 connected through matching circuits 60 with this arrangement, a plasma can be excited also from the side wall portions of the chamber 2. Therefore, a high-density, uniform plasma can be generated in the chamber 2 to have a desired density distribution by adjusting the radio frequency energies applied to the respective antennas. As a result, a plasma process with a higher precision is enabled.

Figure 9:
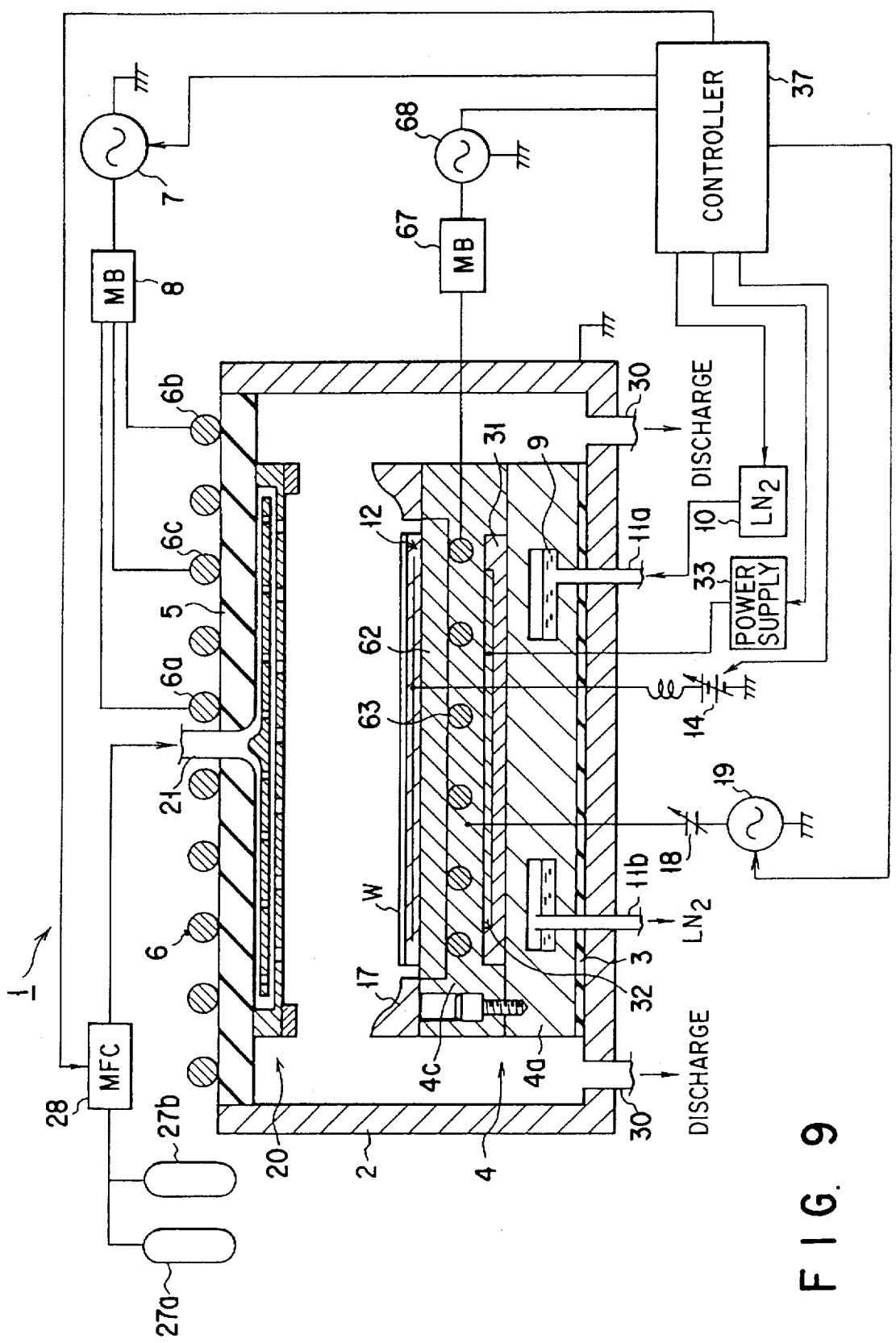
FIG. 9 is a view showing a modification of the apparatus shown in FIG. 1 to which another radio frequency antenna is added in a rest table.

As shown in FIG. 9, a part of a rest table 4 consists of an insulating member 62 made of, e.g., quartz glass, and a radio frequency antenna 63 is arranged on the lower surface of the insulating member 62. A radio frequency energy is applied to the radio frequency antenna 63 by a radio frequency power supply 68 connected through a matching circuit 67. With this arrangement, a plasma can be excited also from the lower surface of the rest table 4 of a chamber 2. Therefore, a high-density, uniform plasma can be generated in the chamber 2 to have a desired density distribution by adjusting the radio frequency energy applied to the antenna. As a result, a plasma process with a higher precision is enabled.

Figure 10:
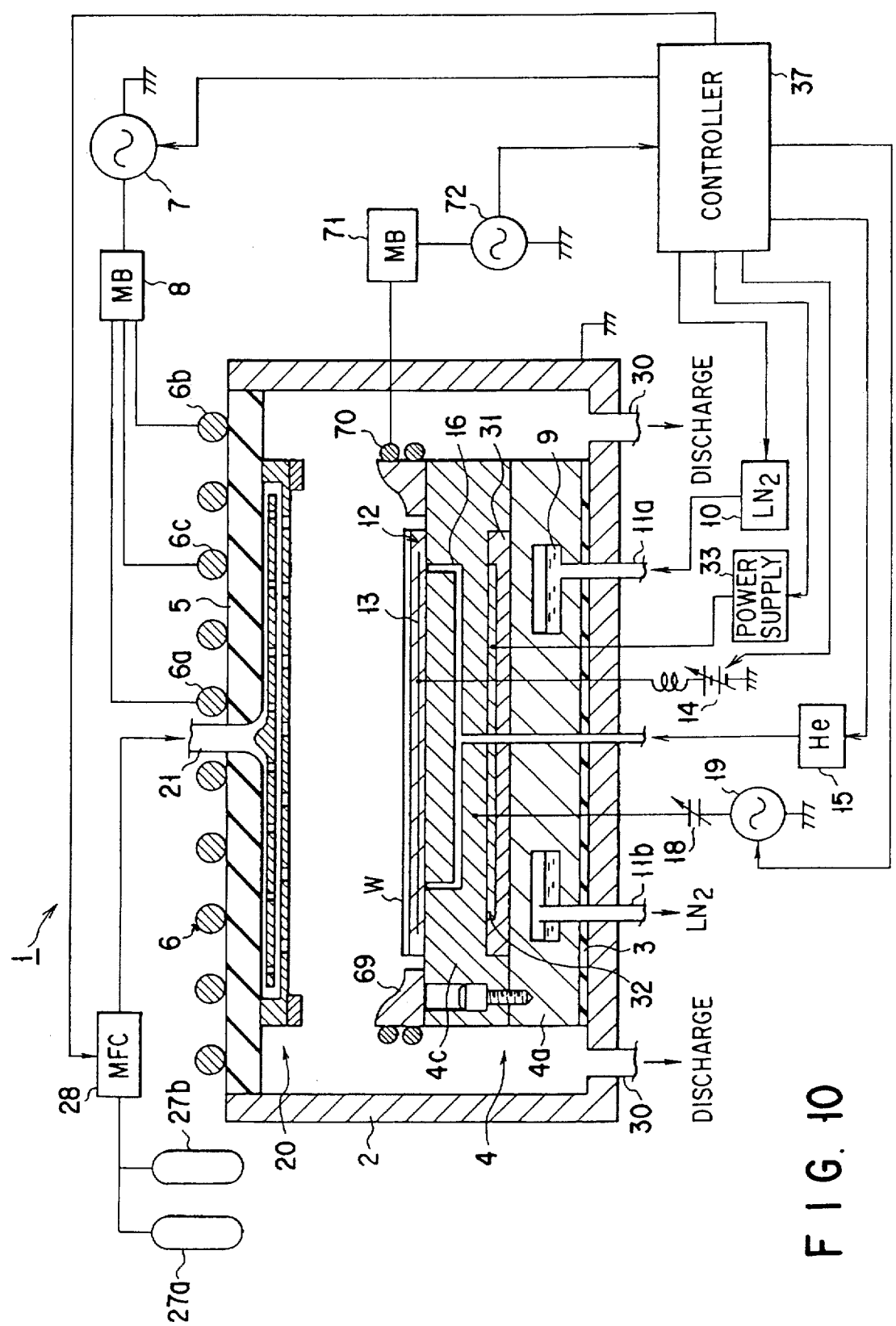
FIG. 10 is a view showing a modification of the apparatus shown in FIG. 1 to which another radio frequency antenna is added around a focus ring.

As shown in FIG. 10, a focus ring arranged around the upper surface of a rest table 4 consists of an insulating member 69 made of, e.g., quartz glass or ceramics. A radio frequency antenna 70 is arranged around the focus ring. A radio frequency energy is applied to the radio frequency antenna 70 from a radio frequency power supply 72 which is connected through a matching circuit 71. With this arrangement, a plasma can be excited also from a portion around the rest table 4 of a chamber 2. Therefore, a high-density, uniform plasma can be generated in the chamber 2 to have a desired density distribution by adjusting the radio frequency energy applied to the antenna. As a result, a plasma process with a higher precision is enabled.

When an object to be processed, e.g., an LCD, which has a comparatively large area is to be processed with a plasma, as shown in FIG. 11, a plurality of radio frequency antennas 73a, 73b, 73c, and 73d can be mounted on the outer wall portion of an insulating member 5 arranged on the upper surface of a chamber 2, and radio frequency energies can be applied to the respective radio frequency antennas from radio frequency power supplies 75a, 75b, 75c, and 75d connected through matching circuits 74a, 74b, 74c, and 74d. With this arrangement, even if the chamber 2 has a large size for processing an object to be processed which has a comparatively large area, a high-density, uniform radio frequency plasma can be excited.

In the embodiments described above, the object W to be processed is placed on the upper surface of the rest table 4, and the plasma is excited by the radio frequency antenna(s) 6 placed on the upper surface of the chamber 2. However, the present invention is not limited to this arrangement. For example, a face-down method as shown in FIG. 12 may be employed. In this apparatus, constituent elements identical to the respective constituent elements of the processing apparatus shown in FIG. 1 are arranged almost upside down.

In this face-down type apparatus, it is preferable to provide a vertically movable support mechanism 76 for supporting an object W to be processed from below and a vertically movable pusher pin mechanism 77 for removing the object W to be processed from an electrostatic chuck 12. When this arrangement is adopted, the target surface of the object W to be processed can be protected from being contaminated by fine particles and the like. As a result, the yield and throughput can be further improved.

Figure 13:
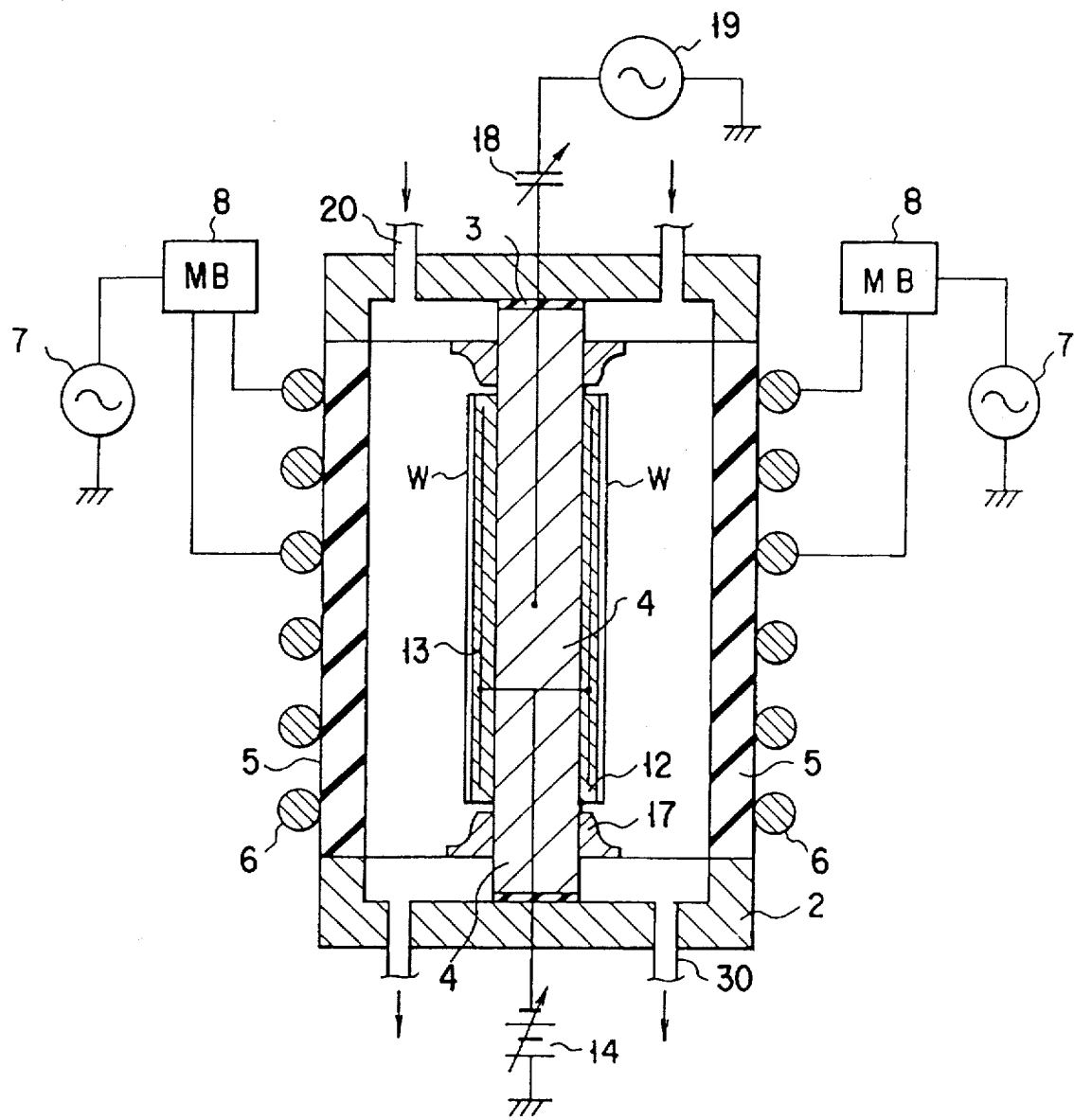
FIG. 13 is a sectional view showing a plasma processing apparatus in which a plasma process space is formed on a side of an object to be processed.

Alternately, as shown in FIG. 13, the substantially cylindrical chamber 2 is vertically arranged, the insulating members 5 are arranged on two sides thereof, and radio frequency antennas 6 are respectively mounted on the outer wall surfaces of the respective insulating members 5. The objects W to be processed are chucked and held on the two surfaces of the rest tables 4 substantially vertically arranged at the center of the chamber 2 through the electrostatic chucks 12. This arrangement can be employed.

With this arrangement, a plurality of the objects W to be processed can be simultaneously processed. In addition, since the surfaces to be processed of the objects W to be processed are vertically arranged, the target surfaces are protected from contamination caused by fine particles, thereby further improving the yield and throughput.

Figure 14:
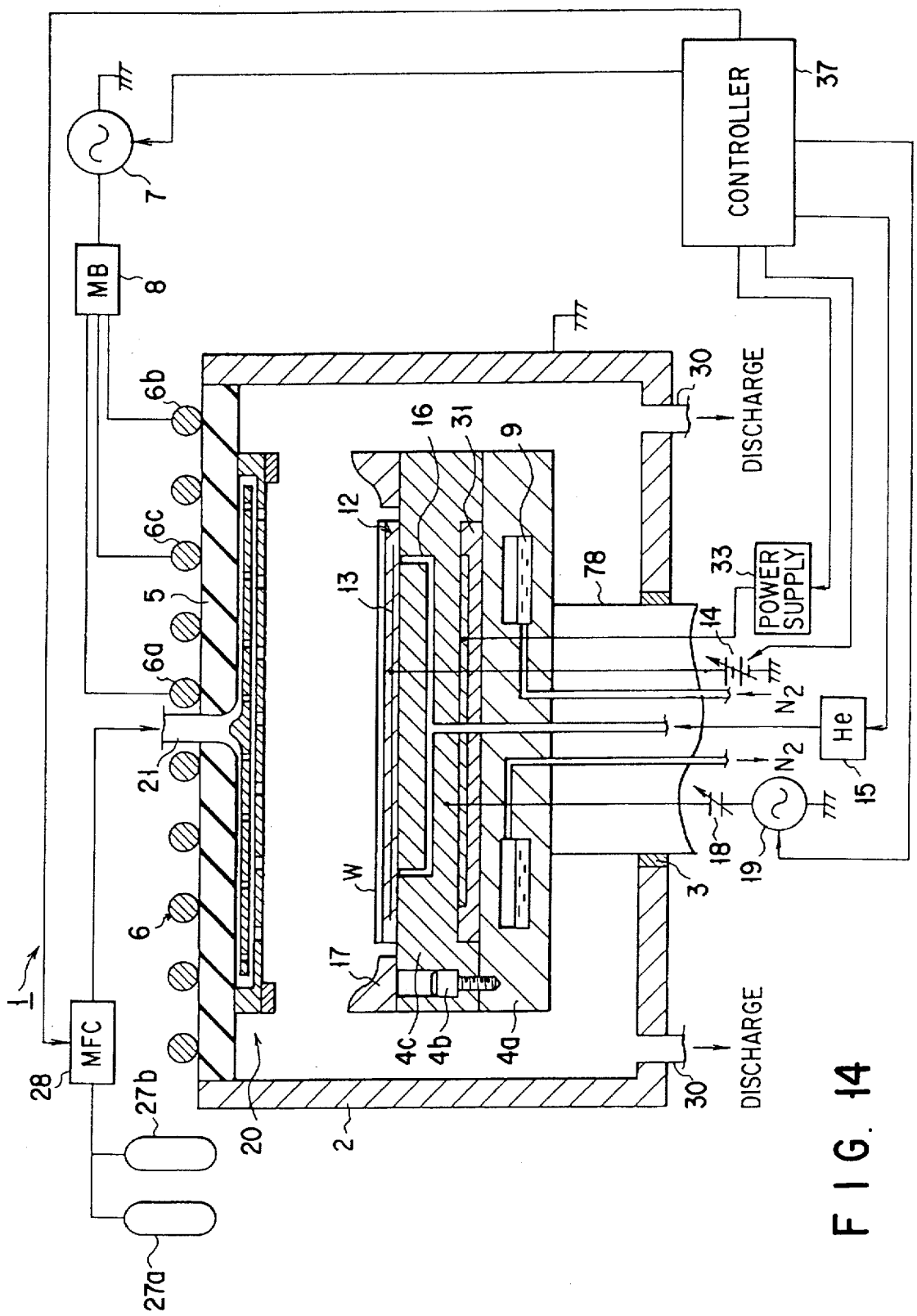
FIG. 14 is a sectional view showing a plasma processing apparatus in which a rest table is provided to be vertically movable.

In another embodiment shown in FIG. 14, a susceptor 4 is not fixed on the wall surface of a chamber 2, but is placed on a vertically movable elevating mechanism 78. Pipes and various types of electric circuits for supplying a cool or heat source and a heat transfer gas to the susceptor 4 are arranged in the elevating mechanism 78. When this arrangement is adopted, the surface to be processed on the susceptor 4 can be adjusted to be vertically moved with respect to a radio frequency antenna 6 serving as a plasma generating source. Thus, the surface to be processed can be moved to a space having an optimum plasma density distribution and be processed.

In any of the apparatuses of the above embodiments, the intermediate terminal of the radio frequency antenna is utilized to independently and variably control a current between terminals. However, a current flowing between the outer and inner terminals or a voltage between the terminals may be intermittently ON/OFF-controlled during the plasma process.

More specifically, a radio frequency voltage or current is ON/OFF-controlled and supplied in accordance with an emission spectrum signal or a preset value to intermittently generate a plasma. By intermittently generating the plasma in this manner, an active species of a plasma is prevented from being diffused and the flow of the plasma is concentrated on the target surface of the object to be processed. For this reason, an etching efficiency can be increased. Since discharge of a reaction product is promoted during stop of the plasma, an etching rate can be further increased. If necessary, a discharge amount can be adjusted to increase/decrease during the stop of plasma generation.

In order to observe an emission spectrum, when an observation window 34 consisting of, e.g., quartz, is used, a part of the flow of a plasma collides also against the observation window 34. For this reason, the observation window itself may be etched, or gas components may be attached thereto, thus degrading the transparency of the observation window. Since such a problem is caused in the chamber 2, and an emission spectrum cannot pass through the observation window 34, a signal cannot be accurately received. When the apparatus is subjected to feedback control on the basis of such a distorted signal, an accurate process cannot be performed and in other words, an erroneous operation is performed.

In such a case, the following method can be used.

A composite sensor is used which is obtained by combining a first sensor, as an optical sensor, which outputs a signal corresponding to an incident emission spectrum, and a second sensor which senses a shortwave component of light from the processing chamber through the observation window 34, e.g., a component of 100 nm to 1,000 nm, and more preferably about 200 nm, and outputs a signal corresponding thereto. Such a shortwave component has a higher sensibility to degradation in transparency of the observation window. Therefore, the second sensor monitors a change in shortwave component sent through the observation window to grasp the degradation in transparency of the observation window 34. A signal concerning an emission spectrum detected by the first sensor is corrected in accordance with the degree of the degradation, thereby performing accurate feedback control. If an observation result of the shortwave component can be independently known, when the observation window is greatly degraded, this degradation can be known. As a result, this gives a criterion of maintenance for, e.g., replacing the observation window itself with a new one.

Embodiments respectively shown in FIGS. 15 and 16 are basically different from the above embodiments in that an electrostatic shield means 91 is added between a radio frequency antenna 6 and an insulating member 5.

If the electrostatic shield means 91 is not provided, a potential difference occurs between the radio frequency antenna 6 and the side wall of a chamber 2. Since a part of the flow of a plasma generated in the chamber 2 flows not only through the target surface of an object W to be processed but also through the side wall of the chamber 2, the side wall of the chamber 2 and an insulating member 5 may be damaged, and in addition the efficiency of the plasma process, e.g., etching, may be decreased. However, the electrostatic shield means 91 is provided as in this embodiment to prevent an electrostatic force of the radio frequency antenna 6 from acting on the chamber 2. For this reason, the potential difference between the radio frequency antenna 6 and the chamber 2 can be prevented. As a result, the flow of the plasma generated in the chamber 2 is escaped in the direction of a rest table 4 applied with a bias potential, i.e., toward the target surface of the object W to be processed, thereby effectively etching the target surface.

If the electrostatic shield means 91 is not provided, when a radio frequency power is applied to the radio frequency antenna 6, a plasma is slowly generated. In order to generate a plasma quickly, a certain ignition unit needs to be provided. However, it is known that ignition of a plasma is promoted by interposing the electrostatic shield means 91, and the plasma process quickly starts without using an ignition unit.

An electrostatic shield means 91 shown in FIG. 15 extends over almost the entire region between a radio frequency antenna 6 and an insulating member 5, and is grounded. The electrostatic shield means 91 is constituted by a conductive plate 92 consisting of, e.g., copper, and two insulating films or layers 93a and 93b vertically clamping the conductive plate 92 and consisting of, e.g., polyimide resin.

An electrostatic shield means 91 shown in FIG. 16 extends over almost the entire region between a radio frequency antenna 6 and an insulating member 5, and is grounded. The electrostatic shield means 91 is formed by a mesh 94 consisting of a conductive member such as a metal. In this case, the radio frequency antenna 6 is arranged not to contact the conductive mesh 94.

Figure 17:
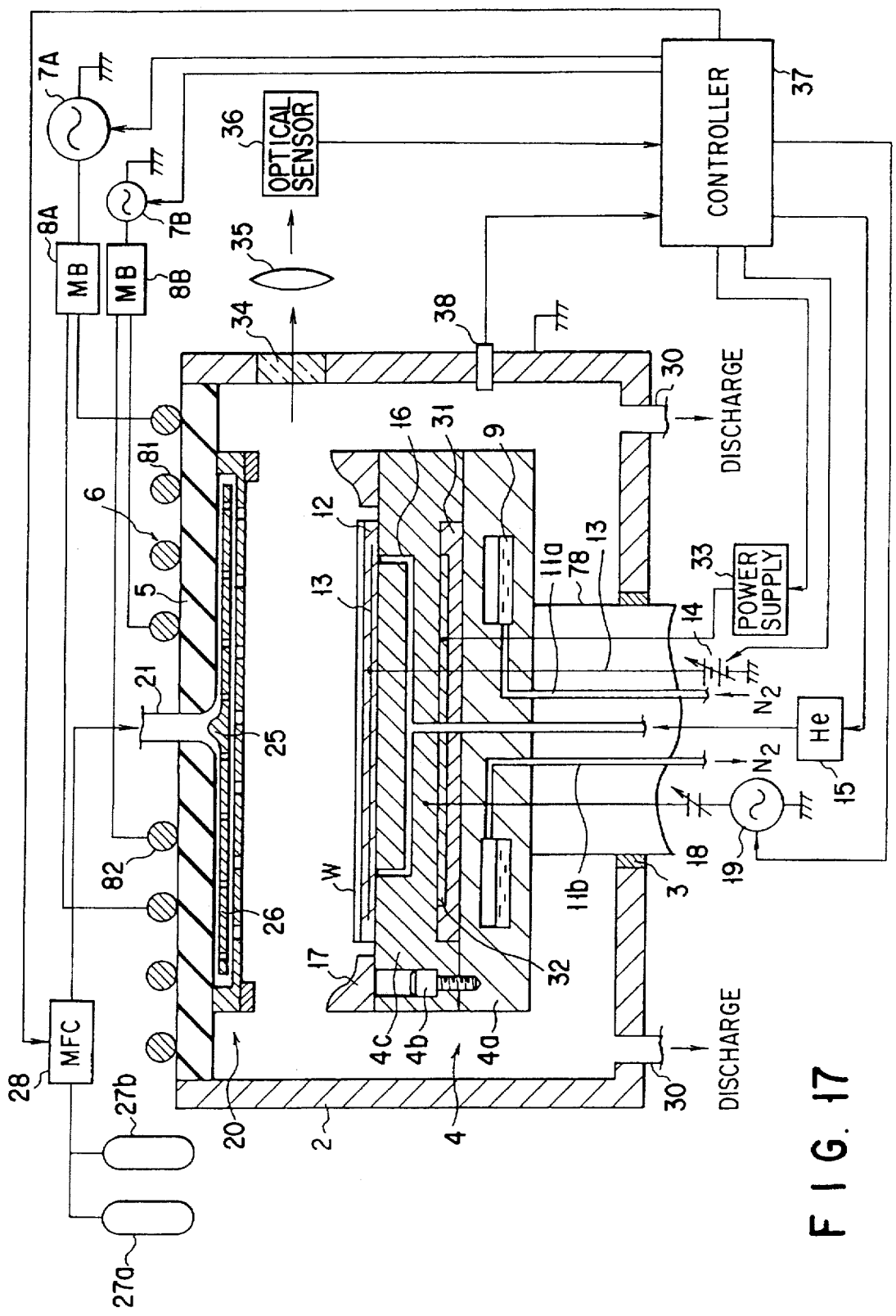
FIG. 17 is a sectional view showing a plasma processing apparatus comprising an improved radio frequency applying means.

An embodiment shown in FIG. 17 is obtained by combining the embodiment shown in FIG. 1 and that shown in FIG. 14, and further improving a radio frequency applying means. A radio frequency antenna 6 as the radio frequency applying means is constituted by a spiral first antenna portion 81 having a large diameter, and a partially notched ring-like second antenna portion 82 having a small diameter and coaxially arranged in the first antenna portion 81. The antenna portions 81 and 82 are arranged on an insulating member 5 to form the same plane. A plasma-generating first radio frequency power supply 7A is connected between an inner terminal 81A and an outer terminal 81B of the first outer antenna portion 81 through a matching box 8A. A 13.56-MHz radio frequency electromagnetic wave is applied to the first antenna portion 81 from this power supply. A plasma-generating second radio frequency power supply 7B is connected between two ends 82A and 82B, which have a predetermined interval therebetween at a notched portion, of the second antenna portion 82 through a matching box 8B. A 13.56-MHz radio frequency electromagnetic wave is applied to the second antenna portion 82 from this power supply. A total power applied to the antenna 6 is preferably 500 to 3,000 W. The frequency of an electromagnetic wave applied to each antenna portion is not limited to 13.56 MHz, but can be a radio frequency of, e.g., 380 kHz, 6.35 MHz, 27.12 MHz, 40.68 MHz, or the like. The first and second power supplies 7A and 7B are connected to a controller 37, and can be independently controlled to be driven.

The case in which a silicon oxide film is etched using a plasma processing apparatus shown in FIG. 17 will be described using FIGS. 19 to 21.

13.56-MHz radio frequency electromagnetic waves at a power of 500 to 3,000 W are applied to the first antenna portion 81 and the second antenna portion 82 of the radio frequency antenna from the first power supply 7A and the second radio frequency power supply 7B through the first matching box 8A and the second matching box 8B, respectively. Simultaneously, a radio frequency power of 100 to 500 W is applied to a rest table 4 from a radio frequency bias power supply 15. An induced plasma of CHF3 is generated in a chamber 2, and a silicon oxide film formed on a semiconductor wafer W is etched at a gas pressure of 10 to 100 mTorr.

After the rest table 4 is set at a vertically predetermined position by an elevating mechanism 78, the wafer W is placed on an electrostatic chuck 12 to which a voltage is applied in advance. As a result, the wafer W is fixed on the electrostatic chuck 12 by an electrostatic force. The chamber 2 is evacuated by a vacuum pump (not shown) through a discharge pipe 30. Thereafter, while a back-cooling gas for heat transfer is supplied to the lower surface of the wafer W and respective joint portions of the rest table 4, the wafer W is cooled to a predetermined temperature of, e.g., 15° C. At the same time of or subsequent to this cooling, a pure $CHF_3$ gas or the like is supplied into the chamber 2 from a process gas supply source 27a through a gas supply portion 20.

Then, in-phase radio frequency powers of 500 to 3,500 W at 13.56 MHz are applied from the radio frequency power supplies 7A and 7B to the antenna portions 81 and 82 of the radio frequency antenna 6 through the matching boxes 8A and 8B to apply an electromagnetic wave in the chamber 2. In addition, a radio frequency power of 10 to 300 W at 13.56 MHz is applied from a radio frequency power supply 19 to the rest table 4 through a DC-component-cut capacitor 18. At this time, if the power to the first antenna portion 81 is set higher than that to the second antenna portion 82, a larger current flows through the first antenna portion 81 than that through the second antenna portion 82. An electromagnetic wave having a stronger distribution at the peripheral portion in the chamber 2 than that at the central portion thereof is supplied into the chamber 2. A plasma having a higher density at the peripheral portion than that at the central portion is generated. As a result, the plasma having a high density at the peripheral portion is diffused inward in the radial direction to uniform the density of the plasma in the chamber 2 in the radial direction. Consequently, the plasma is uniformly diffused on the silicon oxide of the wafer W to uniformly etch the silicon oxide.

At this time, a mass flow controller 28 is controlled by the controller 37 to adjust the flow rate of a process gas. At the same time, the gas pressure is variously changed using an automatic pressure adjusting unit (not shown). Every time the gas pressure is changed, the electron temperature in the chamber 2 is measured with a Langmuir probe (not shown) arranged in the chamber 2, thereby measuring the gas dependency of the electron temperature. This result is shown in FIG. 19. The electron temperature is plotted along the ordinate, and the pressure in the chamber is plotted along the abscissa in FIG. 19. As shown in FIG. 19, the electron temperature is abruptly increased with a decrease in gas pressure of less than 10 mTorr. The electron temperature is moderately increased with an increase in gas pressure in the range of 10 to 100 mTorr (FIG. 19 shows gas pressures up to 50 mTorr). The electron temperature is stable as 4 eV to 2 eV within this range. If the electron temperature falls within the range of 2 to 4 ev, an electron energy higher than the bonding energy of $CHF_3$ molecules to generate a plasma can be sufficiently obtained because the bonding energy of molecules generally falls within the range of 1 to several ev.

As is apparent from this result, if the gas pressure is a lower pressure of less than 10 mTorr, the electron temperature greatly varies with a little variation in pressure to greatly influence a plasma. For this reason, the gas pressure is difficult to control in etching, and stable etching cannot be performed. On the other hand, if the gas pressure falls within the range of 10 to 100 mTorr, the electron temperature moderately varies within the range of 2 to 4.3 eV, and a stable plasma can be obtained. Therefore, the gas pressure is easily controlled in etching, and etching can be stably continued. If the gas pressure exceeds 100 mTorr, the characteristics of the radio frequency induction bonding system cannot be effectively utilized, resulting in inconvenience.

Figure 20:
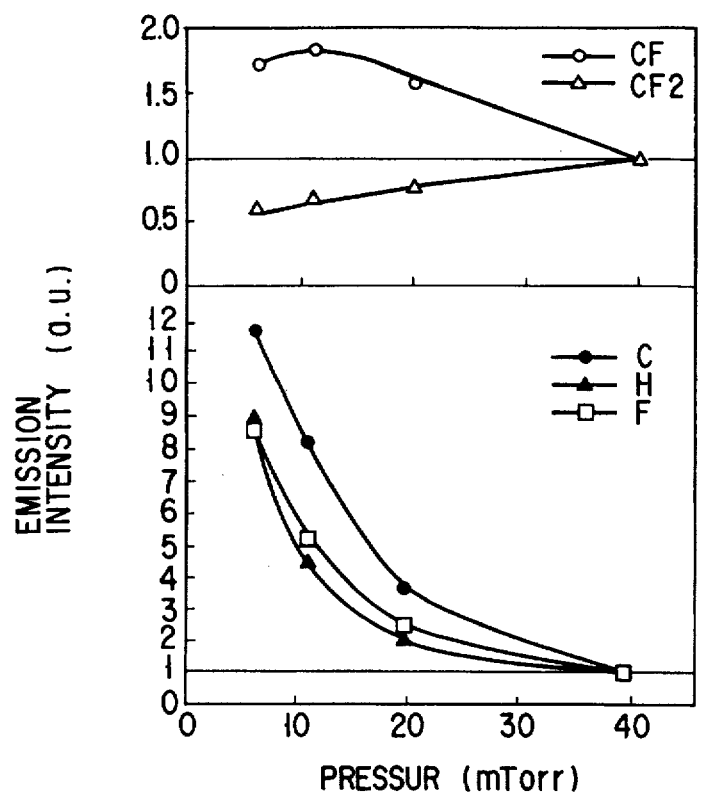
FIG. 20 is a graph showing measurement results of the gas pressure dependency of the emission intensity.

The gas pressure dependency of the emission intensity is measured to obtain results in FIG. 20. The emission intensity is plotted along the ordinate, and the pressure in the chamber is plotted along the abscissa in FIG. 20. As shown in FIG. 20, the emission intensity of $CF_2$ radicals is uniformly decreased with a decrease in pressure, while the emission intensity of CF is increased with a decrease in pressure. The emission intensity of CF has a peak value near the pressure of 10 mTorr. The emission intensities of F, C, and H radicals are abruptly increased with a decrease in pressure. This indicates that $CHF_3$ is decomposed into F, C, and H. More specifically, when the pressure is decreased to be less than 10 mTorr, it is difficult to obtain ions required for etching. Generation of the R, C, and H radicals is suppressed in the pressure range of 10 to 100 mTorr. In the pressure range of 10 to 100 mTorr, $CF_2$ radicals are gradually increased to tend to cause radical polymerization. This is very important to etch an underlying layer at a high selectivity.

Figure 21:
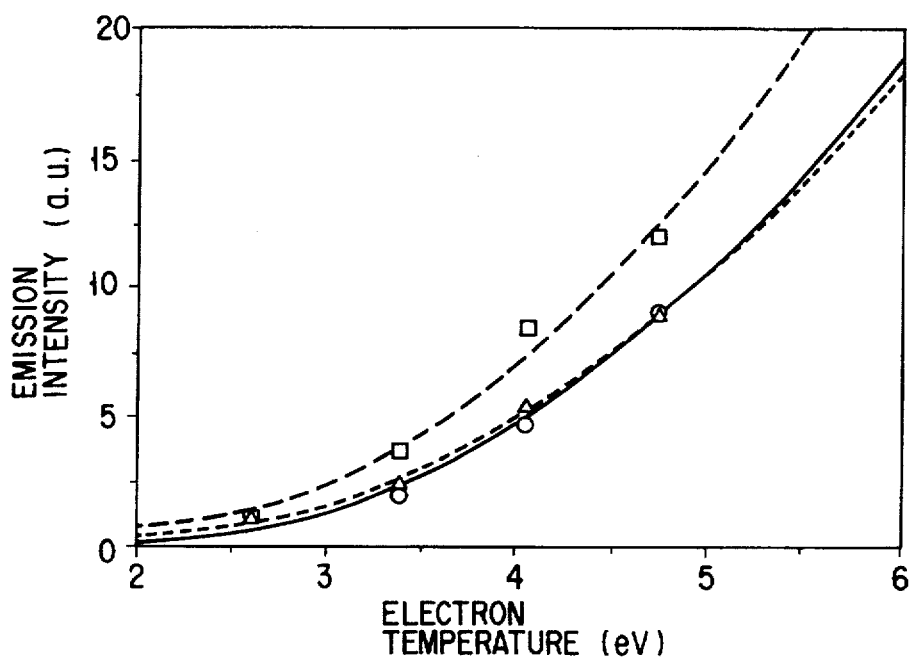
FIG. 21 is a graph showing measurement results of the electron temperature dependency of the emission intensity.

FIG. 21 shows the results obtained by measuring the electron temperature dependency of the emission intensity. As can be understood from FIG. 21, the emission intensities of the F, C, and H radicals are increased with an increase in electron temperature and are abruptly increased at an electron temperature exceeding 5 ev. This indicates that the F, C, and H radicals are moderately increased with an increase in electron temperature in the range of 2 to 5 ev and that the F, C, and H radicals are abruptly increased at an electron temperature exceeding 5 eV, resulting in inconvenience.

Taking the above results into consideration, a substantially 1-μm thick silicon oxide film of the semiconductor wafer W is etched, and the etching is finished for about two minutes. It is found that a selectivity of 40 or more can be obtained with respect to silicon as an underlying member, the resultant structure has a good etched shape, and the side surface of the oxide film is substantially vertically etched. These give an important solution for a process of a self-aligned contact hole which will be frequently desired in the future. Use of this phenomenon makes it possible to etch only an oxide film, and leave a nitride film and a silicon film.

A plasma processing apparatus of still another embodiment comprising a radio frequency applying means which is improved to induce a uniform plasma along the radial direction in a processing apparatus will be described below with reference to FIGS. 22 to 25.

Figure 22:
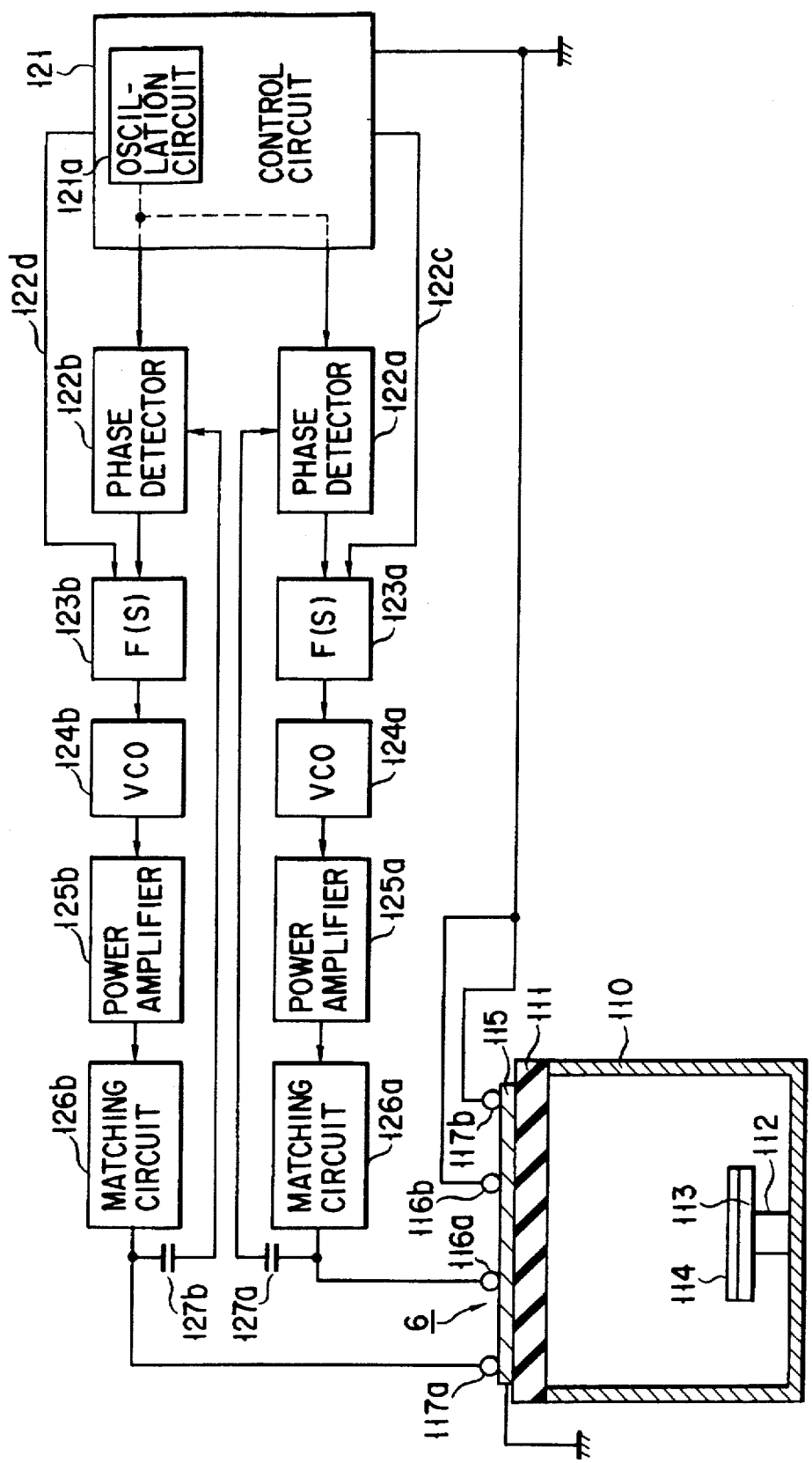
FIG. 22 is a control block diagram showing a coil division type plasma generating apparatus according to another embodiment.

Referring to FIG. 22, reference numeral 110 denotes a chamber or processing chamber of a plasma processing apparatus. The bottom and side surfaces of the chamber 110 consist of conductive members, e.g., aluminum, and the upper surface thereof is constituted by a cylindrically closed vessel consisting of quartz glass or an insulating member 111. A support member 112 consisting of a columnar insulator, e.g., ceramic or quartz, is arranged at the central portion of the bottom surface of the chamber 110.

A disk-like electrode base 113 consisting of, e.g., aluminum is set on the upper end of the support member 112. A wafer rest table 114 consisting of an insulating member, e.g., quartz or ceramic, is set on the upper surface of the base 113.

Figure 23:
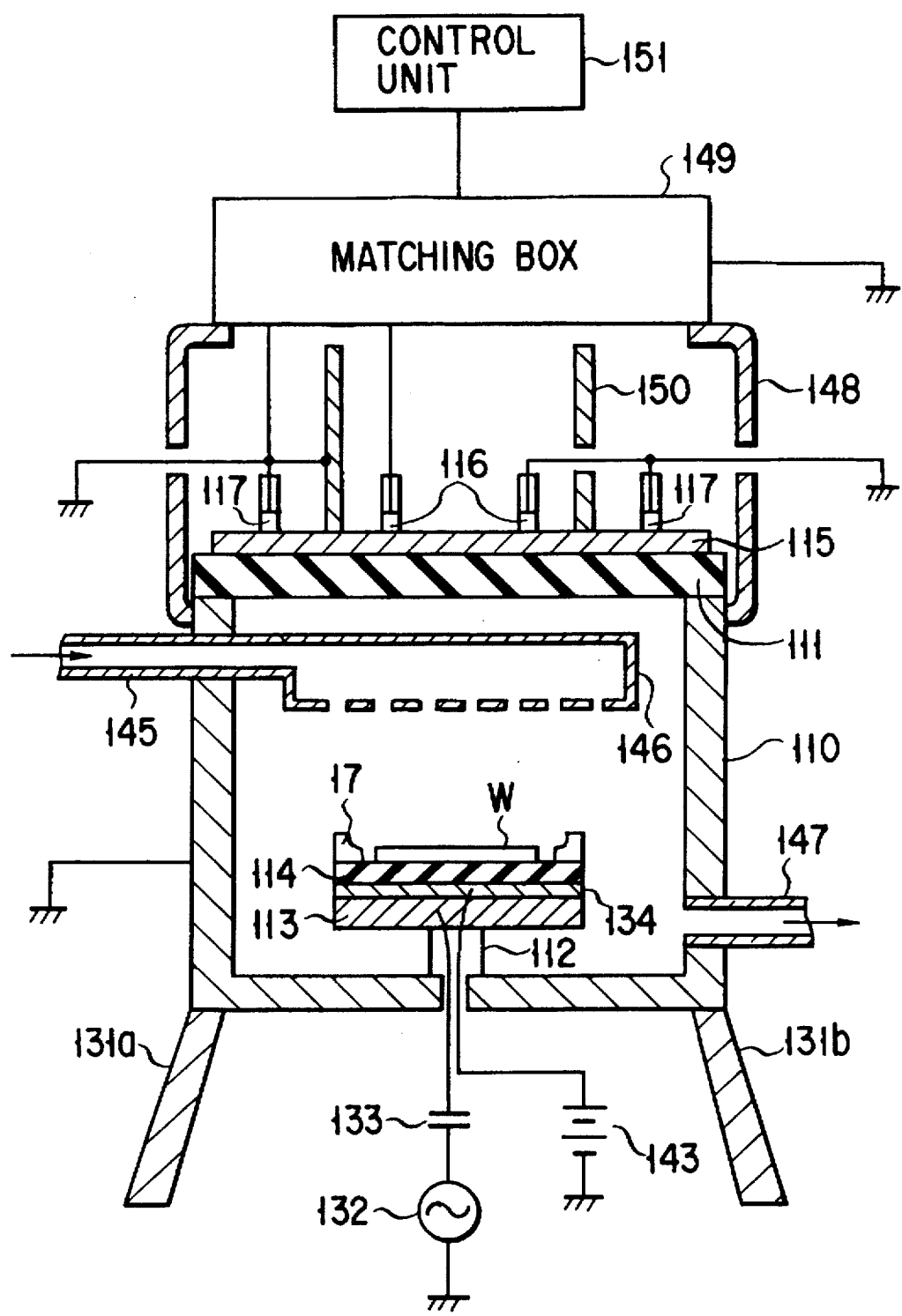
FIG. 23 is a sectional view showing the overall arrangement of the plasma generating apparatus shown in FIG. 22.

An annular focus ring 17 consisting of a resistor having a high resistance which does not attract reactive ions, e.g., ceramic or quartz, is provided on the peripheral edge portion of the upper surface of the rest table so as to surround a wafer, as shown in FIG. 23. A disk-like paramagnetic metal or magnetic shield plate 115, consisting of, e.g., aluminum, for performing electrostatic shield is set on the outer wall surface of the quartz glass 111 on the upper surface of the chamber 110. A first one-turn radio frequency coil 116 and a second one-turn radio frequency coil 117 having a larger diameter than that of the first one-turn coil 116 are provided on the paramagnetic metal 115 such that a cylindrical electromagnetic shield cylinder 150 consisting of aluminum or copper is interposed therebetween. A radio frequency antenna 6 is constituted by the first and second coils. Note that the paramagnetic metal 115 is grounded. The magnetic shield plate 115 is constituted by a thin disk as shown in FIG. 25, and a large number of slits 115A are formed in the plate 115 in a predetermined distribution. In this embodiment, the slits 115A are constituted by a group of outer slits extending toward the center of the disk from the outer circumference, and a group of inner slits radially extending outward from the center. These outer and inner slits are alternately positioned with each other. With this arrangement, the magnetic shield plate 115 prevents an overcurrent from flowing along the disk.

The paramagnetic metal 115 is set so that capacitive coupling parasitically existing between a plasma and the chamber 110 by a voltage applied to the first and second one-turn radio frequency coils 116 and 117 is avoided.

The first one-turn radio frequency coil 116 and the second one-turn radio frequency coil 117 are coaxially arranged on the same plane at predetermined intervals as shown in the plan view of FIG. 24. Each of the radio frequency coils 116 and 117 has a partially notched ring-like shape. The first one-turn radio frequency coil 116 has a smaller diameter than that of the second one-turn radio frequency coil 117. Terminals 116a and 116b of the radio frequency coil 116 and terminals 117a and 117b of the radio frequency coil 117 extend outward in the radial direction, and the distal ends thereof are bent upward almost at a right angle.

Note that the chamber 110 shown in FIG. 22 is simply illustrated in comparison to the chamber in FIG. 23, and detailed arrangements of the chamber 110 and its peripheral portions are described later with reference to FIG. 23.

Referring back to FIG. 22, reference numeral 121 denotes a control circuit incorporating an oscillation circuit 121a which outputs a 13.56-MHz radio frequency signal. Radio frequency signals output from the oscillation circuit 121a are output to a pair of phase detectors 122a and 122b respectively connected to the output sides of the control circuit 121. The phase detectors 122a and 122b respectively detect the phases of the input radio frequency signals. The input sides of the phase detectors 122a and 122b are connected to the output sides of matching circuits (to be described later), and voltages are applied from the matching circuits to detect the phases.

The output voltages from the phase detectors 122a and 122b are respectively applied to loop filters 123a and 123b, and one input of each of the loop filters 123a and 123b is connected to a corresponding one of the phase detectors 122a and 122b. The control circuit 121 is connected to the other input of each of the loop filters 123a and 123b. Phase difference signals 122c and 122d set in the control circuit are respectively input to the loop filters 123a and 123b. The loop filters 123a and 123b control the outputs from the phase detectors 122a and 122b such that their phases become the same phase set by the phase difference signals.

The outputs from the loop filters 123a and 123b are respectively output to voltage-controlled oscillators (VCO) 124a and 124b, connected to the outputs of the loop filters 123a and 123b, for variably changing oscillating frequencies by the input voltages. The voltage-controlled oscillators 124a and 124b control the oscillating frequencies of their output voltages in accordance with the output voltages.

The voltage-controlled oscillators 124a and 124b are connected to matching circuits 126a and 126b through power amplifiers 125a and 125b. The output terminals of the matching circuits 126a and 126b are connected to terminals 116a and 117a of the first and second one-turn radio frequency coils 116 and 117 through coaxial cables having an impedance of 50Ω. The remaining terminals 116b and 117b of the first and second radio frequency coils 116 and 117 are grounded. The power amplifiers 125a and 125b amplify output powers from the voltage-controlled oscillators 124a and 124b. The amplified output powers are supplied to the first one-turn radio frequency coil 116 and the second one-turn radio frequency coil 117 through the matching circuits 126a and 126b.

Capacitors 127a and 127b are interposed between the terminals of the matching circuits 126a and 126b and the phase detectors 122a and 122b, and output signals from the matching circuits 126a and 126b are also input to the phase detectors 122a and 122b through the capacitors.

The detailed arrangement of the peripheral portions of the chamber 110 will be described below with reference to FIG. 23.

Four legs (only two legs of them are denoted by reference numeral 131a and 131b) are mounted at four corners of the bottom portions of the chamber 110. A non-grounded terminal of a lower power supply 132 is electrically connected to the base 113 through a capacitor 133. An electrostatic chuck is provided on the wafer rest table 114, and the wafer W is chucked and held by the electrostatic chuck. A non-grounded terminal of a DC power supply 143 is connected to an electrode layer of the electrostatic chuck. When a positive voltage is applied to the electrode layer in this manner, a wafer W placed on the electrostatic chuck of the wafer rest table 114 is electrostatically chucked.

A gas inlet pipe 145 air-tightly extends through the upper portion of the side wall of the chamber 110, and a shower head 146 is connected to the inner end of the gas inlet pipe 145. The shower head 146 is constituted by a flat cylindrical member whose inner end communicates with the gas inlet pipe, and a large number of gas supply holes formed in the lower wall of the shower head 146 in a predetermined distribution. A gas discharge pipe 147 is provided to the lower portion of the side wall of the chamber 110.

The lower end portion of a cylindrical casing 148 standing upward is fixed to the upper portion of the side wall of the chamber 110, and a matching box 149 is set at the upper end portion of the casing 148. The matching box 149 houses the matching circuits 126a and 126b in FIG. 22.

The pair of radio frequency coils 116 and 117, and an electromagnetic shield cylinder 150 are placed on the paramagnetic metal 115 in the casing 148. The electromagnetic shield cylinder 150 is grounded and provided to eliminate mutual interference between electric fields of the first one-turn radio frequency coil 116 and the second one-turn radio frequency coil 117.

A control unit 151 is connected to the matching box 149. The control unit 151 includes the control circuit 121, the phase detectors 122a and 122b, the loop filters 123a and 123b, the voltage-controlled oscillators 124a and 124b, and the power amplifiers 125a and 125b.

The first one-turn radio frequency coil 116 and the second one-turn radio frequency coil 117 are formed to have a thickness of 1 to 3 mm and a width of 5 to 15 mm over almost the entire circumference by punching a copper plate, as shown in FIG. 24. These coils can have a rectangular or circular sectional surface in this embodiment, but can have another sectional shape.

The operation of the plasma processing apparatus having the above arrangement will be described below.

The semiconductor wafer W to be processed is placed on the wafer rest table 114, and the interior of the chamber 110 is evacuated to a predetermined vacuum degree through the gas discharge pipe 147 to form a state in which a predetermined process gas (a gas mixture of $C_4F_8$ and $H_2$) is to be supplied into the chamber 110 at a predetermined pressure and flow rate.

In such a state, 13.56-MHz radio frequency signals output from the oscillation circuit 121a are output to the phase detectors 122a and 122b, and the phases of the respective radio frequency signals are detected. The output signals from the matching circuits 126a and 126b are input to the phase detectors 122a and 122b, and the phases of the output signals from the matching circuits 126a and 126b are detected. Radio frequency signals output from the phase detectors 122a and 122b are supplied to the loop filters 123a and 123b. The loop filter 123a and 123b control the input signals so as to obtain a phase difference set by phase difference signals output from the control circuit 121. The outputs from the loop filters 123a and 123b are output to the voltage-controlled oscillators 124a and 124b. The voltage-controlled oscillators 124a and 124b output signals having oscillating frequencies in accordance with the outputs from the loop filters 123a and 123b. The signals output from the voltage-controlled oscillators 124a and 124b are respectively output to the power amplifiers 125a and 125b to amplify powers. The outputs from the power amplifiers 125a and 125b are output to the matching circuits 126a and 126b. The matching circuits 126a and 126b control the phases of the radio frequency voltages to be supplied to the radio frequency coils 116 and 117. For example, the matching circuits 126a and 126b are controlled to output in-phase signals. The in-phase radio frequency voltages are output from the matching circuits 126a and 126b to the radio frequency coils 116 and 117. Ions, electrons, and any other active species contained in a plasma are uniformly supplied and radiated on the entire surface of the semiconductor wafer W, and a predetermined plasma process is uniformly performed on the entire surface of the semiconductor wafer W.

For example, in plasma etching, gas molecules excited by a plasma in an active state chemically react with a material to be processed on the surface of the semiconductor wafer W to etch the material to be processed. In any plasma process, since a plasma operates on the entire surface of the semiconductor wafer W at a uniform density in this plasma processing apparatus, a uniform process is performed on the surface of the wafer W.

According to the plasma processing apparatus of the above embodiment, the phases of the radio frequency signals to be supplied to the first one-turn radio frequency coil 116 and the second one-turn radio frequency coil 117 are controlled to be the same. Therefore, load matching can be improved, and the plasma can be efficiently generated in the chamber 110.

Since the gas mixture of $C_4F_8$ and $H_2$ as a process gas is supplied into the chamber 110, an appropriate etching rate, i.e., an etching rate of 5,500 Å/min, can be obtained.

Still another embodiment of the present invention will be described with reference to FIG. 26.

In the embodiment shown in FIG. 22, the phases of the outputs from the matching circuits 126a and 126b are detected and controlled to be the same, thereby uniformly generating a plasma. In this embodiment, reflected powers from matching circuits 126a and 126b are detected, and the phases of radio frequency voltage signals are controlled so as to decrease the reflected powers.

Figure 26:
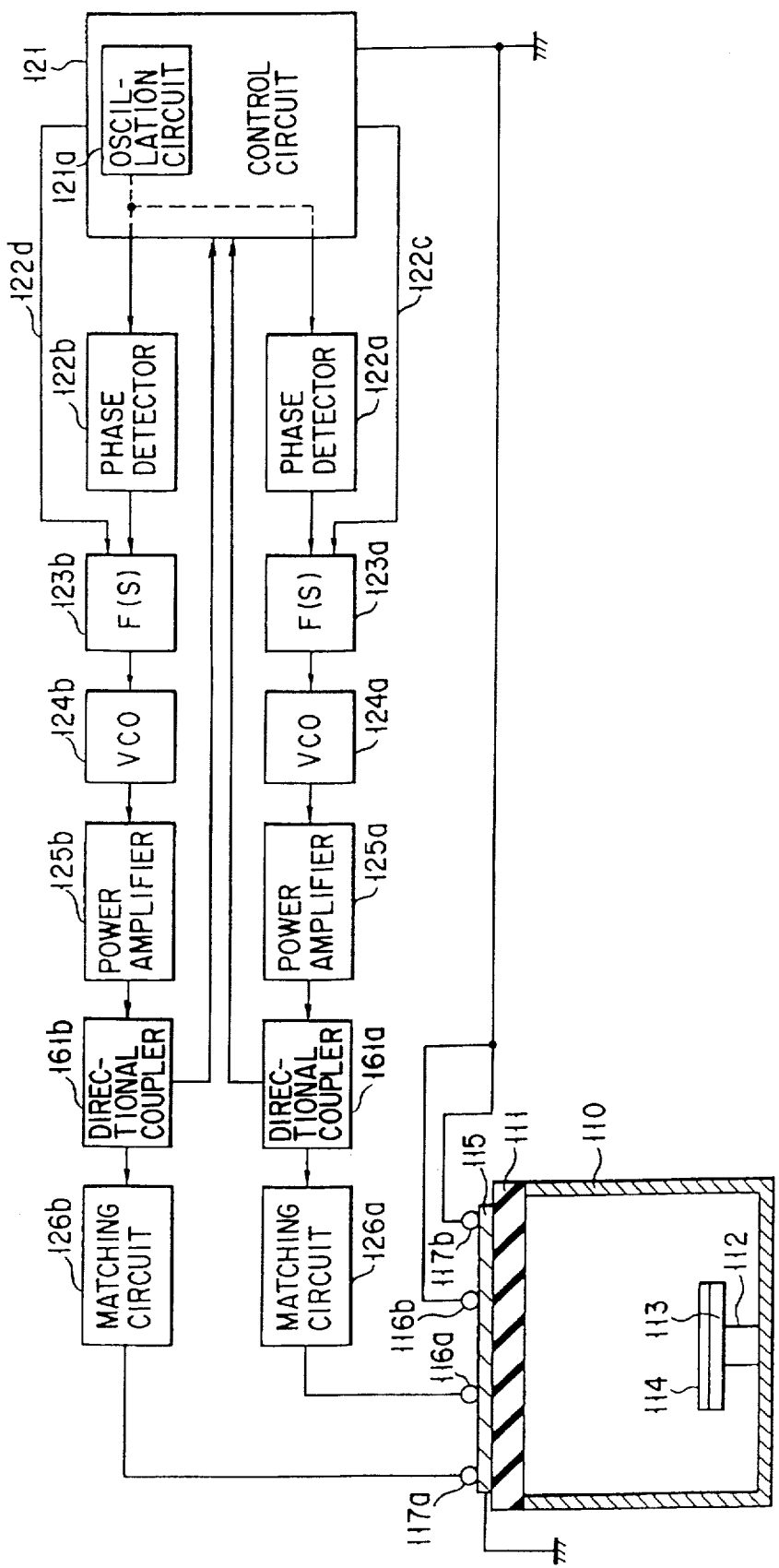
FIG. 26 is a control block diagram showing a coil division type plasma generating apparatus according to still another embodiment.

Referring to FIG. 26, directional couplers 161a and 161b for outputting reflected powers to a control circuit 121 are connected between the matching circuits 126a and 126b and power amplifiers 125a and 125b, respectively. The control circuit 121 outputs phase difference signals to loop filters 123a and 123b so as to minimize the reflected powers to be input.

The operation of the embodiment shown in FIG. 26 and having the above arrangement will be described below. A semiconductor wafer W to be processed is placed on a wafer rest table 114, and the interior of a chamber 110 is evacuated to a predetermined vacuum degree through a gas discharge pipe 147 to form a state in which a predetermined process gas is to be supplied into the chamber 110 at a predetermined pressure and flow rate.

In such a state, 13.56-MHz radio frequency signals output from an oscillation circuit 121a are output to phase detectors 122a and 122b, and the phases of the respective radio frequency signals are detected. The output signals from the matching circuits 126a and 126b are input to the phase detectors 122a and 122b, and the phases of the output signals from the matching circuits 126a and 126b are detected. Radio frequency signals output from the phase detectors 122a and 122b are supplied to the loop filters 123a and 123b. The loop filters 123a and 123b control the input signals so as to obtain the phase difference set by phase difference signals output from the control circuit 121. The phase difference signals are set so as to minimize the reflected powers. The outputs from the loop filters 123a and 123b are output to voltage-controlled oscillators 124a and 124b. The voltage-controlled oscillators 124a and 124b output signals having oscillating frequencies in accordance with the outputs from the loop filters 123a and 123b. The signals output from the voltage-controlled oscillators 124a and 124b are output to the power amplifiers 125a and 125b to amplify powers. The amplified output powers are output to the matching circuits 126a and 126b. The matching circuits 126a and 126b control the phases of the radio frequency voltages to be supplied to the radio frequency coils 116 and 117. For example, the matching circuits 126a and 126b are controlled to output in-phase signals. The in-phase radio frequency voltages are output from both the matching circuits 126a and 126b to the radio frequency coils 116 and 117.

Ions, electrons, and any other active species contained in a plasma are uniformly supplied and radiated on the entire surface of the semiconductor wafer W, and a predetermined plasma process is uniformly performed on the entire surface of the semiconductor wafer W.

For example, in plasma etching, gas molecules excited by a plasma in an active state chemically react with a material to be processed on the surface of the semiconductor wafer W, and a solid reaction product is deposited on the surface of the wafer to form a film. In any plasma process, since a plasma acts on the entire surface of the semiconductor wafer W at a uniform density in this plasma processing apparatus of the present invention, a uniform process is performed on the surface of the wafer W.

According to this embodiment, the phases of the radio frequency signals to be supplied to the first one-turn radio frequency coil 116 and the second one-turn radio frequency coil 117 are controlled so as to minimize reflected powers from the first one-turn radio frequency coil 116 and the second one-turn radio frequency coil 117. Therefore, load matching can be improved, and the plasma can be efficiently generated in the chamber 110.

Still another embodiment of the present invention will be described with reference to FIG. 27.

Figure 27:
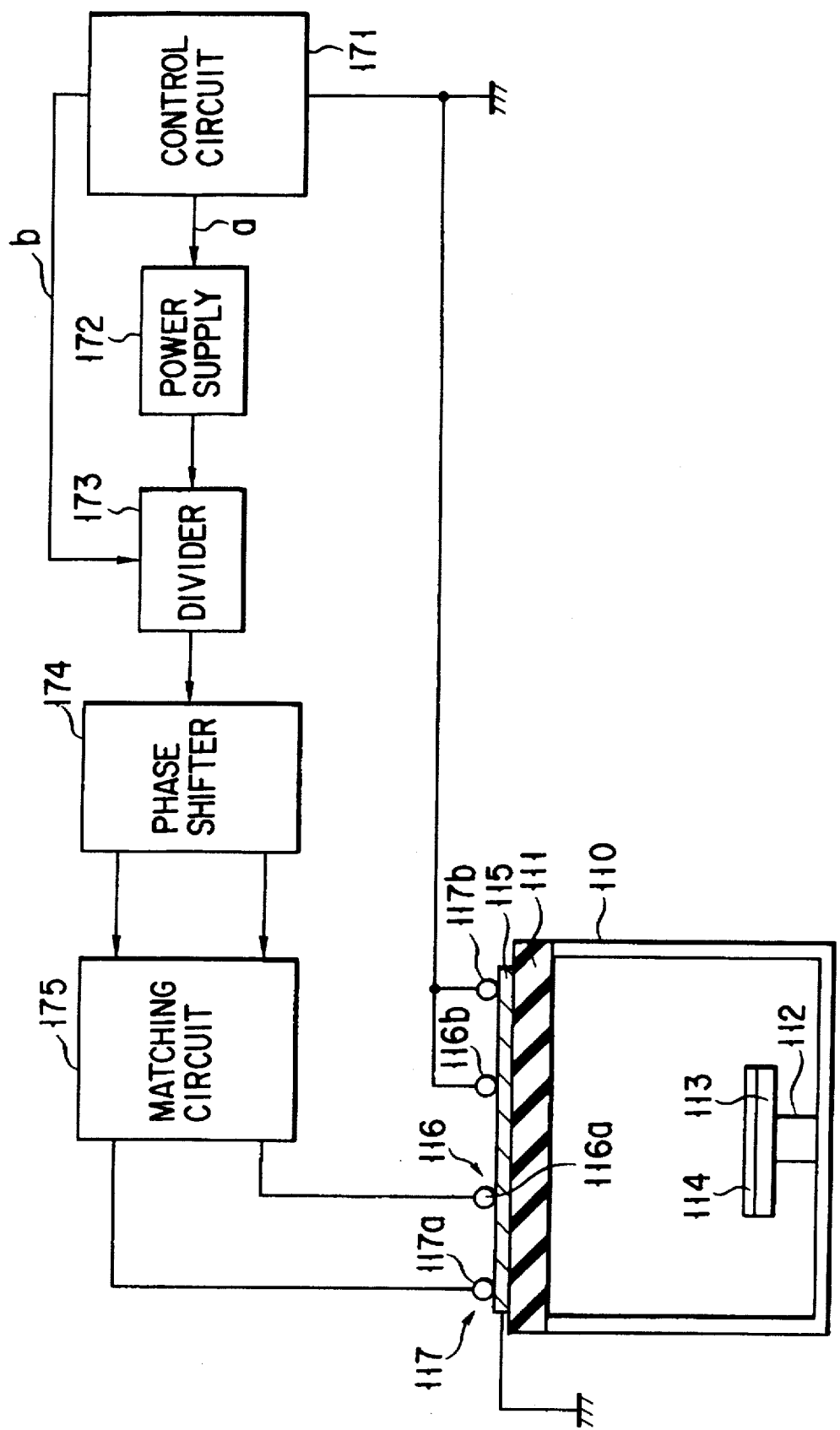
FIG. 27 is a control block diagram showing a coil division type plasma generating apparatus according to still another embodiment.

Referring to FIG. 27, a control circuit 171 outputs an electric energy signal a representing a total electric energy to a load to a power supply 172 in accordance with a process recipe. At the same time, the control circuit 171 outputs a power division ratio b to a divider 173. This power division ratio b is variable within the range of 10% to 90%. The power supply 172 outputs a 13.56-MHz radio frequency power corresponding to the input electric energy signal a to the divider 173. This divider 173 divides the radio frequency power from the power supply 172 at the above power division ratio. The divided powers are supplied from the divider 173 to a phase shifter 174. The phase shifter 174 receives signals from the two output stages of a matching circuit 175 (to be described later) and detect the phases of these input signals. The phase shifter 174 adjusts the phase of the radio frequency power Output from the divider 173 such that the signals from the two output stages of the matching circuit 175 have predetermined phases, respectively. The phase-adjusted radio frequency power is output to the matching circuit 175. The two radio frequency powers output through the matching circuit 175 are output to a first one-turn radio frequency coil 116 and a second radio frequency coil 117.

The operation of the embodiment having the above arrangement will be described below. The control circuit 171 outputs the signals a and b to instruct the total electric energy and the power division ratio to the load in accordance with the process recipe.

The power supply 172 outputs the 13.56-MHz radio frequency power corresponding to the input electric energy signal a to the divider 173. The divider 173 divides the input radio frequency power at the input power division ratio b, and the divided powers are output to the phase shifter 174. The phase shifter 174 adjusts the phases of the radio frequency powers from the divider 173 such that the phases of signals from the output stages of the matching circuit 175 are set to predetermined phases, respectively. The phase shifter 174 outputs the phase-adjusted radio frequency power to the matching circuit 175. In this manner, the two outputs from the matching circuit 175 are supplied to the radio frequency coils 116 and 117, respectively.

Ions, electrons, and any other active species contained in the plasma are uniformly supplied and radiated on the entire surface of the semiconductor wafer, and a predetermined plasma process is performed on the entire surface of the wafer.

As described above, according to this embodiment, the radio frequency power output from the radio frequency power supply is divided, and the divided powers are supplied to the two radio frequency coils. The phases of the radio frequency voltage signals applied to the radio frequency coils can be adjusted to have a predetermined phase difference. Therefore, load matching can be improved, and the plasma can be efficiently generated in a chamber 110.

Figure 28:
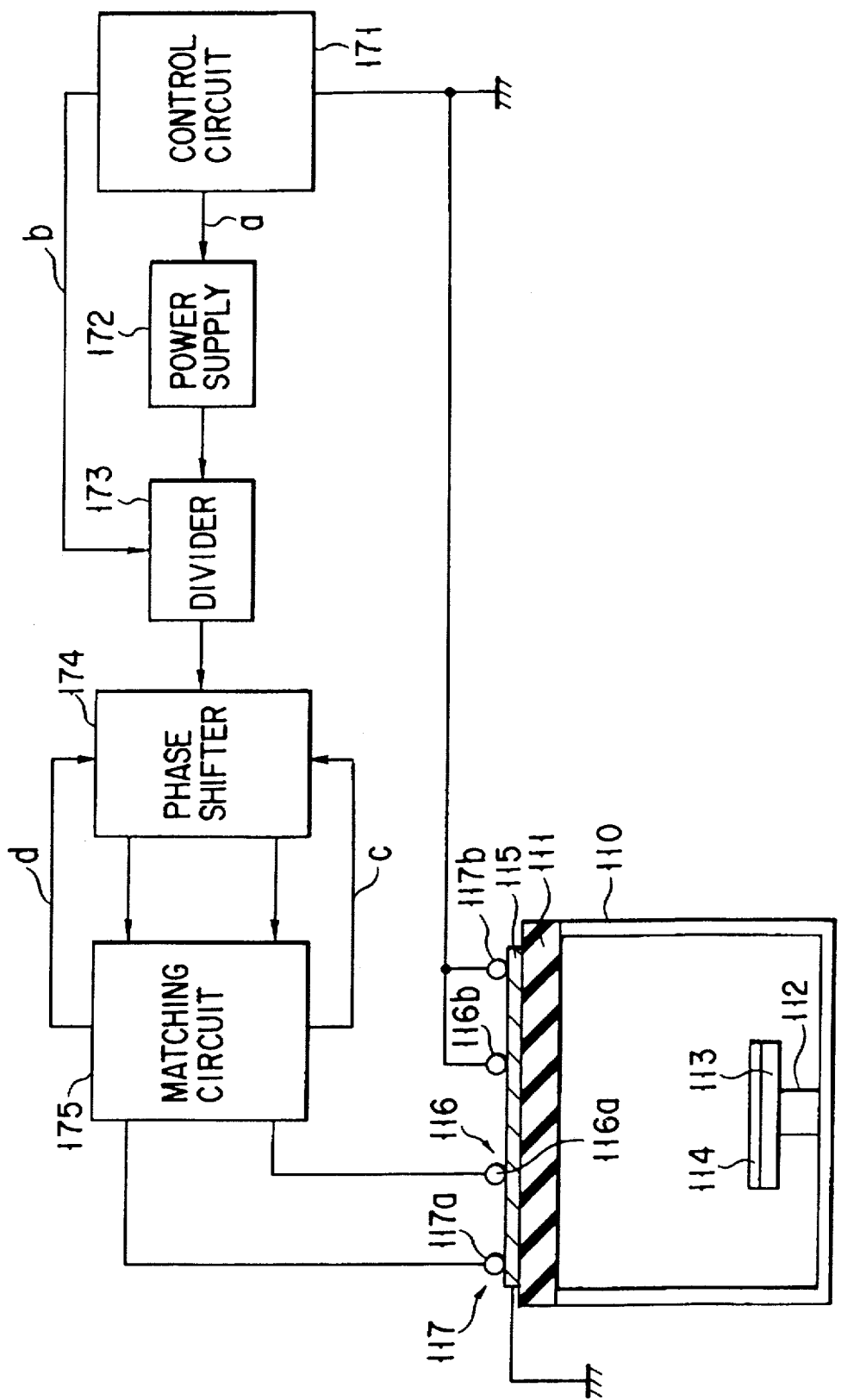
FIG. 28 is a control block diagram showing a coil division type plasma generating apparatus according to still another embodiment.

Still another embodiment will be described with reference to FIG. 28.

In addition to the operations of the apparatus shown in FIG. 27, a matching circuit 175 measures two reflected powers and outputs reflected power signals c and d to a phase shifter 174. The phase shifter 174 adjusts the phases of these two reflected powers such that input reflected power signals c and d are minimized.

The operation of the embodiment having the above arrangement will be described below. A control circuit 171 outputs signals a and b to instruct a total electric energy and a division ratio to a load in accordance with a process recipe. A power supply 172 outputs a 13.56-MHz radio frequency power corresponding to the input electric energy signal a to a divider 173. The divider 173 divides the input radio frequency power at the input power division ratio b, and the divided powers are output to the phase shifter 174. The phase shifter 174 adjusts the two phases of two reflected power signals c and d output from the matching circuit 175 such that the reflected power signals are minimized. The two radio frequency powers output through the matching circuit 175 are output to the first one-turn radio frequency coil 116 and the second one-turn radio frequency coil 117.

The operation of the embodiment having the above arrangement will be described below. The control circuit 171 outputs the signals a and b to instruct the total electric energy and the division ratio to the load in accordance with the process recipe. The power supply 172 outputs the 13.56-MHz radio frequency power corresponding to the input electric energy signal a to the divider 173. The divider 173 divides the input radio frequency power at the input power division ratio b, and the divided powers are output to the phase shifter 174. The phase shifter 174 adjusts the two phases of the two reflected power signals c and d output from the matching circuit 175 such that the reflected power signals are minimized.

The two radio frequency powers output through the matching circuit 175 are output to the first one-turn radio frequency coil 116 and the second one-turn radio frequency coil 117.

Ions, electrons, and any other active species contained in the plasma are uniformly supplied and radiated on the entire surface of the semiconductor wafer, and a predetermined plasma process is performed on the entire surface of the wafer.

As described above, according to this embodiment, the radio frequency power output from the radio frequency power supply is divided, and the divided powers are supplied to the two radio frequency coils. The phases of the radio frequency voltage signals from the radio frequency coils can be adjusted such that reflected power energies are minimized. Therefore, load matching can be improved, and the plasma can be efficiently generated in a chamber 110.

Still another embodiment will be described with reference to FIG. 29.

Radio frequency voltage signals from two output stages of a matching circuit 175 are fed back to a control circuit 171, and the control circuit 171 detects the phases of these radio frequency voltage signals. The control signal 171 outputs phase difference signals e and f to a phase shifter 174 such that the input radio frequency voltage signals have predetermined phases, respectively. The phase shifter 174 adjusts the phases of the two radio frequency powers output from a divider 173 to the phases corresponding to the phase difference signals e and f. The phase-adjusted signals are output to the matching circuit 175.

The operation of the embodiment having the above arrangement will be described below. A control circuit 171 outputs signals a and b to instruct a total electric energy and a division ratio to a load in accordance with a process recipe. A power supply 172 outputs a 13.56-MHz radio frequency power corresponding to the input electric energy signal a to a divider 173. The divider 173 divides the input radio frequency power at the input division ratio b, and the divided powers are output to the phase shifter 174. The radio frequency voltage signals from the two output stages of the matching circuit 175 are fed back to the control circuit 171, and the control circuit 171 detects the phases of these voltage signals. The control circuit 171 outputs the phase difference signals e and f to the phase shifter 174 such that the input radio frequency voltage signals have predetermined phases. The phase shifter 174 adjusts the two phases of the radio frequency powers output from the divider 173 to the phases corresponding to the phase difference signals e and f. The phase-adjusted signals are output to the matching circuit 175. In this manner, the two outputs from the matching circuit 175 are supplied to the first one-turn radio frequency coil 116 and the second one-turn radio frequency coil 117.

Ions, electrons, and any other active species contained in the plasma are uniformly supplied and radiated on the entire surface of the semiconductor wafer, and a predetermined plasma process is performed on the entire surface of the wafer.

As described above, according to the embodiment shown in FIG. 29, the radio frequency power output from the radio frequency power supply is divided, and the divided powers are supplied to the two radio frequency coils. The phases of the radio frequency voltage signals supplied to the radio frequency coils are detected at the control circuit, and the phase difference is adjusted to a predetermined phase difference. Therefore, load matching can be improved, and the plasma can be efficiently generated in a chamber 110.

Figure 30:
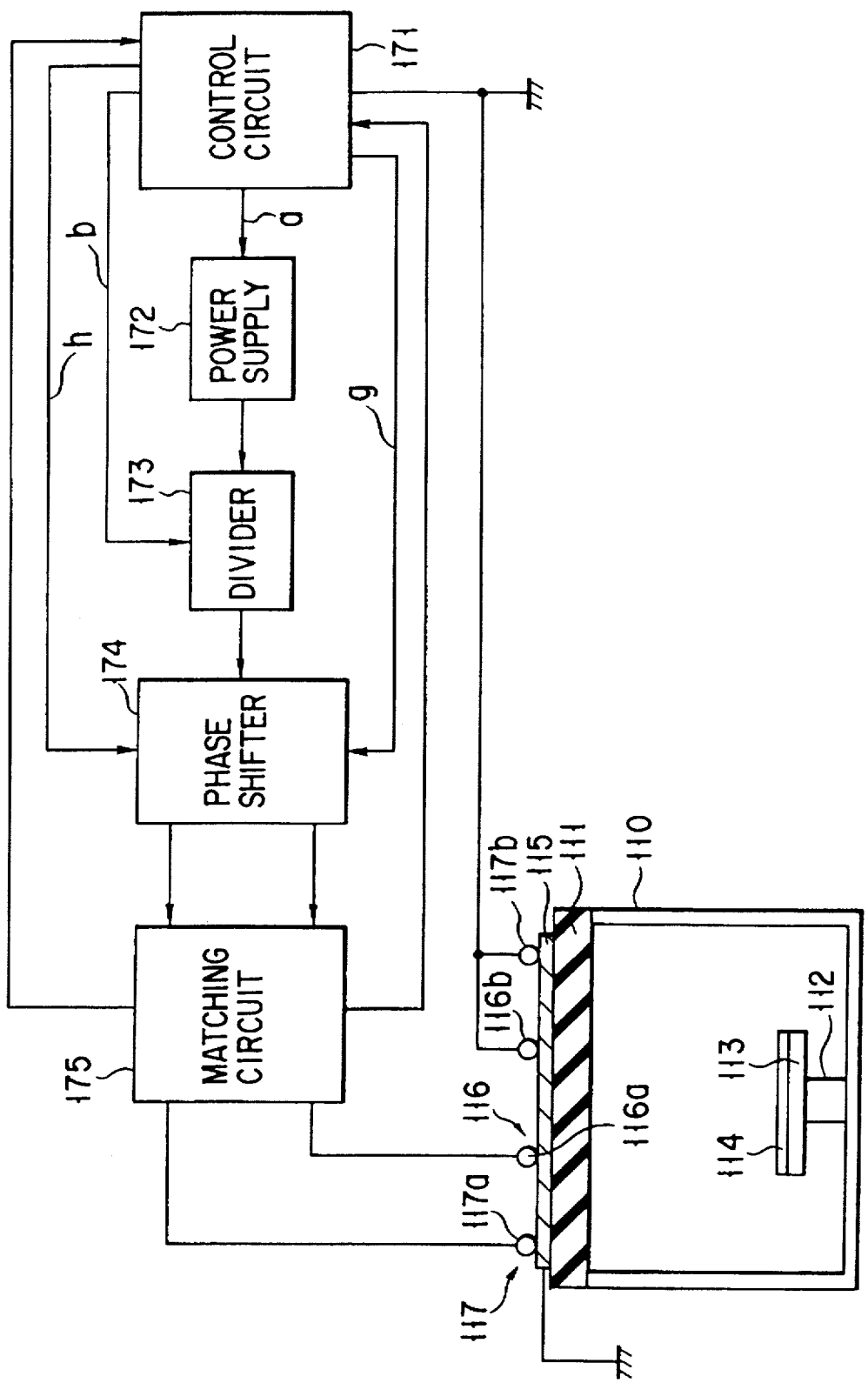
FIG. 30 is a control block diagram showing a coil division type plasma generating apparatus according to still another embodiment.

Still another embodiment will be described with reference to FIG. 30.

Figure 29:
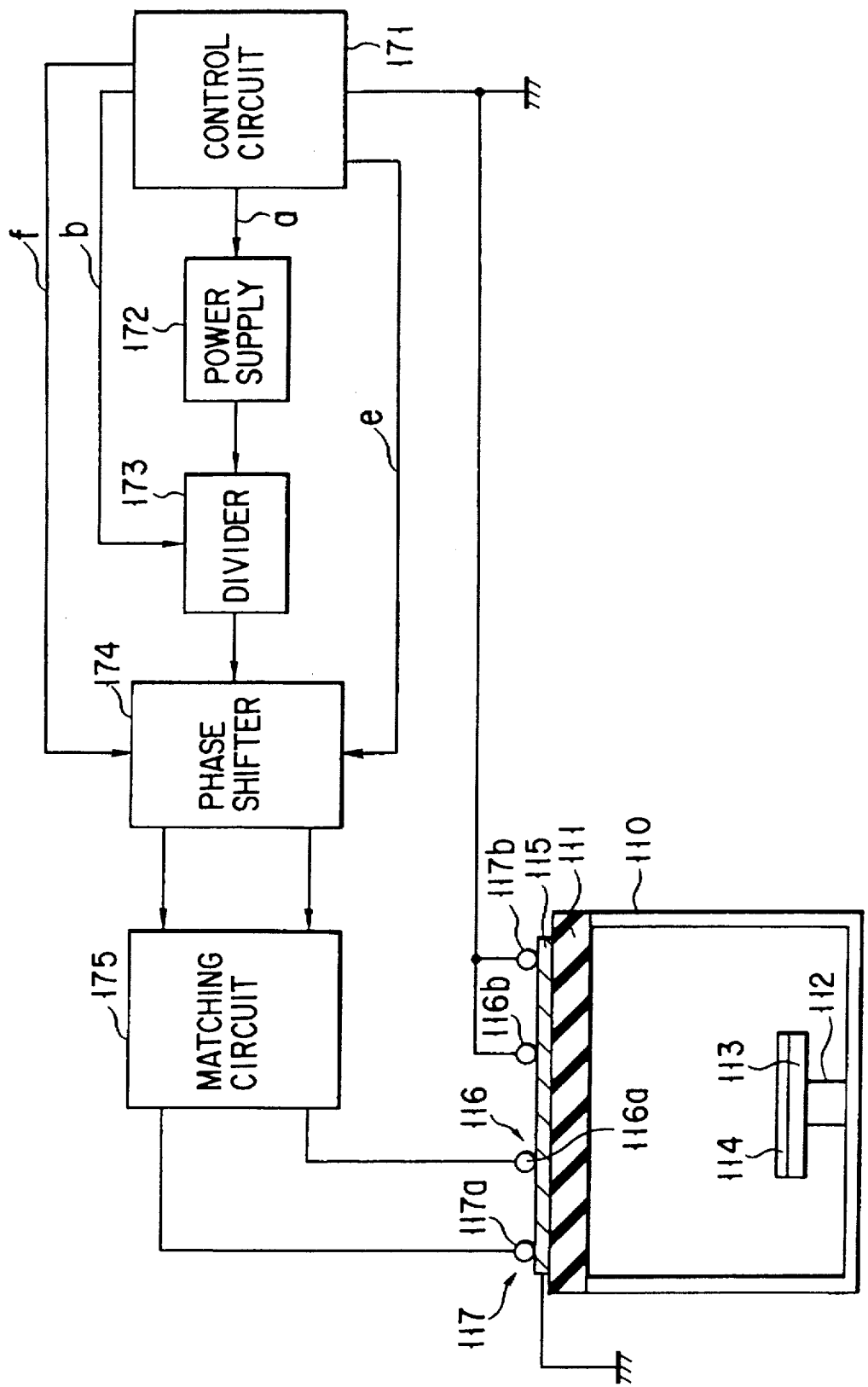
FIG. 29 is a control block diagram showing a coil division type plasma generating apparatus according to still another embodiment.

In addition to the operations of the apparatus shown in FIG. 29, two reflected powers are input to a control circuit 171 through a matching circuit 175. The control circuit 171 determines a phase difference such that the respective reflected powers are minimized, and outputs phase difference signals g and h to a phase shifter 174.

The operation of the embodiment having the above arrangement will be described below. The control circuit 171 outputs signals a and b to instruct a total electric energy and a division ratio to a load in accordance with a process recipe. A power supply 172 outputs a 13.56-MHz radio frequency power corresponding to the input electric energy signal a to a divider 173. The divider 173 divides the input radio frequency power at the input division ratio b, and the divided powers are output to the phase shifter 174. The two reflected powers from the matching circuit 175 are output to the control circuit 171. The control circuit 171 determines the phase difference such that the respective reflected powers are minimized, and outputs the phase difference signals g and h to the phase shifter 174.

The phase shifter 174 adjusts the phases of two radio frequency powers output from the divider 173 to the phases corresponding to the phase difference signals g and h. The phase-adjusted signals are output to the matching circuit 175. In this manner, the two outputs from the matching circuit 175 are supplied to radio frequency coils 116 and 117.

Ions, electrons, and any other active species contained in the plasma are uniformly supplied and radiated on the entire surface of the semiconductor wafer, and a predetermined plasma process is performed on the entire surface of the wafer.

As described above, according to the embodiment shown in FIG. 30, the radio frequency power output from the radio frequency power supply is divided, and the divided powers are supplied to the two radio frequency coils. The reflected powers from the radio frequency coils are detected, and the phase difference of the radio frequency voltages to be supplied to the radio frequency coils are adjusted such that the reflected powers are minimized. Therefore, load matching can be improved, and the plasma can be efficiently generated in a chamber 110.

Still another embodiment will be described with reference to FIGS. 31 to 36. The arrangement of a chamber 110 in FIG. 31 will be described follow.

A gas mixture of $C_4F_8$ and $H_2$ as a process gas is supplied into the chamber 110. The gas mixture is supplied through a gas inlet pipe 147 in FIG. 23. As shown in FIG. 23, a lower power supply 132 supplies a radio frequency power of 10 kHz to 100 MHz. A pressure sensor 181 for detecting the pressure in the chamber 110 is provided to the chamber 110. A control circuit 171 incorporates a radio frequency power supply section 182, and controls a total electric energy to a load to the radio frequency power supply section 182 in accordance with a process recipe. At the same time, the control circuit 171 outputs a power division ratio b to a divider 173. The radio frequency power supply section 182 outputs a 13.56-MHz radio frequency power to a divider 173. The control circuit 171 outputs the division ratio b to the divider 173 which divides the radio frequency power from the radio frequency power supply section 182 into two powers. This power division ratio b is variable within the range of 10% to 90%. This divider 173 divides the radio frequency power from the power supply section 182 at the above power division ratio b. The divided powers are output to a phase shifter 174. The phase shifter 174 receives signals from the output stages of matching circuits 175a and 175b (to be described later) and detect the phases of these input signals. The phase shifter 174 adjusts the phases of the radio frequency powers output from the divider 173 such that the signals from the respective output stages of the matching circuits 175a and 175b have predetermined phases, respectively. The phase-adjusted radio frequency powers are output to the matching circuits 175a and 175b, respectively. The radio frequency powers output through the matching circuits 175a and 175b are output to a first radio frequency coil 116 and a second radio frequency coil 117.

The control circuit 171 sequentially determines the division ratio b in accordance with the pressure in the chamber 110 detected by the pressure sensor 181 during a process. At this time, the division ratio b in constantly adjusted such that a plasma generated in the chamber 110 is almost uniform in the radial direction of a wafer placed on a wafer rest table 114 regardless of the pressure in the chamber 110.

Figure 31:
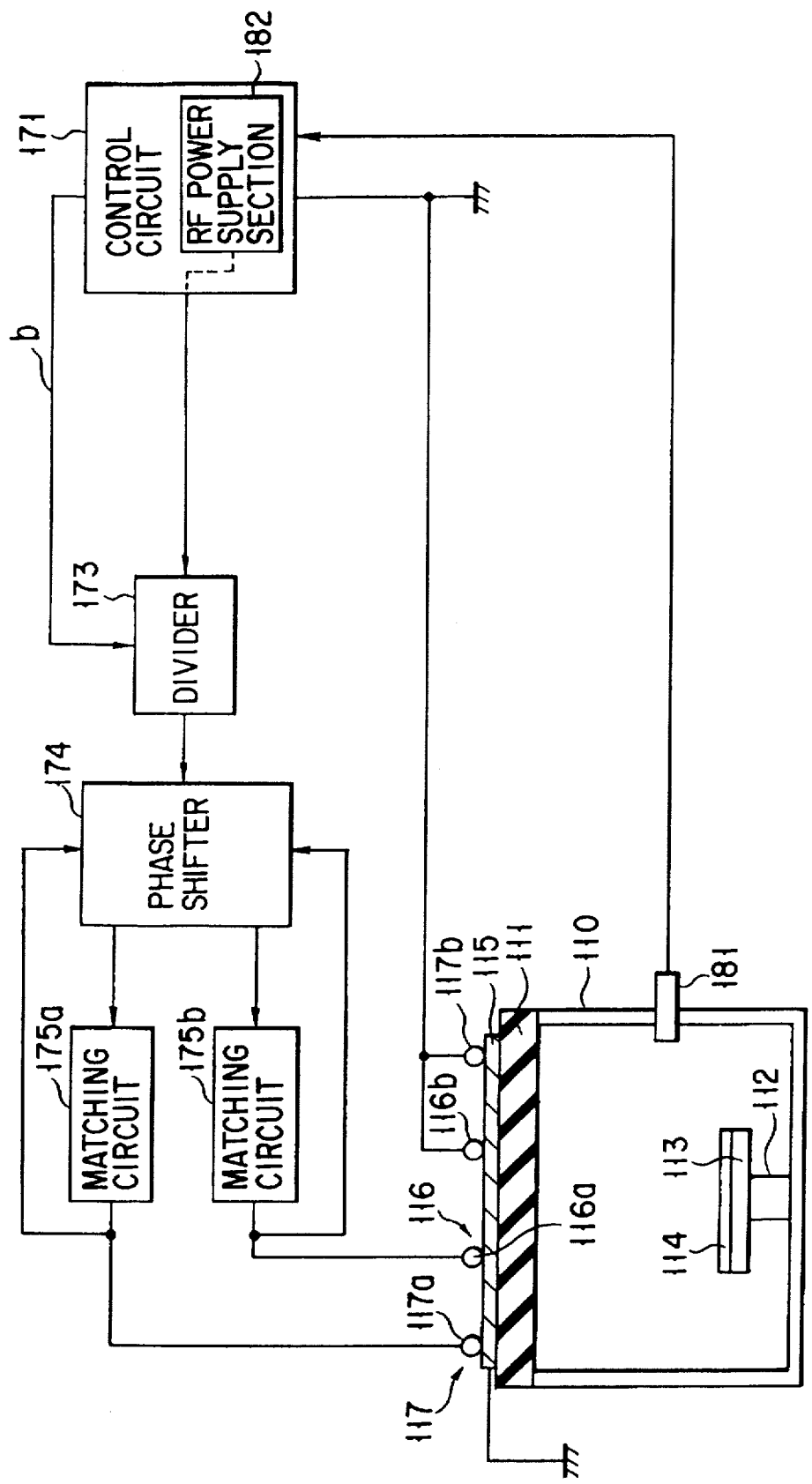
FIG. 31 is a control block diagram showing a coil division type plasma generating apparatus according to still another embodiment.

The operation of the embodiment shown in FIG. 31 having the above arrangement will be described below.

The control circuit 171 sequentially adjusts the division ratio b in correspondence to the total electric energy to the load in accordance with the process recipe and the constantly changing pressure in the chamber 110 detected by the pressure sensor 181. The divider 173 divides the input radio frequency power into two powers at the input power division ratio b, and the divided powers are output to the phase shifter 174. The phase shifter 174 adjusts the phases of the two radio frequency powers from the divider 173 such that the phases of the output stages of the matching circuits 175a and 175b are set to predetermined phases, respectively. The phase shifter 174 outputs the phase-adjusted radio frequency powers to the matching circuits 175a and 175b. In this manner, the two outputs from the matching circuits 175a and 175b are supplied to the radio frequency coils 116 and 117, respectively.

Ions, electrons, and any other active species contained in the plasma are uniformly supplied and radiated on the entire surface of the semiconductor wafer, and a predetermined plasma process is performed on the entire surface of the wafer.

FIGS. 32 to 35 are graphs showing that the distributions of the ion saturation currents in the radial directions of wafers can be changed by changing the power ratio of powers supplied to the inner coil 116 and the outer coil 117, which are obtained by experiments. In this experimental apparatus, both the coils 116 and 117 are formed by bending a steel pipe having an outer diameter of 6.35 mm. The central diameter of the inner coil 116 is 115 mm, and that of the outer coil 117 is 265 mm. An insulating member 111 has a thickness of 30 mm, and an interval between the insulating member and the wafer is about 20 to 25 mm. A total radio frequency power to be applied to both the coils is about 1 kW. Referring to FIGS. 32 to 35, a radial position "0" represents the center of a wafer, a radial position "−7.5 cm" represents a position on the circumference of a 6" wafer, and a radial position "−10 cm" represents a position on the outer circumference of a 10" wafer.

Figure 32:
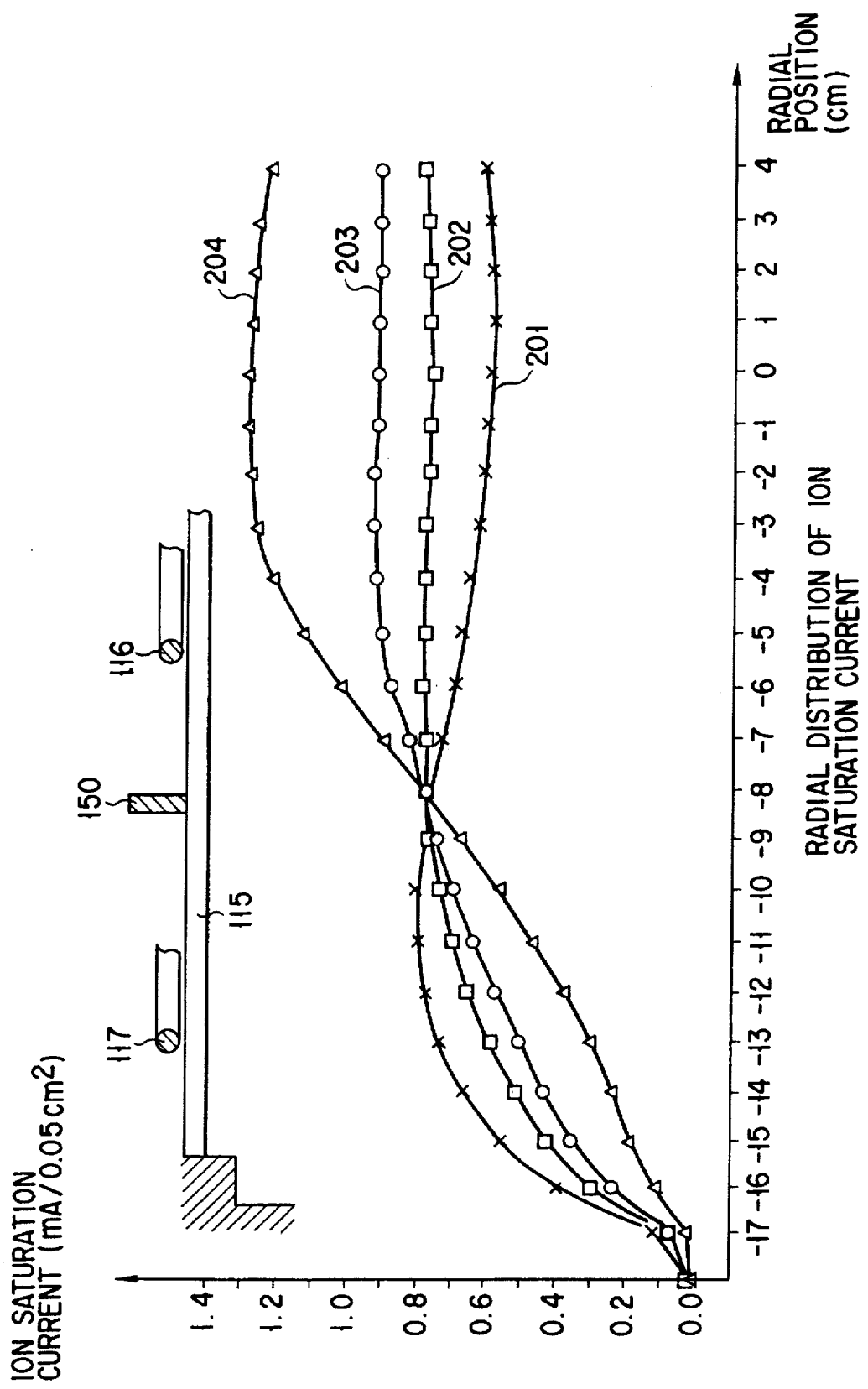
FIGS. 32 to 34 are graphs showing measurement results of the distributions of the ion saturation currents in the radial directions when a supply power ratio to divided coils is changed, and the pressures in a processing chamber are respectively set at 5 mTorr, 10 mTorr, and 30 mTorr.
Figure 33:
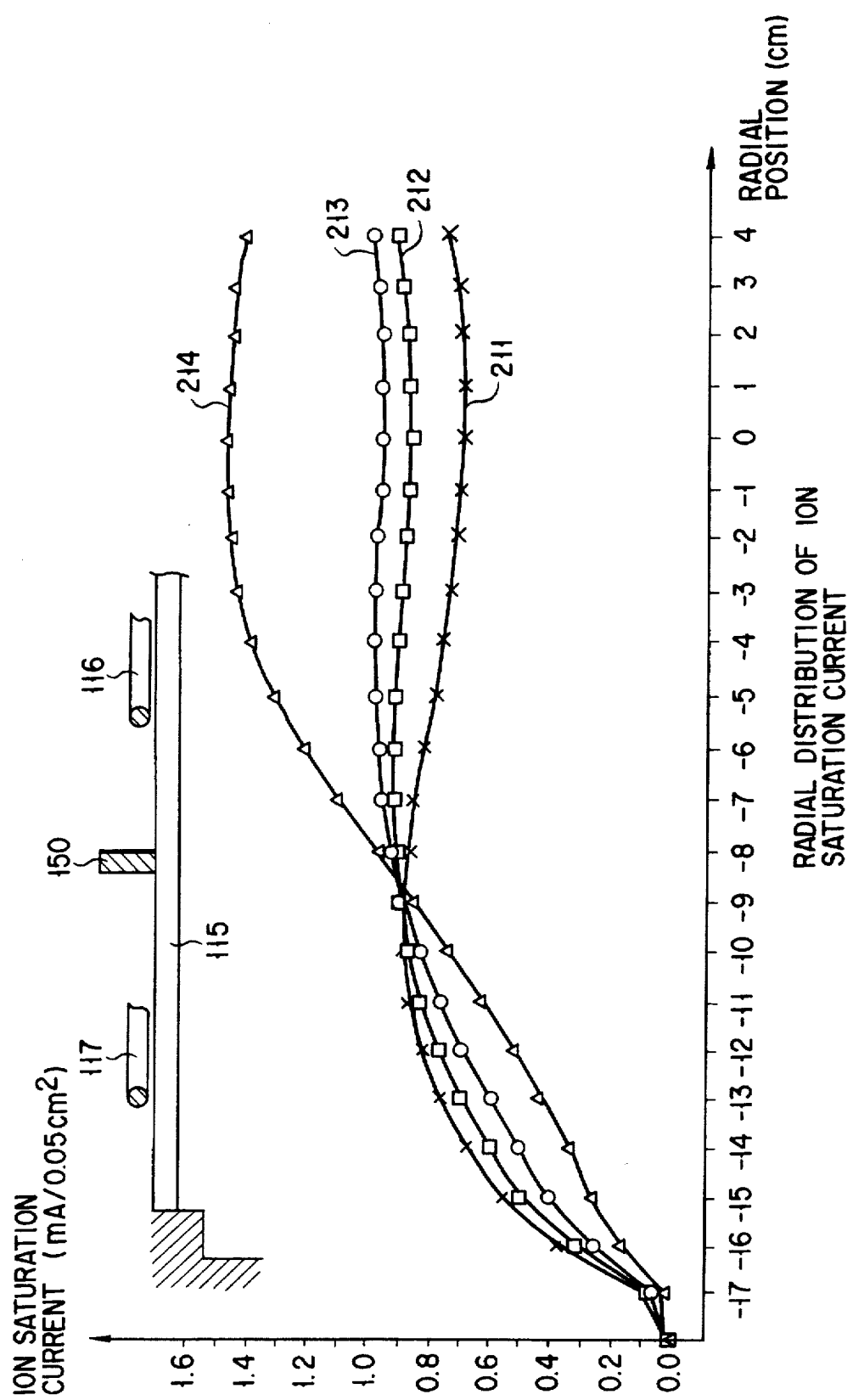
Figure 34:
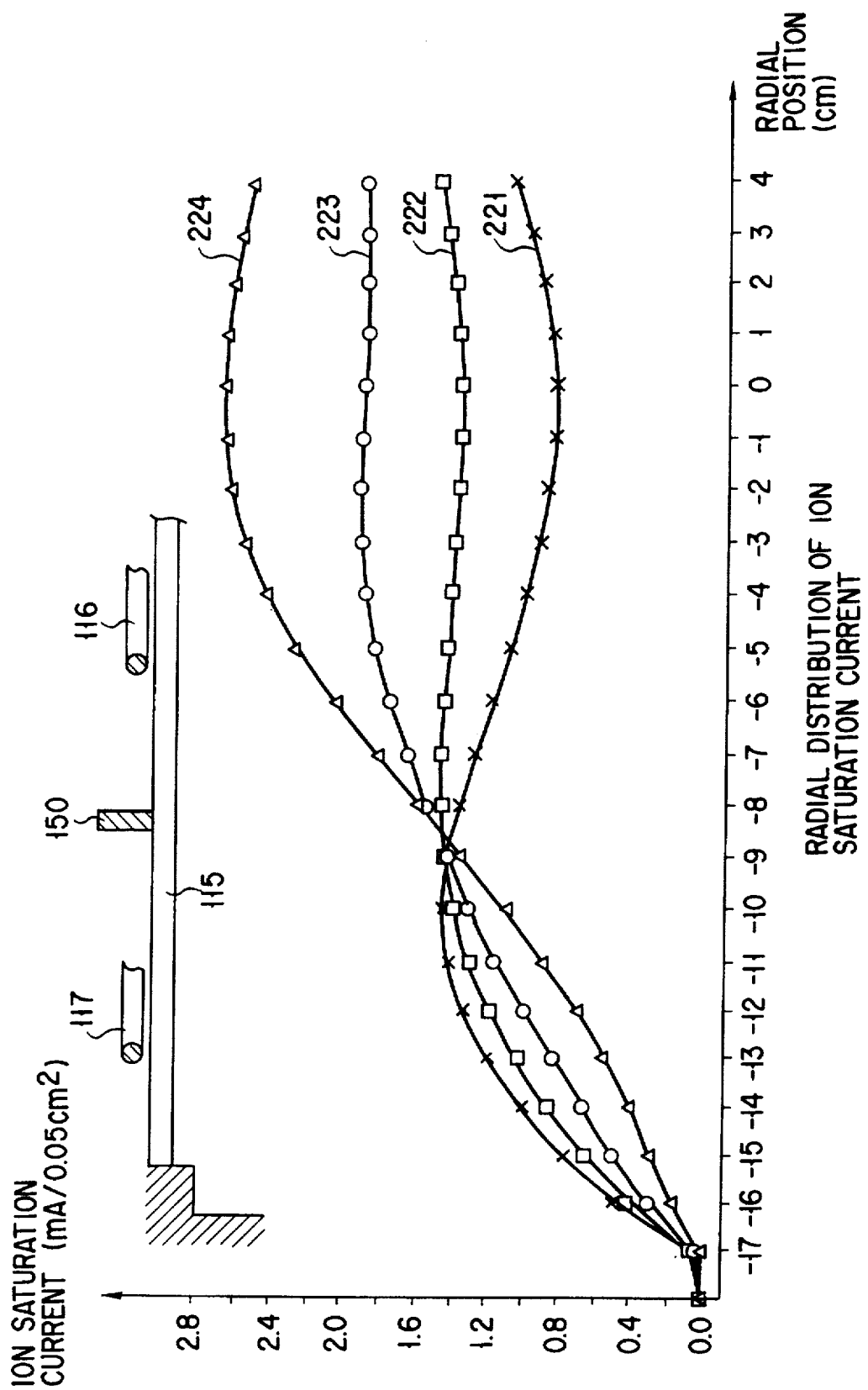

FIG. 32 shows the case in which the pressure in the chamber is 5 mTorr, FIG. 33 shows the case in which the pressure in the chamber is 10 mTorr, and FIG. 34 shows the case in which the pressure in the chamber is 30 mTorr. Referring to FIG. 32, a curve denoted by reference numeral 200 is obtained when a power of 100 W and that of 900 W are applied to the inner coil 116 and the outer coil 117, respectively. A curve denoted by reference numeral 201 is obtained when a power of 200 W and that of 800 W are applied to the inner coil 116 and the outer coil 117, respectively. A curve denoted by reference numeral 202 is obtained when a power of 500 W and that of 500 W are applied to the inner coil 116 and the outer coil 117, respectively. A curve denoted by reference numeral 204 is obtained when a power of 900 W and that of 100 W are applied to the inner coil 116 and the outer coil 117, respectively. Referring to FIG. 33, a curve denoted by reference numeral 210 is obtained when a power of 100 W and that of 900 W are applied to the inner coil 116 and the outer coil 117, respectively. A curve denoted by reference numeral 211 is obtained when a power of 200 W and that of 800 W are applied to the inner coil 116 and the outer coil 117, respectively. A curve denoted by reference numeral 212 is obtained when a power of 300 W and that of 700 W are applied to the inner coil 116 and the outer coil 117, respectively. A curve denoted by reference numeral 214 is obtained when a power of 700 W and that of 300 W are applied to the inner coil 116 and the outer coil 117, respectively. Referring to FIG. 34, a curve denoted by reference numeral 220 is obtained when a power of 100 W and that of 900 W are applied to the inner coil 116 and the outer coil 117, respectively. A curve denoted by reference numeral 221 is obtained when a power of 250 W and that of 750 W are applied to the inner coil 116 and the outer coil 117, respectively. A curve denoted by reference numeral 222 is obtained when a power of 400 W and that of 600 W are applied to the inner coil 116 and the outer coil 117, respectively. A curve denoted by reference numeral 224 is obtained when a power of 700 W and that of 300 W are applied to the inner coil 116 and the outer coil 117, respectively.

Judging from these measurement results, the following facts are found. When the power ratio of the power supplied to inner coil is increased regardless of the pressure in the chamber, the ion saturation current value at the central portion (i.e., a radial position "0") of the wafer can be preferably increased. The radial uniformity of the ion saturation current is degraded at an excessively low or high power ratio. To obtain a good uniformity, a power of 200 to 500 W is preferably supplied to the inner coil 116. That is, the supply power ratio of the inner coil 116 to the outer coil 117 is preferably set to 2:8 to 5:5.

Figure 35:
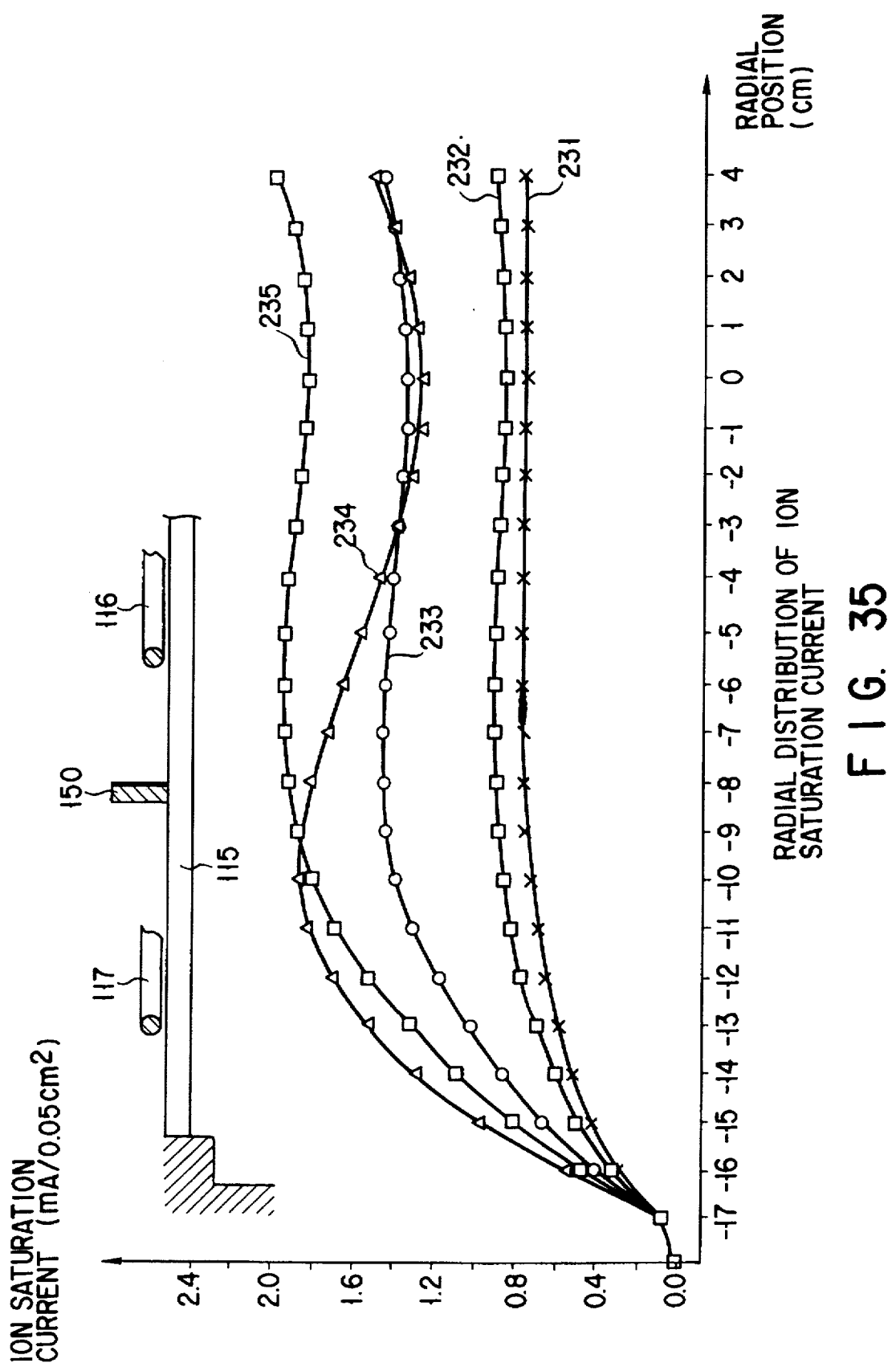
FIG. 35 is a graph showing the distributions of the ion saturation currents in the radial directions when a supply power ratio or a pressure is changed in the embodiment shown in FIG. 31.

FIG. 35 is a graph showing that the distributions of the ion saturation currents in the radial direction of wafers can be changed by changing the power ratio of powers supplied to the inner coil 116 and the outer coil 117, or changing the pressure in the chamber 110, which are obtained by experiments.

Referring to FIG. 35, a curve denoted by reference numeral 230 is obtained when a power of 200 W and that of 800 W are applied to the inner coil 116 and the outer coil 117 at a pressure of 5 mTorr, respectively. A curve denoted by reference numeral 231 is obtained when a power of 200 W and that of 800 W are applied to the inner coil 116 and the outer coil 117 at a pressure of 10 mTorr, respectively. A curve denoted by reference numeral 232 is obtained when a power of 250 W and that of 750 W are applied to the inner coil 116 and the outer coil 117 at a pressure of 30 mTorr, respectively. A curve denoted by reference numeral 234 is obtained when a power of 200 W and that of 800 W are applied to the inner coil 116 and the outer coil 117 at a pressure of 50 mTorr, respectively. A curve denoted by reference numeral 235 is obtained when a power of 300 W and that of 700 W are applied to the inner coil 116 and the outer coil 117 at a pressure of 50 mTorr, respectively.

Judging from these results, the following facts are found. When the pressure is increased, the ion saturation current increases, and the radial distribution of the ion saturation current is also improved.

The power ratio is adjusted to uniform the ion saturation current on the wafer. A gas mixture of $C_4F_8$ and $H_2$ as a process gas is supplied into a chamber 110. A lower power supply supplies a radio frequency power of 10 kHz to 100 MHz (preferably 400 kHz to 2 MHz). As shown in FIG. 36, when an $SiO_2$ film I formed on a wafer W is etched through a resist R, the etching rate is 500 Å/min or more, and a high selectivity of about 20 with the resist R can be obtained. Such a numerical value was found from an electrophotograph.

As described above, according to the coil division type plasma processing apparatus shown in FIGS. 22 to 31, the radio frequency power output from the radio frequency power supply is divided into two powers, and the division ratio b is adjusted in accordance with the pressure in the chamber 110 to substantially uniform a plasma generated in the chamber 110 in the radial direction of the wafer placed on the wafer rest table 114 regardless of the pressure in the chamber 110. Therefore, the pressure dependency of the density of the generated plasma in the chamber 110 in the radial direction of the wafer can be eliminated.

The gas mixture of $C_4F_8$ and $H_2$ is supplied into the chamber. The lower power supply supplies the radio frequency power of 10 kHz to 100 MHz (preferably 400 kHz to 2 MHz). An etching rate used when the $SiO_2$ film I is etched using a resist is set at a appropriate value (the etching rate is almost 5,500 Å/min), and a high selectivity can be obtained.

In any of the coil division type plasma processing apparatuses, the two radio frequency coils are provided. However, three or more radio frequency coils may be provided. Each coil is not limited to a one-turn coil, and may be a spiral coil. The radio frequency voltages to be supplied to the respective radio frequency coils are not only in phase with each other, but also antiphases (the phase difference of 180°). A predetermined phase difference may be set in addition to this.

As described in detail, according to the coil division type plasma processing apparatus of the present invention, in the radio frequency induction system using the radio frequency antenna, there is provided the following plasma generating apparatus. In this plasma generating apparatus, the density of a plasma near the surface to be processed of an object to be processed is uniformed to realize uniformity and good reproducibility of a plasma process. Further, influence on the radial distribution of the density of a plasma generated by the pressure in the chamber is avoided. Still further, an appropriate etching rate and a high selectivity can be obtained.

A plasma generating apparatus comprising an improved radio frequency power supplying means will be described with reference to FIGS. 37, 38A, and 38B.

Referring to FIG. 37, reference numeral 251 denotes a control circuit for outputting, to a power supply section 252, a signal a1 for instructing a duty ratio set at an operation section 250, and a signal b1 for instructing a peak value at low level. The power supply section 252 applies radio frequency voltages shown in FIG. 38A to an inner coil 116 and an outer coil 117 through the two systems of a line cl and a line d1, and simultaneously a matching circuit 253. Referring to FIG. 38A, a duty ratio is represented by $y/(x+y)$, and the peak value b1 is set at 50% of the peak value a1 or less.

Radio frequency currents flow through both the radio frequency coils by applying the radio frequency voltages, and a plasma is generated in a processing chamber. During such an operation, a radio frequency voltage of about 2 MHz or an intermittent voltage shown in FIG. 38B is applied to an electrode base 113 to perform a plasma process such as an etching process or a CVD process.

As described above, voltages whose duty ratio is controlled are applied to the inner coil 116 and the outer coil 117. A dissociation reaction of gas molecules in the plasma is suppressed, and the electron temperature is decreased. As a result, good process characteristics in the plasma process can be properly maintained.

The following methods of controlling plasma are considered effective in a plasma processing apparatus wherein a radio frequency voltage is applied to inducement means such as a planar coil, thereby generating plasma in a vacuum processing chamber:

a. To change the value of the radio frequency voltage.
b. To change the frequency of the radio frequency voltage within a range of 1 MHz to 100 MHz.
c. To apply the radio frequency voltage intermittently, changing the duty ratio.
d. To apply at least two radio frequency voltages which can be independently controlled, one of which is applied all times, while the other is controlled by the method a, b or c.
e. To use conducting means comprising a plurality of independently controllable (electrically insulated) coils, and to apply independently controllable radio frequencies to the coils, thereby to control the radio frequency voltage by the method a, b or c.
f. To change the phase of each radio frequency in the method of d or the method c.
g. To employ the methods a to f in any possible combination.

The use of the plasma-controlling methods a to g, described above, will be explained.

The coils 116 and 117 shown in FIG. 24, which constitute a double coil, are electrically insulated from each other. Two independently controllable radio frequency voltages are applied to the coils 116 and 117, employing the method e. The method e may be combined with the method f wherein the phase of each radio frequency is changed. The combined method can be used in a plasma processing apparatus shown in FIG. 26.

In the apparatus of FIG. 26, the plasma is controlled in the following way. First, the phases of the radio frequency voltages applied to the inner coils 116a, 116b and the outer coil 117a, 117b are controlled, thereby uniformly distributing the plasma for processing in the space right above a substrate 114. The plasma is thereby rendered equally dense at the center and peripheral parts of the substrate 114. This makes it possible to control the plasma-etching speed of the substrate 114, to adjust the angle between the bottom and inner surface of a hole made by plasma-etching the substrate 114, or to improve the quality of films on the center and peripheral parts of the substrate 114 by controlling the thickness-distribution of a CVD film or the film-forming speed.

In the plasma processing apparatus shown in FIG. 26, it is not only possible to change the phases of the radio frequency voltages applied to the coils. But also is it possible to change the value of the radio frequency voltage applied to either coil, to apply a radio frequency voltage intermittently thereby to the duty ratio, and/or to apply a voltage having a constant radio frequency and at least one voltage having a varying radio frequency to either coil. The surface of the substrate 114 can thereby be plasma-processed very uniformly. Hence, the plasma-processed states of the center and peripheral parts of the substrate 114 can be controlled with high precision.

The plasma-controlling methods described above can be applied to objects of various shapes. They can be used in plasma-processing a substantially circular object such as a semiconductor wafer and a rectangular object such as a glass substrate for use in producing LCD (Liquid Crystal Display) panels—merely by changing the shapes of the inducement means 116a, 116b, 117a and 117b. Glass substrates used recently are large, 650×550 mm. To manufacture a number of LCD panels by using such a large glass substrate, it suffices to generate plasma by using planar coils as the inducement means, which are juxtaposed in one-to-one correspondence to LCD panels to be produced and which are insulated from one another.

In a plasma processing apparatus according to still another embodiment in FIG. 39, a window 260, consisting of quartz glass or the like, for externally transmitting emission of a plasma generated in a chamber 110 is formed in part of one side wall of the chamber. A lens 261 is arranged near the window 260 to focus light having passed through this window. The light focused by this lens passes through an optical fiber 262 and is demultiplexed into two beams. These two beams are incident on a pair of spectroscopes 263 and 264 and spectroscopically analyzed into spectra within a predetermined range. Beams having predetermined wavelengths from these spectroscopes are converted into electrical signals by photoelectric converters 265 and 266. Output signals from the photoelectric converters 265 and 266 are amplified by amplifiers 267 and 268. The amplified signals are input to a control circuit 269 serving as a circuit for controlling the entire plasma processing apparatus. A recipe 270 for setting various control parameters for the semiconductor manufacturing process is connected to the control circuit 269. This control circuit determines a duty ratio and a peak value at low level on the basis of the signals input through the amplifiers 267 and 268 and outputs a signal a1 for instructing a duty ratio and a signal b1 for instructing the peak value at low level to a power supply section 252. The power supply section 252 applies radio frequency voltages shown in FIG. 38A to the inner coil 116 and the outer coil 117 through the two systems of a line c1 and a line d1 in accordance with the input signals a1 and b1. As a result, a plasma is generated in the processing chamber to perform a plasma process.

When etching is performed as a plasma processing, gas molecules excited in an active state by a plasma chemically react with a material to be processed on the surface of a wafer, and a solid reaction product removes from the surface of the wafer to complete etching.

Figure 40:
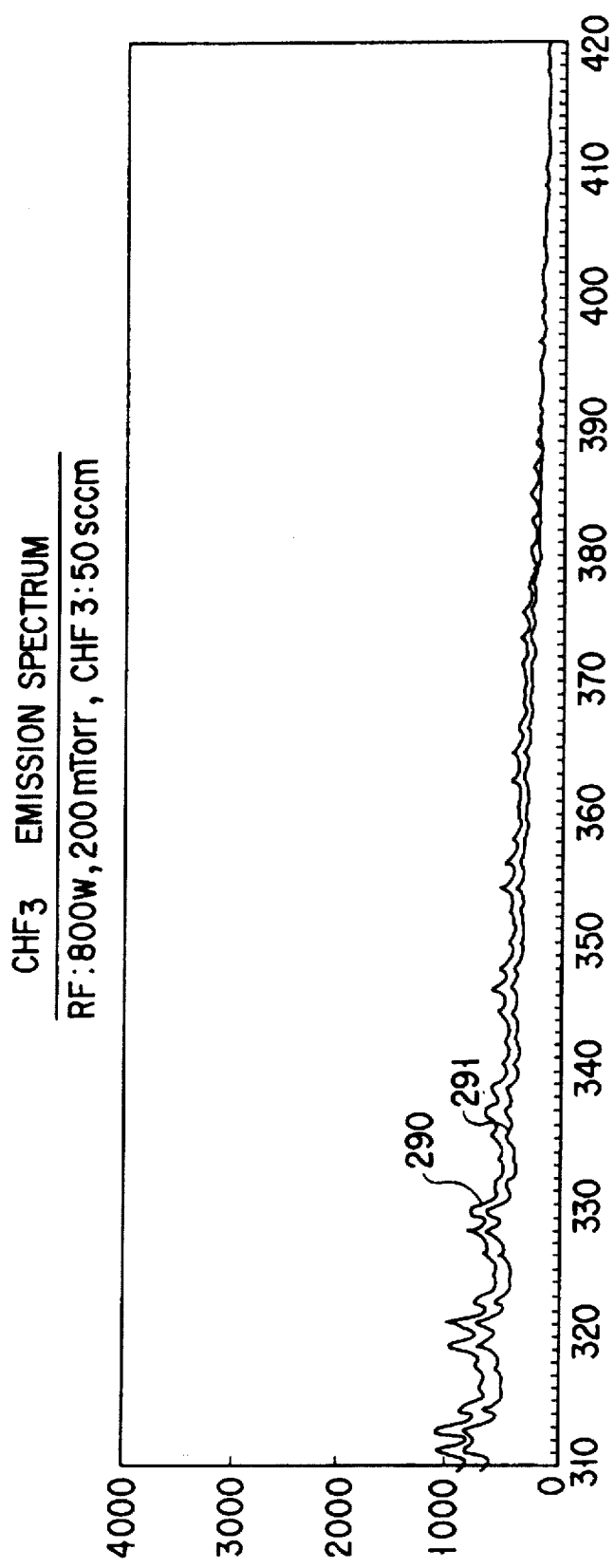
FIG. 40 is a graph showing a spectrum measured by the apparatus shown in FIG. 39.

In this case, a CF-based gas introduced into the processing chamber, e.g., $CHF_3$ is dissociated in the plasma to generate $CF_2$ and other active species. The resultant products react with a silicon oxide film, thereby performing etching. As a result, reaction products such as $SiF_x$, carbon monoxide, and the like are produced. Carbon monoxide, or $CHF_3$ as an etching gas of these reaction products emits light with its own spectrum. Light beams from these products are demultiplexed into two beams through the window 260 of the chamber 110, the lens 261, and the optical fiber 262. These beams are incident on the spectroscopes 263 and 264 and spectroscopically analyzed into spectra within a predetermined range as shown in FIG. 40. The demultiplexed beams having predetermined wavelengths are converted into electrical signals by the photoelectric converters 265 and 266. In spectra shown in FIG. 40, a spectral line denoted by reference numeral 290 represents the case in which only single-crystal silicon is etched, and a spectral line denoted by reference numeral 291 represents the case in which a silicon dioxide film formed on the single-crystal silicon is etched.

The electric signals from the photoelectric converters 265 and 266 are amplified. The amplified signals are input to the control circuit 269. This control circuit receives the input signals as signals indicating a dissociated state of the plasma, determines a duty ratio and a peak value at low level, and outputs the signal a1 for instructing the duty ratio and the signal b1 for instructing the peak value to the power supply section 252. The power supply section 252 applies radio frequency voltages as shown in FIG. 38A to the inner coil 116 and the outer coil 117 through the two systems of the line c1 and the line d1 in accordance with the input signals a1 and b1.

As described above, since the dissociated state of the plasma is detected, and the duty ratio and the peak value at low level are determined in accordance with the dissociated state, the dissociation reaction of gas molecules in the plasma is suppressed. Therefore, good process characteristics in the plasma process can be properly maintained.

In the plasma processing apparatus shown in FIGS. 37 and 39, the two independent one-turn radio frequency coils are used as the radio frequency antenna. However, the radio frequency antenna is not limited to such a shape, and such a radio frequency antenna used in other embodiments described above can be used. Both the duty ratio and peak value at low level of the radio frequency voltage applied to the radio frequency coils are variable. However, only the duty ratio can be variable.

In the above drawings showing the coil division type plasma processing apparatuses, for the illustrative convenience, the magnetic shield cylinder 150 is not shown except in FIGS. 22 and 23. It is apparent that the magnetic shield 150 is actually provided between the inner coil 116 and the outer coil 117 so as to magnetically shield them as shown in FIG. 23.

A preferable example of a magnetic shield cylinder 150 will be described below.

Figure 41:
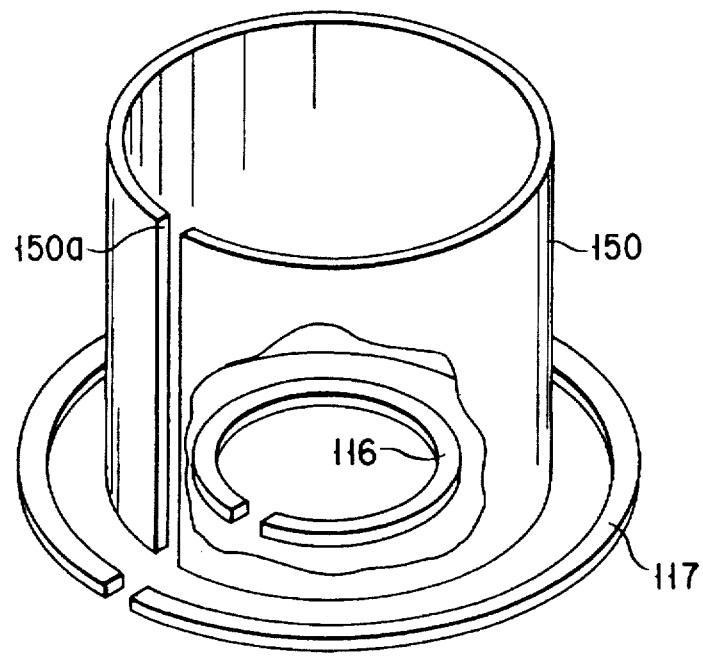
FIGS. 41 and 42 are perspective views respectively showing preferable examples of an electromagnetic shield cylinder.

The magnetic shield cylinder 150 shown in FIG. 41 consists of a conductive member, e.g., aluminum or copper, and is constituted by a cylindrical member whose upper and lower ends are open, and a slit 150a formed to extend from the upper end to the lower end of this cylindrical member. The magnetic shield cylinder 150 is grounded.

Since the magnetic shield cylinder 150 is arranged between an inner coil 116 and an outer coil 117 to prevent mutual interference between the electric fields of these two coils, thereby improving load matching. The reflected waves from these two coils can be reduced, and a plasma can be easily generated in the processing chamber. In addition, an eddy current flowing in the circumferential direction of the magnetic shield cylinder 150 can be prevented by the slit 150a, and the supplied power can be effectively contributed to plasma generation.

Figure 42:
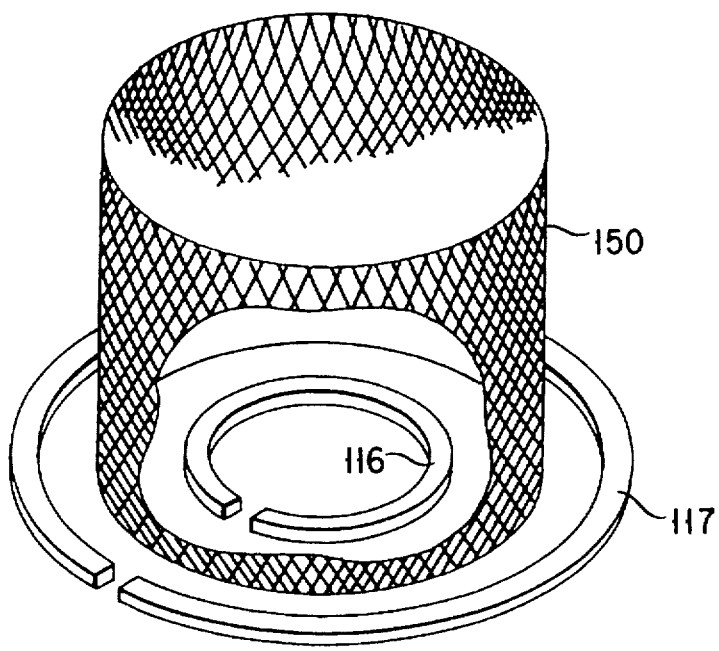

The magnetic shield cylinder 150 may be obtained by forming a metal mesh into a round, cylindrical shape as shown in FIG. 42. With such an arrangement, the same effect as that shown in FIG. 41 can be obtained.

The plasma etching apparatuses have been described about the preferred embodiments of the present invention. However, the present invention is not be limited to the above embodiments. The present invention can be applied to other plasma processing apparatuses, e.g., a plasma CVD apparatus, a plasma ashing apparatus, a plasma sputtering apparatus, and the like. The object to be processed is not limited to a semiconductor wafer but can be an LCD substrate.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A plasma processing apparatus comprising:
    a processing chamber for plasma processing, having an external wall, said chamber containing within said wall an object having a surface to be processed in a plasma;
    induction means for providing a radio frequency induction field within said chamber for generating a plasma within said chamber;
    voltage applying means for applying a radio frequency voltage to said induction means;
    measuring means for measuring a pressure variation and/or a light intensity variation from the plasma in said chamber during generation of the plasma, and outputting a signal corresponding to the variation;
    control means for controlling said radio frequency voltage applying means based on the signal from said measuring means, and controlling said voltage for controlling said plasma within said chamber;
    wherein said induction means has a radio frequency antenna arranged outside said chamber, and an insulating member positioned between said radio frequency antenna and said processing chamber; and
    wherein said antenna has an inner terminal formed at an inner end of said antenna, an outer terminal formed at an outer end of said antenna, and at least one intermediate terminal formed between said terminals, the terminals being respectively connected to said radio frequency voltage applying means such that currents flow between said inner terminal and said intermediate terminal, between said intermediate terminal and said outer terminal, and between said intermediate terminal and said radio frequency voltage applying means, and said control means independently controls the currents.

2. An apparatus according to claim 1, further comprising electrostatic shield means, arranged between said radio frequency antenna and said insulating member, for preventing an electrostatic field from applying from said radio frequency antenna into said processing chamber.

3. An apparatus according to claim 1, wherein said chamber has a wall portion consisting of said insulating member and opposing the object to be processed, and said radio frequency antenna has a spiral antenna placed on said wall portion.

4. An apparatus according to claim 1, wherein said measurement means measures an emission intensity of a first gas component whose amount present in said processing chamber relatively and greatly varies in an etching process with respect to the object to be processed, and an emission intensity of a second gas component whose amount existent in said processing chamber does not relatively vary in the etching process, and outputting a signal corresponding to an emission intensity ratio, and said control means controls said radio frequency voltage applying means in accordance with a variation in emission intensity ratio.

5. An apparatus according to claim 1, wherein said measurement means measures a pressure in said processing chamber, and comprises pressure measurement means for outputting a signal corresponding to the pressure, and said control means controls said radio frequency voltage applying means such that the pressure represented by the signal falls within a pressure range wherein an etching rate obtained from a correlation between the pressure in said processing chamber and an etching rate obtained when the etching process is performed with respect to the object to be processed placed in an etching atmosphere falls within a range.

6. An apparatus according to claim 1, wherein said measuring means comprises at least two spectroscopes each measuring an intensity of different wavelength from the plasma, and outputting a signal based on the two intensities.

7. A plasma processing apparatus comprising:
    a processing chamber for plasma processing, having an external wall, said chamber containing within said wall an object having a surface to be processed in a plasma;
    induction means for providing a radio frequency induction field within said chamber for generating a plasma within said chamber;
    voltage applying means for applying a radio frequency voltage to said induction means;
    measuring means for measuring a pressure variation and/or a light intensity variation from the plasma in said chamber during generation of the plasma, and outputting a signal corresponding to the variation;
    control means for controlling said radio frequency voltage applying means based on the signal from said measuring means, and controlling said voltage for controlling said plasma within said chamber; and
    wherein said measuring means has light detecting means for measuring an emission spectrum of a gas present in said processing chamber, and a shortwave component of light emitted from said processing chamber, and outputting a first signal corresponding to the measured emission spectrum and a second signal corresponding to the shortwave component, and said control means detects a state of the plasma based on the first signal, and corrects a detection result using the second signal to control said radio frequency voltage applying means.

8. An apparatus according to claim 7, wherein said control means for controlling said radio frequency voltage applying means controls said radio frequency voltage applying means such that the voltage to be applied is intermittently applied during a process with respect to the object to be processed, and the plasma is intermittently formed.

9. An apparatus according to claim 8, wherein said measuring means has light detecting means for measuring an emission spectrum of a gas present in said processing chamber, and a shortwave component of light emitted from said processing chamber, and outputting a first signal corresponding to the measured emission spectrum and a second signal corresponding to the shortwave component, and said control means detects a state of the plasma based on the first signal, and corrects a detection result using the second signal to control said radio frequency voltage applying means.

10. An apparatus according to claim 7, wherein said induction means has a radio frequency antenna arranged outside said chamber, and an insulating member positioned between said radio frequency antenna and said processing chamber.

11. An apparatus according to claim 7, wherein said voltage applying means comprises a first voltage applying means for applying a first frequency voltage to said induction means and a second voltage applying means for intermittently applying a second frequency voltage to said induction means.

12. A plasma processing apparatus comprising:
a chamber for plasma processing having an external wall, said chamber containing within said wall an object having a surface to be processed in a plasma;
induction means for providing a radio frequency induction field within said chamber for generating a plasma within said chamber, said induction means being coaxially arranged on an imaginary plane being parallel to the surface to be processed and having at least a first inner coil and a second outer coil which are insulated with each other;
supplying means for respectively supplying radio frequency currents to said first inner coil and second outer coil for controlling said plasma within said chamber;
phase control means for controlling phases of the radio frequency currents supplied to said first inner coil and second outer coil; and
pressure detecting means for detecting a pressure in said processing chamber and outputting a signal corresponding to the detected pressure, and means for controlling a power supplied to said first radio frequency coil and a power supplied to said second radio frequency coil to have a division ratio based on the signal from said pressure detecting means.

13. An apparatus according to claim 12, wherein said first radio frequency coil has a partially notched one-turn flat annular coil having a pair of end portions which are separated from each other by an interval, and electrodes provided to said end portions, and said second radio frequency coil surrounds said first coil by an interval while being electrically insulated from said first coil, and has a partially notched one-turn flat annular coil having a pair of end portions which are separated from each other by an interval, and electrodes provided to said end portions.

14. An apparatus according to claim 13, further comprising a cylindrical electromagnetic shield mesh coaxially arranged between said first coil and said second coil and having two open ends.

15. An apparatus according to claim 12, further comprising an electromagnetic shield cylindrical portion coaxially arranged between said first coil and said second coil and having two open ends, said cylindrical portion having a slit extending from one end to the other end.

16. A plasma processing apparatus comprising:
a processing chamber for plasma processing an object received in the chamber;
a plurality of radio frequency antennas disposed outside of the chamber and arranged side by side and spaced from each other, the antennas providing a radio frequency induction field within the chamber for generating a plasma therein;
a plurality of radio frequency power supplies each of which is connected to the corresponding radio frequency antenna for supplying a radio frequency voltage thereto; and
control means for controlling the radio frequency voltage from the radio frequency voltage power supplies.

17. An apparatus according to claim 16, further including means for maintaining said processing chamber at a gas pressure of 10 to 100 mTorr during the process with respect to the object to be processed.

18. An apparatus according to claim 16, further including means for processing the object to be processed at an electron temperature of 2 to 5 eV.

19. An apparatus according to claim 16, wherein each of said antennas has an inner terminal formed at an inner end of each antenna, an outer terminal formed at an outer end of each antenna, and at least one intermediate terminal formed between the inner terminal and the outer terminal; the inner terminal, outer terminal and intermediate terminal being respectively connected to the radio frequency power supply such that currents flow between the inner terminal and the intermediate terminal, between the intermediate terminal and the outer terminal, and between said intermediate terminal and the radio frequency power supply, and said control means independently controls the currents.

20. An apparatus according to claim 16, wherein said antennas are arranged in a matrix form.

21. A plasma processing apparatus comprising:
a chamber for plasma processing having an external wall, said chamber containing within said wall an object having a surface to be processed in a plasma;
induction means for providing a radio frequency induction field within said chamber for generating a plasma within said chamber, said induction means being coaxially arranged on an imaginary plane being parallel to the surface to be processed and having at least a first inner coil and a second outer coil which are insulated with each other;
supplying means for respectively supplying radio frequency currents to said first inner coil and second outer coil for controlling said plasma within said chamber;
phase control means for controlling phases of the radio frequency currents supplied to said first inner coil and second outer coil;
wherein said phase control means controls the phase of the radio frequency current supplied to said first radio frequency coil and the phase of the radio frequency current supplied to said second radio frequency coil to be the substantially same phases or phases shifted by about 180° from each other; and
reflected power detecting means for detecting reflected powers from said respective radio frequency coils, and wherein said phase control means has a phase shifter for adjusting the phases of the respective radio frequency currents supplied to said respective radio frequency coils to have a phase difference so as to minimize the reflected powers detected by said reflected power detecting means.

* * * * *

UNITED STATES PATENT AND TRADEMARK OFFICE
CERTIFICATE OF CORRECTION

PATENT NO. : 5,571,366
DATED : November 5, 1996
INVENTOR(S) : Nobuo ISHII, et al.

It is certified that error appears in the above-indentified patent and that said Letters Patent is hereby corrected as shown below:

On the title page, Item [75], the sixth inventor's name should read:

-- [75] Issei Imahashi --

Signed and Sealed this

Thirty-first Day of December, 1996

*Attest:*

BRUCE LEHMAN

*Attesting Officer*     *Commissioner of Patents and Trademarks*